US008227690B2

(12) United States Patent
Ikeda et al.

(10) Patent No.: US 8,227,690 B2
(45) Date of Patent: Jul. 24, 2012

(54) DYE-SENSITIZED PHOTOELECTRIC CONVERSION DEVICE

(75) Inventors: Masaaki Ikeda, Kita-ku (JP); Koichiro Shigaki, Kita-ku (JP); Teruhisa Inoue, Kita-ku (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 1086 days.

(21) Appl. No.: 10/548,858

(22) PCT Filed: Mar. 11, 2004

(86) PCT No.: PCT/JP2004/003203

§ 371 (c)(1),
(2), (4) Date: Sep. 9, 2005

(87) PCT Pub. No.: WO2004/082061

PCT Pub. Date: Sep. 23, 2004

(65) Prior Publication Data

US 2006/0130249 A1 Jun. 22, 2006

(30) Foreign Application Priority Data

Mar. 14, 2003 (JP) .................................. 2003-70321
Mar. 18, 2003 (JP) .................................. 2003-73587

(51) Int. Cl.
*H01L 31/00* (2006.01)

(52) U.S. Cl. ....................................... 136/263; 136/252

(58) Field of Classification Search .................. 136/263
See application file for complete search history.

(56) References Cited

U.S. PATENT DOCUMENTS

| | | | | |
|---|---|---|---|---|
| 2,803,640 | A | 8/1957 | Heckert | 260/465 |
| 4,927,721 | A | 5/1990 | Gratzel et al. | 429/111 |
| 5,084,365 | A | 1/1992 | Gratzel et al. | 429/111 |
| 5,670,091 | A | 9/1997 | Marder et al. | 252/582 |
| 6,084,176 | A | 7/2000 | Shiratsuchi et al. | 136/263 |
| 6,291,763 | B1 | 9/2001 | Nakamura | |
| 6,335,481 | B1 | 1/2002 | Watanabe | |
| 6,376,765 | B1 | 4/2002 | Wariishi et al. | 136/263 |
| 7,141,735 | B2 | 11/2006 | Ikeda et al. | 136/263 |
| 7,728,222 | B2 | 6/2010 | Ikeda et al. | |
| 7,851,701 | B2 | 12/2010 | Ikeda et al. | |
| 7,943,848 | B2 * | 5/2011 | Nishimura et al. | 136/263 |
| 7,947,898 | B2 * | 5/2011 | Itami et al. | 136/263 |
| 7,977,570 | B2 | 7/2011 | Shigaki et al. | |
| 8,039,741 | B2 * | 10/2011 | Itami et al. | 136/263 |
| 2002/0010969 | A1 | 1/2002 | Goettel et al. | 8/405 |
| 2003/0152827 | A1 * | 8/2003 | Ikeda et al. | 429/111 |
| 2004/0074532 | A1 | 4/2004 | Ikeda et al. | 136/250 |
| 2004/0099306 | A1 | 5/2004 | Hara et al. | 136/263 |
| 2004/0187918 | A1 | 9/2004 | Ikeda et al. | |
| 2006/0130249 | A1 | 6/2006 | Ikeda et al. | 8/550 |
| 2007/0191455 | A1 | 8/2007 | Hiyoshi et al. | |
| 2008/0067476 | A1 | 3/2008 | Shigaki et al. | |
| 2008/0087327 | A1 | 4/2008 | Horiuchi et al. | |

FOREIGN PATENT DOCUMENTS

| | | | |
|---|---|---|---|
| CN | 1861740 | | 11/2006 |
| EP | 0 566 077 | | 10/1993 |
| EP | 0 566 081 | | 10/1993 |
| EP | 0 566 082 | | 10/1993 |
| EP | 0 692 800 | A2 | 1/1996 |
| EP | 0 892 411 | | 1/1999 |
| EP | 0 911 841 | A2 | 4/1999 |
| EP | 0 924 724 | | 6/1999 |
| EP | 1 075 005 | | 2/2001 |
| EP | 1 311 001 | | 5/2003 |
| EP | 1 339 129 | A1 | 8/2003 |
| EP | 1 422 782 | A1 | 5/2004 |
| EP | 1 628 356 | A1 | 2/2006 |
| JP | 48-3115 | | 1/1973 |
| JP | 8-81222 | A | 3/1996 |
| JP | 2664194 | | 6/1997 |
| JP | 11-67285 | A | 3/1999 |
| JP | 11-158395 | | 6/1999 |
| JP | 11-163378 | | 6/1999 |
| JP | 11-176489 | | 7/1999 |
| JP | 11-214731 | | 8/1999 |
| JP | 2000-26487 | | 1/2000 |
| JP | 2000-195569 | | 7/2000 |
| JP | 2000-223167 | | 8/2000 |
| JP | 2000-268892 | | 9/2000 |
| JP | 2000-285977 | | 10/2000 |
| JP | 2000-285978 | | 10/2000 |
| JP | 2001-042524 | | 2/2001 |
| JP | 2001-52766 | A | 2/2001 |
| JP | 2001-064529 | | 3/2001 |

(Continued)

OTHER PUBLICATIONS

Shirota, Yasuhiko; "Organic materials for electronic and optoelectronic devices", J. Mater. Chem., 2000, 10, pp. 1-25.*
International Search Report dated Jun. 4, 2002.
International Search Report dated Sep. 17, 2002.
Supplementary European Search Reportv dated Feb. 13, 2006.
Supplementary Partial European Search Report dated Feb. 21, 2007.
J.Am.Chem.Soc. 1993, 115, p. 6382-6390; M.K. Nazeeruddin et al.; "Conversion of Light to Electricity by cis-X2Bis(2,2'-bipyridyl-4,4'-dicarboxylate)ruthenium(II) Charge-Transfer Sensitizers (X=C1-, Br-, I-, CN-, and SCN-) on Nanocrystalline TiO2 Electrodes".
Nature. vol. 353. Oct. 24, 1991; p. 737-739; Brian O'Regan et al.; "A low-cost, high-efficiency solar cell based on dye-sensitized colloidal TiO2 films".

(Continued)

*Primary Examiner* — Basia Ridley
*Assistant Examiner* — Thanh-Truc Trinh
(74) *Attorney, Agent, or Firm* — Nields, Lemack & Frame, LLC

(57) ABSTRACT

The present invention relates to an organic dye-sensitized photoelectric conversion device and a solar cell utilizing the same. In accordance with a demand to now for development of an organic dye-sensitized photoelectric conversion device with high conversion efficiency and high practicability using an inexpensive dye, there is provided in the present invention, a photoelectric conversion device with high conversion efficiency by producing a photoelectric conversion device by sensitizing fine semiconductor particles with a methine dye having specified skeleton.

7 Claims, No Drawings

FOREIGN PATENT DOCUMENTS

| | | |
|---|---|---|
| JP | 2002-164089 | 6/2002 |
| JP | 2003-059547 | 2/2003 |
| JP | 2004-22222 A | 1/2004 |
| JP | 2004-146421 A | 5/2004 |
| JP | 2004-207224 A | 7/2004 |
| JP | 2004-227825 A | 8/2004 |
| JP | 2005-5026 A | 1/2005 |
| JP | 2005-11800 A | 1/2005 |
| JP | 2005-19251 A | 1/2005 |
| JP | 2005-123013 A | 5/2005 |
| JP | 2005-129329 A | 5/2005 |
| JP | 2005-129429 A | 5/2005 |
| JP | 2005-129430 A | 5/2005 |
| JP | 2005-209682 A | 8/2005 |
| JP | 2005-227376 | 8/2005 |
| JP | 2006-93284 A | 4/2006 |
| JP | 2006-156212 A | 6/2006 |
| JP | 2006-188582 A | 7/2006 |
| JP | 2006-190534 A | 7/2006 |
| WO | 02/11213 | 2/2002 |
| WO | 2004/011555 A1 | 2/2004 |
| WO | 2004/082061 | 9/2004 |
| WO | 2005/077956 A1 | 8/2005 |
| WO | 2006/028087 A1 | 3/2006 |

OTHER PUBLICATIONS

Office Actions from co-pending application (U.S. Appl. No. 10/469,670) dated Mar. 16, 2009, Sep. 5, 2008, Jan. 29, 2008, Dec. 12, 2007, Nov. 21, 2007, Sep. 10, 2007 and Nov. 30, 2006.

Office Actions from co-pending application (U.S. Appl. No. 10/482,425) dated Feb. 25, 2009, Sep. 17, 2008, Feb. 21, 2008, Aug. 22, 2007.

Office Action from co-pending U.S. Appl. No. 10/482,425 dated Jul. 7, 2009.

International Search Report dated May 25, 2004.

Tanaka et al., JP2001-064529 A online machine translation.

OA dated Jan. 19, 2010 in co-pending U.S. Appl. No. 10/482,425.

NOA dated Feb. 4, 2010 in co-pending U.S. Appl. No. 10/469,670.

Office Action dated May 7, 2010 in co-pending U.S. Appl. No. 12/224,350.

Office Action dated Aug. 25, 2009 in co-pending U.S. Appl. No. 10/469,670.

Chemistry Letters 1998; pp. 1241-1242; Wataru Kubo et al.; "Fabrication of Quasi-solid-state Dye-sensitized Ti(2 Solar Cells Using Low Molecular Weight Gelators".

J.Am.Chem. Soc. 2006, 128, p. 16701-16707; Sanghoon Kim et al.; "Molecular Engineering of Organic Sensitizers for Solar Cell Applications".

International Search Report dated May 22, 2007.

International Search Report dated Sep. 19, 2006 in co-pending U.S. Appl. No. 11/922,062, filed Dec. 12, 2007.

International Search Report dated Dec. 2, 2005 in co-pending U.S. Appl. No. 11/661,843, filed Mar. 5, 2007.

International Search Report dated Sep. 5, 2006 in co-pending U.S. Appl. No. 11/920,899, filed Nov. 21, 2007.

European Communication dated Aug. 4, 2010 in co-pending foreign application (EP06757302.2).

Supplemental European Search Report dated May 25, 2009 in co-pending foreign application (EP05782209).

Solar Energy Materials & Solar Cells 80 (2003) 47-71; K. Sayama et al.; "Efficient sensitization of nanocrystalline TiO2 films with cyanine and merocyanine organic dyes".

Office Action dated Jun. 21, 2010 in co-pending U.S. Appl. No. 11/661,843, filed Mar. 5, 2007.

Office Action dated Oct. 7, 2010 in co-pending U.S. Appl. No. 11/661,843, filed Mar. 5, 2007.

Office Action dated Jun. 21, 2010 in co-pending U.S. Appl. No. 11/920,899, filed Nov. 21, 2007.

Office Action dated Oct. 8, 2010 in co-pending U.S. Appl. No. 11/920,899, filed Nov. 21, 2007.

Office Action dated Jun. 21, 2010 in co-pending U.S. Appl. No. 11/922,062, filed Dec. 12, 2007.

Office Action dated Oct. 13, 2010 in co-pending U.S. Appl. No. 11/922,062, filed Dec. 12, 2007.

Final Rejection dated Jan. 25, 2011 in co-pending U.S. Appl. No. 12/224,350, filed Aug. 25, 2008.

Final Rejection dated Mar. 16, 2011 in co-pending U.S. Appl. No. 11/661,843.

Notice of Allowance dated Mar. 16, 2011 in co-pending U.S. Appl. No. 11/920,899.

Final Rejection dated Mar. 15, 2011 in co-pending U.S. Appl. No. 11/922,062.

European communication dated Jun. 7, 2010 in co-pending foreign applications.

Thin Solid Films, vol. 438-439, 2003, pp. 147-152; XP-002582510; Keiichi Miyairi et al.; "Photovoltaic properties of double layer devices consisting of titanium dioxide and porphyrin dispersed hole transporting material layer".

Chem.Comm., 2004, pp. 68-69; XP-002582511; Sanghoon Kim et al.; "The role of borole in a fully conjugated electron-rich system".

Notice of Allowance dated Jun. 22, 2011 in co-pending U.S. Appl. No. 11/661,843.

Notice of Allowance dated Jun. 22, 2011 in co-pending U.S. Appl. No. 11/922,062.

Notice of Allowance dated Jul. 26, 2010, Communication dated Sep. 21, 2010, Communication Dated Sep. 28, 2010 in co-pending U.S. Appl. No. 10/482,425.

* cited by examiner

DYE-SENSITIZED PHOTOELECTRIC CONVERSION DEVICE

TECHNICAL FIELD

The present invention relates to an organic dye-sensitized photoelectric conversion device and a solar cell and more specifically, to a photoelectric conversion device characterized by using fine oxide semiconductor particles sensitized with a dye having specified skeleton and a solar cell utilizing the same.

PRIOR ART

Solar cells utilizing the sun light have been noticed as energy source substituting fossil fuel such as petroleum and coal. At present, solar cells using crystalline or amorphous silicon or compound semiconductor solar cells using such as gallium and arsenic have been developed and studied actively on efficiency enhancement. However, due to high energy and cost required to produce them, they have a problem of difficulty in general purpose applications. In addition to this problem, photoelectric conversion devices using dye-sensitized fine semiconductor particles or solar cells utilizing them are also known and materials and production technology to produce them have been disclosed (see JP No.2664194; B. O'Regan and M. Graetzel, Nature, vol. 353, p. 737 (1991); M. K. Nazeeruddin, A. Kay, I. Rodicio, R. Humphry-Baker, E. Muller, P. Liska, N. Vlachopoulos, M. Graetzel, J. Am. Chem. Soc., vol. 115, p. 6382 (1993)). These photoelectric conversion devices are produced using a relatively inexpensive oxide semiconductor such as titanium oxide and have potential to provide photoelectric conversion devices more inexpensive compared with conventional solar cells using silicon, and the like, and are noticed due to providing colorful solar cells. However, to obtain a highly efficient photoelectric conversion device, a ruthenium-based complex is used as a dye for sensitization, which has left problems of high cost of the dye itself and in supplying thereof. Use of an organic dye for sensitization has been challenged already, however, practical application has not been succeeded at present due to problems of low conversion efficiency, stability and durability, and thus further improvement of conversion efficiency is required (see WO 2002011213). Likewise, production examples of photoelectric conversion devices using a methine dye are known and relatively many studies have been carried out on a coumarin dye (JP-A-2002-164089) or a merocyanine dye (JP-A-8-81222, JP-A-11-214731 and JP-A-2001-52766), however, further improvement of cost, stability and conversion efficiency is required.

Thus, in a photoelectric conversion device using an organic dye-sensitized semiconductor, it is required to develop a photoelectric conversion device with high conversion efficiency and practicability using an inexpensive organic dye.

DETAILED DISCLOSURE OF THE INVENTION

The present inventors have studied comprehensively a way to solve the above problems and found that by producing a photoelectric conversion device by sensitization of fine semiconductor particles with a specified dye and thus have completed the present invention.

That is, the present invention provides the following aspects:

(1) A photoelectric conversion device, characterized by using fine oxide semiconductor particles sensitized with a methine dye represented by Formula (1):

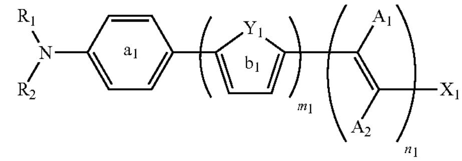

(1)

(in Formula (1), each of $R_1$ and $R_2$ represents a hydrogen atom, an aromatic residual group which may have substituent(s), an aliphatic hydrocarbon residual group which may have substituent(s) or an acyl group, provided that $R_1$ and $R_2$ may form a ring which may have substituent(s), by bonding with each other or with a benzene ring $a_1$; $m_1$ is an integer of 0 to 7; $n_1$ is an integer of 1 to 7; $X_1$ represents an aromatic residual group which may have substituent(s), a cyano group, a phosphate group, a sulfo group, a carboxyl group, a carboamido group, an alkoxycarbonyl group or an acyl group; each of $A_1$ and $A_2$ represents independently an aromatic residual group which may have substituent(s), a hydroxyl group, a phosphate group, a cyano group, a hydrogen atom, a halogen atom, an aliphatic hydrocarbon residual group which may have substituent(s), a carboxyl group, a carboamido group, an alkoxycarbonyl group or an acyl group, provided that when $n_1$ is not smaller than 2 and $A_1$ and $A_2$ are present in plural, each of $A_1$ and each of $A_2$ may be the same or different each other. A ring which may have substituent(s) may be formed using multiple substituents selected from $A_1$ or each of $A_1$ when $A_1$ is present in plural, and $A_2$ or each of $A_2$ when $A_2$ is present in plural, along with $X_1$; $Y_1$ represents a sulfur atom, a selenium atom, a tellurium atom and $CR_3R_4$ or $NR_5$, wherein $R_3$ and $R_4$ represent a hydrogen atom, a halogen atom, an amide group, a hydroxyl group, a cyano group, a nitro group, an alkoxyl group, an acyl group, a substituted or unsubstituted amino group, an aliphatic hydrocarbon residual group which may have substituent(s) or an aromatic residual group which may have substituent(s); $R_5$ represents a hydrogen atom, an aromatic residual group which may have substituent(s), an aliphatic hydrocarbon residual group which may have substituent(s) or an acyl group; when $m_1$ is not smaller than 2 and $Y_1$ is present in plural, each of $Y_1$ may be the same or different each other; a benzene ring $a_1$ may have one or plural substituents, including a halogen atom, an amide group, a hydroxyl group, a cyano group, a nitro group, an alkoxyl group, an acyl group, a substituted or unsubstituted amino group, an aliphatic hydrocarbon residual group which may have substituent(s) or an aromatic residual group which may have substituent(s); a benzene ring $a_1$ may also form a ring which may have substituent(s) by bonding of plural substituents themselves; and a ring $b_1$ may have one or plural substituents including a halogen atom, an alkoxyl group, an acyl group, an aliphatic hydrocarbon residual group which may have substituent(s) or an aromatic residual group which may have substituent(s); and a ring $b_1$ may form a ring which may have substituent(s) by bonding of plural substituents themselves)

(2) The photoelectric conversion device according to the aspect (1), characterized that a methine dye represented by Formula (1) is a compound with $R_1$ and $R_2$ being an aromatic residual group which may have substituent(s) in Formula (1).

(3) The photoelectric conversion device according to the aspect (2), characterized that a methine dye represented by Formula (2) is a compound represented by Formula (2) as shown below.

(2)

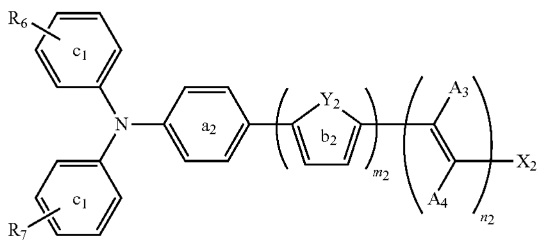

(in Formula (2), $m_2$, $n_2$, $X_2$, $A_3$, $A_4$, $Y_2$, $a_2$ and $b_2$ represent the same meaning as corresponding $m_1$, $n_1$, $X_1$, $A_1$, $A_2$, $Y_1$, $a_1$ and $b_1$ in Formula (1); a benzene ring $c_1$ may further have one or plural substituents, including a halogen atom, an amide group, a hydroxyl group, an alkoxyl group, a substituted or unsubstituted amino group, an aliphatic hydrocarbon residual group which may have substituent(s) or an aromatic residual group which may have substituent(s), provided that the benzene ring $c_1$ may form a ring which may have substituent(s) by bonding of plural substituents themselves; each of $R_6$ and $R_7$ represents a substituted or unsubstituted amino group or an aromatic residual group which may have substituent(s)).

(4) The photoelectric conversion device according to the aspect (3), characterized that a methine dye represented by Formula (2) is a compound represented by Formula (3) as shown below.

(3)

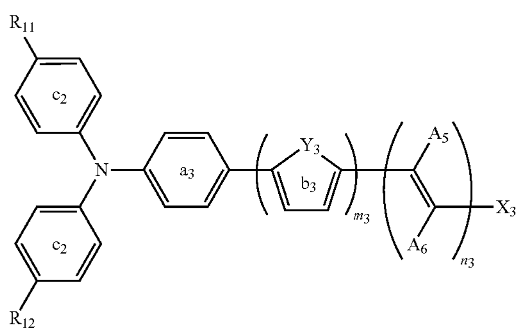

(in Formula (3), $m_3$, $n_3$, $X_3$, $A_5$, $A_6$, $Y_3$, $a_3$ and $b_3$ represent the same meaning as corresponding $m_1$, $n_1$, $X_1$, $A_1$, $A_2$, $Y_1$, $a_1$ and $b_1$ in Formula (1); a benzene ring $c_2$ may further have one or plural substituents, including a halogen atom, an amide group, a hydroxyl group, an alkoxyl group, a substituted or unsubstituted amino group, an aliphatic hydrocarbon residual group which may have substituent(s) or an aromatic residual group which may have substituent(s), provided that the benzene ring $c_2$ may form a ring which may have substituent(s) by bonding of plural substituents themselves; each of $R_{11}$ and $R_{12}$ represents a substituted or un substituted amino group or an aromatic residual group which may have substituent(s)).

(5) The photoelectric conversion device according to the aspect (4), characterized that a methine dye represented by Formula (3) is a compound with $R_{11}$ and $R_{12}$ in Formula (3) being a substituted or unsubstituted amino group.

(6) The photoelectric conversion device according to the aspect (4), characterized that a methine dye represented by Formula (3) is a compound with $R_{11}$ and $R_{12}$ in Formula (3) being an aromatic residual group which may have substituent(s).

(7) The photoelectric conversion device according to the aspect (6), characterized that a methine dye represented by Formula (3) is a compound with $X_3$ in Formula (3) being a carboxyl group.

(8) The photoelectric conversion device according to the aspect (7), characterized that a methine dye represented by Formula (3) is a compound with $X_3$ in Formula (3) being a carboxyl group and $A_6$ at the nearest to $X_3$ being a cyano group, a carboxyl group or an acyl group.

(9) The photoelectric conversion device according to the aspect (6), characterized that a methine dye represented by Formula (3) is a compound with $X_3$ and $A_6$ at the most adjacent to $X_3$ in Formula (3) forming a ring which may have substituent(s).

(10) The photoelectric conversion device according to the aspects (1) to (9), characterized that a methine dye represented by Formula (3) is a compound with $m_3$ in Formula (3) being 1 to 3.

(11) The photoelectric conversion device according to the aspect (10), characterized that a methine dye represented by Formula (3) is a compound with $n_3$ in Formula (3) being 1 to 4.

(12) The photoelectric conversion device according to the aspects (1) to (11), characterized that a methine dye represented by Formula (3) is a compound with $Y_3$ in Formula (3) being a sulfur atom.

(13) A photoelectric conversion device, characterized by using an oxide semiconductor sensitized with one kind or more of a methine dye represented by Formula (1) and with a metal complex and/or an organic dye having a structure other than Formula (1).

(14) The photoelectric conversion device according to any one of the aspects (1) to (13), wherein fine oxide semiconductor particles contain titanium dioxide as an essential component.

(15) The photoelectric conversion device according to any one of the aspects (1) to (14), wherein fine oxide semiconductor particles contain zinc or tin as an essential component as a metal component.

(16) The photoelectric conversion device according to the aspects (1) to (15), wherein onto fine oxide semiconductor particles a dye is carried in the presence of an inclusion compound.

(17) A production method for a photoelectric conversion device, characterized by making fine oxide semiconductor particles, formed in a thin membrane, to carry a dye represented by Formula (1).

(18) A solar cell characterized by using a photoelectric conversion device according to any one of the aspects (1) to (16).

(19) Fine oxide semiconductor particles sensitized with a methine dye according to the above Formulas (1) to (3).

(20) A methine dye, characterized in that in the above Formula (1), $R_1$ and $R_2$ represent benzene rings; Y, represents a sulfur atom; $m_1$ is an integer of 1 to 2; $n_1$ is an integer of 1; $X_1$ represents a carboxyl group; $A_1$ represents a hydrogen atom; and $A_2$ represents a cyano group.

(21) A methine dye characterized in that in the above Formula (1), $R_1$ and $R_2$ represent benzene rings; $Y_1$ represents a sulfur atom; $m_1$ is an integer of 1 to 2; $n_1$ is an integer of 1; and $X_1$ and $A_2$ form a rhodanine ring.

(22) A methine dye characterized in that in the above Formula (3), $R_{11}$ and $R_{12}$ represent a substituted or unsubstituted amino group or an aromatic residual group which may have substituent(s); $m_3$ is an integer of 0 to 3; $n_3$ is an integer of 1 to 2; $X_3$ represents a carboxyl group; $A_5$ represents a hydrogen atom; and $A_6$ represents a cyano group.

Embodiments To Carry Out The Invention

The present invention is explained in detail below. A photoelectric conversion device of the present invention uses an oxide semiconductor sensitized with a dye represented by Formula (1) as shown below:

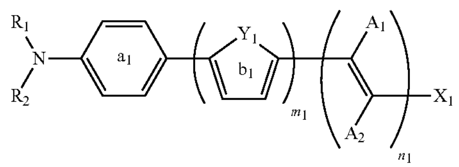

(1)

Each of $R_1$ and $R_2$ in Formula (1) represents a hydrogen atom, an aromatic residual group which may have substituent(s), an aliphatic hydrocarbon residual group which may have substituent(s) and an acyl group.

An aromatic residual group means an aromatic ring group from which a hydrogen atom is removed and includes, for example, aromatic hydrocarbon rings such as benzene, naphthalene, anthracene, phenanthrene, pyrene, perylene and terrylene; heterocyclic aromatic rings such as indene, azulene, pyridine, pyrazine, pyrimidine, pyrazole, pyrazolidine, thiazolidine, oxazolidine, pyran, chromene, pyrrol, pyrrolidine, benzimidazol, imidazoline, imidazolidine, imidazole, pyrazole, triazole, triazine, diazole, indoline, thiophene, furan, oxazole, thiazine, thiazole, indole, benzothiazole, naphthothiazole, benzoxazole, naphthoxazole, indolenine, benzoindolenine, pyrazine, quinoline and quinazoline; and fused aromatic rings such as fluorene and carbazole, and they may have substituent(s) as described above. Usually, it is preferable that they are aromatic residual groups having a $C_{5-16}$ aromatic ring (an aromatic ring or a fused ring containing an aromatic ring).

An aliphatic hydrocarbon residual group includes a saturated or unsaturated, linear, branched and cyclic alkyl group and preferably such one as have carbon atoms of 1 to 36, more preferably carbon atoms of 1 to 20. A cyclic group includes, for example, a $C_{3-8}$ cycloalkyl group. Specific examples include a methyl group, an ethyl group, a n-propyl group, an isopropyl group, a n-butyl group, an isobutyl group, a tert-butyl group, an octyl group, an octadecyl group, a cyclohexyl group, a propenyl group, a pentynyl group, a butenyl group, a hexenyl group, a hexadienyl group, an isopropenyl group, an isohexenyl group, a cyclohexenyl group, a cyclopentadienyl group, an ethynyl group, a propynyl group, a pentynyl group, a hexynyl group, an isohexynyl group and a cyclohexynyl group. They may have substituent(s) as described above.

An acyl group includes, for example, a $C_{1-10}$ alkylcarbonyl group, a $C_{1-10}$ arylcarbonyl group, preferably $C_{1-4}$ alkylcarbonyl group including typically such as an acetyl group, a trifluoromethylcarbonyl group and a propionyl group. An arylcarbonyl group includes a benzcarbonyl group, a naphthocarbonyl group, and the like.

A substituent in an aromatic residual group which may have substituent(s) and an aliphatic hydrocarbon residual group which may have substituent(s) is not especially limited but includes a hydrogen atom, a sulfo group, a sulfamoyl group, a cyano group, an isocyano group, a thiocyanato group, an isothiocyanato group, a nitro group, a nitrosyl group, a halogen atom, a hydroxyl group, a phosphono group, a phosphate group, a substituted or unsubstituted amino group, a mercapto group which may have substituent(s), an amido group which may have substituent(s), an alkoxy group which may have substituent(s), an aryloxy group which may have substituent(s), a substituted carbonyl group such as a carboxyl group, a carbamoyl group, an acyl group, an aldehyde group or an alkoxycarbonyl group, an aromatic residual group which may have substituent(s), an aliphatic hydrocarbon residual group which may have substituent(s). A halogen atom includes a fluorine atom, a chlorine atom, a bromine atom and an iodine atom. A phosphate group includes a $(C_{1-4})$ alkyl phosphate group. A substituted or unsubstituted amino group includes, for example, an amino group; an alkyl-substituted amino group such as a mono- or a dimethylamino group, a mono- or a diethylamino group and a mono- or a dipropylamino group; an aromatic substituted amino group such as a mono- or a diphenylamino group and a mono- or a dinaphthylamino group; an amino group substituted with one alkyl group and one aromatic hydrocarbon residual group, such as a monoalkyl monophenyl amino group; a benzylamino group or an acetylamino group and a phenylacetylamino group. A mercapto group which may have substituent(s) includes such as a mercapto group, an alkylmercapto group and a phenylmercapto group. An amido group which may be substituted includes such as an amido group, an alkylamido group and an arylamido group. An alkoxyl group means a group formed by bonding the above aliphatic hydrocarbon residual group with an oxygen atom including, for example, a methoxy group, an ethoxy group, a butoxy group a tert-butoxy group and an aryloxy group includes such as a phenoxy group and a naphthoxy group. They may have substituent(s) as described above. The substituent is a similar one as described in the item of an aromatic residual group which may have substituent(s). An acyl group is a similar one as described above. An alkoxycarbonyl group includes a $C_{1-10}$ alkoxycarbonyl group. An aromatic residual group which may have substituent(s) and an aliphatic hydrocarbon residual group which may have substituent(s) are similar ones as described above.

$R_1$ and $R_2$ may together form a ring which may have substituent(s), by bonding with each other or with a benzene ring $a_1$. A ring formed by bonding of $R_1$ and $R_2$ each other includes a morpholine ring, a piperidine ring, a piperazine ring, a pyrrolidine ring, a carbazole ring and an indole ring. A ring formed by bonding of $R_1$ or $R_2$ with a benzene ring $a_1$ includes a julolidine ring. They may have substituent(s) as described above. The substituent is a similar one as described in the item of an aromatic residual group which may have substituent(s) and an aliphatic hydrocarbon residual group which may have substituent(s).

$R_1$ and $R_2$ in Formula (1) are preferably an aromatic residual group which may have substituent(s).

The substituent thereof may be similar one as described in the item of an aromatic residual group which may have substituent(s) and an aliphatic hydrocarbon residual group which may have substituent(s) and preferably a substituted or unsubstituted amino group and an aromatic residual group which may have substituent(s);

$m_1$ is an integer of 0 to 7, preferably an integer of 0 to 6 and more preferably an integer of 1 to 3. $n_1$ is an integer of 1 to 7, preferably an integer of 1 to 6 and more preferably an integer of 1 to 4. Such a combination of $m_1$ and $n_1$ is particularly preferable as $m_1$ is an integer of 1 to 3 and $n_1$ is an integer of 1 to 4.

$X_1$ in Formula (1) represents an aromatic residual group which may have substituent(s), a cyano group, a phosphate group, a sulfo group; or a group having a substituted carbonyl group such as a carboxyl group, a carboamide group, an alkoxycarbonyl group and an acyl group. An aromatic residual group may be similar to one described above and the substituent which may be adopted may be similar to one as described in the item of an aromatic residual group which may have substituent(s). An alkoxycarbonyl group and an acyl group each may be similar to one described above. $X_1$ is preferably an aromatic residual group which may have substituent(s) or a carboxyl group and an aromatic residual group is preferably a residual group of salicylic acid or catechol. As is described later, $X_1$ may form a ring with $A_1$ or $A_2$. A ring to be formed is preferably a heterocycle residual group which may have substituent(s), including specifically pyridine, quinoline, pyran, chromene, pyrimidine, pyrrol, thiazole, benzothiazole, oxazole, benzoxazole, selenazole, benzoselenazole, imidazole, benzimidazole, pyrazole, thiophene and furan, and each heterocycle residual group may have more rings or may be hydrogenated or may be substituted as described above and also preferably has structure forming a rhodanine ring, an oxazolidone ring, a thiooxazolidone ring, a hydantoin ring, a thiohydantoin ring, an indandione ring, a thianaphthene ring, a pyrazolone ring, a barbituric ring, a thiobarbituric ring or a pyridone ring by bonding of these substituents thereof.

Each of $A_1$ and $A_2$ in Formula (1) independently represents an aromatic residual group which may have substituent(s), a hydroxyl group, a phosphate group, a cyano group, a hydrogen atom, a halogen atom, an aliphatic hydrocarbon residual group which may have substituent(s) or a group having a carbonyl group such as carboxyl group, a carboamide group, an alkoxycarbonyl group and an acyl group. An aromatic residual group, a halogen atom, an aliphatic hydrocarbon residual group, an alkoxycarbonyl group and an acyl group may be similar to one described above. When $n_1$ is not smaller than 2 and $A_1$ and $A_2$ are present in plural, each of $A_1$ and $A_2$ may independently be the same or different. It is preferable that each of $A_1$ and $A_2$ independently represents a hydrogen atom, a cyano group, an aliphatic hydrocarbon residual group, a halogen atom or a carboxyl group. A preferable combination is when $n_1$ is 1, both $A_1$ and $A_2$ are cyano groups, or $A_1$ is a hydrogen atom and $A_2$ is a hydrogen atom, a cyano group or a carboxyl group, or when $n_1$ is not smaller than 2, all of $A_1$s and $A_2$s are cyano groups, or all $A_1$s are hydrogen atoms and $A_2$ nearest to $X_1$ is a cyano group or a carboxyl group and other $A_2$s are hydrogen atoms. It is also preferable that $A_1$ in Formula (1), particularly when $n_1$ is not smaller than 2, $A_1$ most apart from $X_1$ is an aromatic residual group which may have substituent(s). An aromatic residual group may be similar to one described above and preferably to be a residual group of benzene, naphthalene, anthrathene, thiophene, pyrrole, furan, and the like. These aromatic residual groups may have substituent(s) as described above. The substituent is not especially limited and may be similar to one as described in the item of an aromatic residual group which may have substituent(s) and preferably a substituted or unsubstituted amino group or an aromatic residual group which may have substituent(s).

Also, a ring which may have substituent(s) may be formed using multiple substituents selected from $A_1$ or each of $A_1$ when $A_1$ is present in plural, and $A_2$ or each of $A_2$ when $A_2$ is present in plural, along with $X_1$.

It is particularly preferable that $A_1$ or each of $A_1$ when $A_1$ is present in plural, and $A_2$ or each of $A_2$ when $A_2$ is present in plural, form a ring which may have substituent(s), and a ring to be formed includes an unsaturated hydrocarbon ring or a heterocycle. An unsaturated hydrocarbon ring includes such as a benzene ring, a naphthalane ring, an anthracene ring, a phenanthrene ring, a pyrene ring, an indene ring, an azulene ring, a fluorene ring, a cyclobutene ring, a cyclohexene ring, a cyclopentene ring, a cyclohexadiene ring and a cyclopentadiene ring. A heterocycle includes such as a pyridine ring, a pyrazine ring, a piperidine ring, an indoline ring, a furan ring, a pyran ring, an oxazole ring, a thiazole ring, an indole ring, a benzothiazole ring, a benzoxazole ring, a quinoline ring, a carbazole ring and a benzopyran ring. Preferable ones among these include a benzene ring, a cyclobutene ring, a cyclopentene ring, a cyclohexene ring, a pyran ring and a furan ring. They may be substituted as described above. The substituent is a similar one as described in the item of an aromatic residual group which may have substituent(s) and an aliphatic hydrocarbon residual group which may have substituent(s). When they have a carbonyl group, a thiocarbonyl group, and the like, they may form a cyclic ketone or a cyclic thioketone, and these rings may have substituent(s). The substituents are similar ones as described in the item of an aromatic residual group which may have substituent(s) and an aliphatic hydrocarbon residual group which may have substituent(s).

When the heterocycle of above $X_1$ or the heterocycle formed by $X_1$ and $A_1$ and $A_2$ has a nitrogen atom, the nitrogen atom may be quaternary form and in that case may have a counter ion. The counter ion is not especially limited, however, it includes specifically such as $F^-$, $Cl^-$, $Br^-$, $I^-$, $ClO_4^-$, $BF_4^-$, $PF_6^-$, $OH^-$, $SO_4^{2-}$, $CH_3SO_4$ and a toluene sulfonate ion, preferably $Br^-$, $I^-$, $ClO_4^-$, $BF_4^-$, $PF_6^-$, $CH_3SO_4^-$ and a toluene sulfonate ion. The nitrogen atom may also be neutralized by an acid group such as an intramolecular or intermolecular carboxyl group instead of the counter ion.

The above-described acid group such as a hydroxyl group, a phosphate group, a sulfo group and a carboxyl group each may form a salt, including a salt with an alkaline metal or an alkaline earth metal such as lithium, sodium, potassium, magnesium and calcium; or an organic base, for example, a salt such as a quaternary ammonium salt such as tetramethylammonium, tetrabutylammonium, pyridinium, imidazolium, piperazinium and piperidinium.

$Y_1$ in Formula (1) is a sulfur atom, a selenium atom, a tellurium atom, a group of $CR_3R_4$ or $NR_5$, and preferably a sulfur atom, a selenium atom, and more preferably a sulfur atom. $R_3$ and $R_4$ include a hydrogen atom, a halogen atom, an amido group, a hydroxyl group, a cyano group, a nitro group, an alkoxyl group, an acyl group, a substituted or unsubstituted amino group, an aliphatic hydrocarbon residual group which may have substituent(s) and an aromatic residual group which may have substituent(s). A halogen atom, an amido group, an alkoxyl group, an acyl group, a substituted or unsubstituted amino group, an aliphatic hydrocarbon residual group which may have substituent(s) and an aromatic residual group which may have substituent(s) each may be similar to one described above. $R_5$ includes a hydrogen atom, an aromatic residual group which may have substituent(s), an aliphatic hydrocarbon residual group which may have substituent(s) or an acyl group. The aromatic residual group which may have substituent(s), the aliphatic hydrocarbon residual group which may have substituent(s) or the acyl group may be similar one as described above. When $m_1$ is not smaller than 2 and $Y_1$ is present in plural, each of $Y_1$ may be the same or different. A benzene ring $a_1$ in Formula (1) may have 1 or plural substituents. The substituents may include a halogen atom, an amido group, a hydroxyl group, a cyano group, a nitro group, an alkoxyl group, an acyl group, a substituted or unsubstituted amino group, an aliphatic hydrocarbon residual group which may have substituent(s) and an aromatic hydrocarbon residual group which may have substituent(s), and when the benzene ring $a_1$ has plural substituents, a ring which may have substituent(s) may be formed by bonding of the plural substituents themselves. The ring to be formed includes the above-described saturated or unsaturated cyclic alkyl group, unsaturated hydrocarbon ring and heterocycle, which may have substituent(s) as described above. The substituent may be a similar one as described in the item of an aromatic residual group which may have substituent(s) and an aliphatic hydrocarbon residual group which may have substituent(s). A halogen atom, an amido group, an alkoxyl group, an acyl group, a substituted or unsubstituted amino group, an aliphatic hydrocarbon residual group which may have substituent(s) and an aromatic residual group which may have substituent(s) may each be a similar one as described above.

A ring $b_1$ in Formula (1) may have 1 or plural substituents. The substituents include a halogen atom, an alkoxyl group, an acyl group, an aliphatic hydrocarbon residual group which may have substituent(s) and an aromatic residual group which may have substituent(s). A halogen atom, an alkoxyl group, an acyl group, an aliphatic hydrocarbon residual group which may have substituent(s) and an aromatic residual group which may have substituent(s) may each be a similar one as described above.

A compound represented by Formula (1) may be present as a structural isomer such as cis-form and trans-form but is not especially limited and any of these can preferably be used as a photosensitizing dye.

A methine dye represented by Formula (1) is preferably a compound represented by the following Formula (2):

(2)

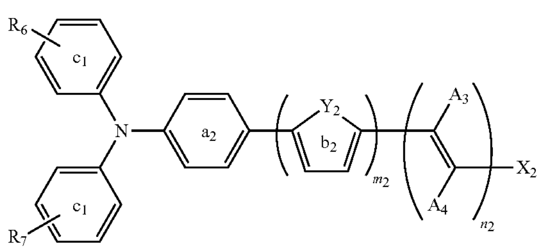

$A_3$ and $A_4$, $m_2$, $n_2$, $X_2$, $Y_2$, a benzene ring $a_2$ and a ring $b_2$ in Formula (2), have the same meanings as corresponding $A_1$ and $A_2$, $m_1$, $n_1$, $X_1$, Y1, a benzene ring $a_1$ and a ring $b_1$ in Formula (1). Each of $R_6$ and $R_7$ represents a substituted or unsubstituted amino group and an aromatic residual group which may have substituent(s). Each of a substituted or unsubstituted amino group and an aromatic residual group which may have substituent (s) is a similar one as described above.

A benzene ring $c_1$ may have 1 or plural substituents and as the substituents may have a halogen atom, an amido group, a hydroxyl group, an alkoxyl group, a substituted or unsubstituted amino group, an aliphatic hydrocarbon residual group which may have substituent(s) or an aromatic residual group which may have substituent(s), and when the benzene ring $c_1$ has plural substituents, a ring which may have substituent(s) may be formed by bonding of the plural substituents themselves. The ring to be formed includes the above-described saturated or unsaturated cyclic alkyl group, unsaturated hydrocarbon ring and heterocycle, which may have substituent(s) as described above. The substituent may be a similar one as described in the item of an aromatic residual group which may have substituent(s) and an aliphatic hydrocarbon residual group which may have substituent(s). A halogen atom, an amido group, an alkoxyl group, a substituted or unsubstituted amino group, an aliphatic hydrocarbon residual group which may have substituent(s) and an aromatic residual group which may have substituent(s) may each be a similar one as described above.

A methine dye represented by Formula (2) is preferably a compound represented by the following Formula (3):

(3)

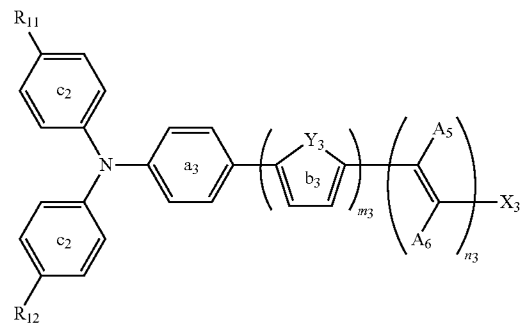

$A_5$ and $A_6$, $m_3$, $n_3$, $X_3$, $Y_3$, a benzene ring $a_3$, a ring $b_3$, a benzene ring $C_2$, $R_{11}$ and $R_{12}$ in Formula (3) have the same meanings as corresponding $A_3$ and $A_4$, $m_2$, $n_2$, $X_2$, $Y_2$, a benzene ring $a_2$, a ring $b_2$, a benzene ring $c_1$, $R_6$ and $R_7$ in Formula (2).

The present invention further relates to methine compounds defined next and by using fine oxide semiconductor particles sensitized with these methine dyes, superior effect can be obtained.

(a) A methine dye represented by the above Formula (1) wherein $R_1$ and $R_2$ are benzene rings; $Y_1$ is a sulfur atom; $m_1$ is an integer of 1 to 2; $n_1$ is an integer of 1; $X_1$ is a carboxyl group; $A_1$ is a hydrogen atom; and $A_2$ is a cyano group.

(b) A methine dye represented by the above Formula (1), wherein $R_1$ and $R_2$ are benzene rings; $Y_1$ is a sulfur atom; $m_1$ is an integer of 1 to 2; $n_1$ is an integer of 1; and $X_1$ and $A_2$ form a rhodanine ring.

(c) A methine dye represented by the above Formula (3), wherein $R_{11}$ and $R_{12}$ are substituted or unsubstituted amino groups or an aromatic residual group which may have substituent(s); $m_3$ is an integer of 0 to 3; $n_3$ is an integer of 1 to 2; $X_3$ is a carboxyl group; $A_5$ is a hydrogen atom; and $A_6$ is a cyano group.

In a methine dye represented by Formula (1), wherein $m_1$ is 0, that is the following dye (7), can be produced by the following reaction scheme. Aniline is subjected to coupling by such as Ullman reaction to obtain an aniline derivative (4), followed by metallization using a base such as butyllithium, adopting a method for reaction with an amide derivative such as dimethylformamide or for reaction with Vilsmeier reagent obtained by reaction of such as dimethylformamide with such as phosphoryl chloride, to obtain a compound (5), a precursor of a compound (7). When $n_1$ is not smaller than 2, it can also be obtained by a method for Claisen condensation of a formyl group, a method for using an amido derivative such as dimethylaminoacrolein and dimethylaminovinylacrolein, and a method for subjecting a formyl group samely to Wittig reaction or Grignard reaction to obtain a vinyl group, followed by further formyl reaction above to obtain a propenal group, a pentadienal group, etc. Further, a dye (7) can be obtained by fusing a compound (5) and a compound (6) with an active methylene group in a solvent, for example, alcohols such as methanol, ethanol, isopropanol and butanol, aprotic polar solvents such as dimethylformamide and N-methylpyrrolidone; toluene and acetic anhydride; in the presence of a basic catalyst such as caustic soda, sodium methylate, sodium acetate, diethylamine, triethylamine, piperidine, piperazine and diazabicycloundecene, if necessary; at about 20° C. to 180° C., preferably at about 50° C. to 150° C. A dye (7) can also be obtained, when $X_1$ is a carboxyl group or a phosphate group, by reaction of an active methylene compound having an alkoxycarbonyl group or a phosphate group, respectively with a compound (5), followed by hydrolysis.

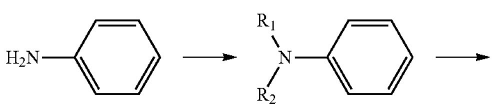

(4)

-continued

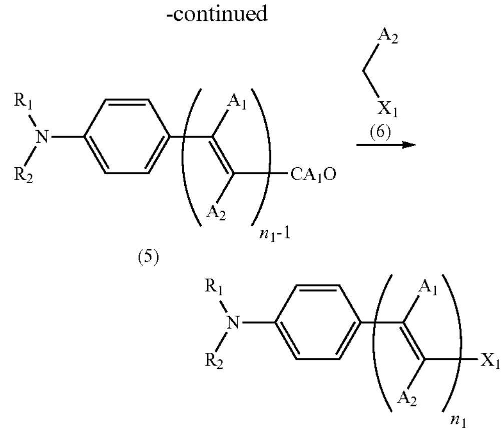

(5)

(7)

Compounds when $m_1$ is 0 are exemplified below.

Specific examples of dyes represented by the following Formula (8) are shown in Table 1 and Table 2, wherein a phenyl group is abbreviated as "Ph". A ring of $X_4$ and a ring (a ring B) formed by $X_4$ with $A_8$ is shown below.

TABLE 1

(8)

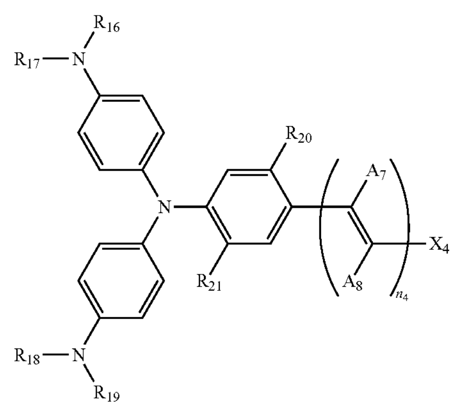

| Compound | $n_4$ | $R_{16}$ | $R_{17}$ | $R_{18}$ | $R_{19}$ | $R_{20}$ | $R_{21}$ | $A_7$ | $A_8$ | $X_4$ |
|---|---|---|---|---|---|---|---|---|---|---|
| 1 | 1 | H | H | H | H | H | H | H | H | COOH |
| 2 | 1 | H | H | H | H | H | H | H | CN | COOH |
| 3 | 1 | $CH_3$ | $CH_3$ | $CH_3$ | $CH_3$ | H | H | H | COOH | COOH |
| 4 | 1 | $CH_3$ | $CH_3$ | $CH_3$ | $CH_3$ | H | H | H | COOH | COOH |
| 5 | 1 | $CH_3$ | $CH_3$ | $CH_3$ | $CH_3$ | H | H | H | $CF_3$ | COOH |
| 6 | 1 | $CH_3$ | $CH_3$ | $CH_3$ | $CH_3$ | H | H | H | $COCF_3$ | COOH |
| 7 | 1 | $CH_3$ | $CH_3$ | $CH_3$ | $CH_3$ | H | H | H | $COCH_3$ | COOH |
| 8 | 1 | $CH_3$ | $CH_3$ | $CH_3$ | $CH_3$ | H | H | H | CN | COOH |
| 9 | 1 | $CH_3$ | $CH_3$ | $CH_3$ | $CH_3$ | H | H | H | CN | $COOCH_3$ |
| 10 | 1 | $CH_3$ | $CH_3$ | $CH_3$ | $CH_3$ | H | H | H | CN | COOLi |
| 11 | 1 | $CH_3$ | $CH_3$ | $CH_3$ | $CH_3$ | H | H | H | CN | COONa |
| 12 | 1 | $CH_3$ | $CH_3$ | $CH_3$ | $CH_3$ | H | H | H | CN | COOK |
| 13 | 1 | $CH_3$ | $CH_3$ | $CH_3$ | $CH_3$ | H | H | H | CN | $PO(OH)_2$ |
| 14 | 1 | $C_2H_5$ | $C_2H_5$ | $C_2H_5$ | $C_2H_5$ | H | H | H | CN | COOH |
| 15 | 1 | $C_4H_9$ | $C_4H_9$ | $C_4H_9$ | $C_4H_9$ | H | H | H | CN | COOH |
| 16 | 1 | $C_8H_{17}$ | $C_8H_{17}$ | $C_8H_{17}$ | $C_8H_{17}$ | H | H | H | CN | COOH |
| 17 | 1 | Ph | Ph | Ph | Ph | H | H | H | CN | COOH |
| 18 | 1 | Ph | $CH_3$ | Ph | $CH_3$ | H | H | H | CN | COOH |
| 19 | 1 | Ph | H | Ph | H | H | H | H | CN | COOH |
| 20 | 1 | $CH_3$ | $CH_3$ | $CH_3$ | $CH_3$ | $OCH_3$ | H | H | CN | COOH |
| 21 | 1 | $CH_3$ | $CH_3$ | $CH_3$ | $CH_3$ | OH | H | H | CN | COOH |
| 22 | 1 | $CH_3$ | $CH_3$ | $CH_3$ | $CH_3$ | H | $CH_3$ | H | CN | COOH |
| 23 | 1 | $CH_3$ | $CH_3$ | $CH_3$ | $CH_3$ | H | H | $CH_3$ | CN | COOH |
| 24 | 2 | $CH_3$ | $CH_3$ | $CH_3$ | $CH_3$ | H | H | H | H | COOH |
| 25 | 3 | $CH_3$ | $CH_3$ | $CH_3$ | $CH_3$ | H | H | H | H | COOH |
| 26 | 4 | $CH_3$ | $CH_3$ | $CH_3$ | $CH_3$ | H | H | H | H | COOH |

TABLE 1-continued (8)

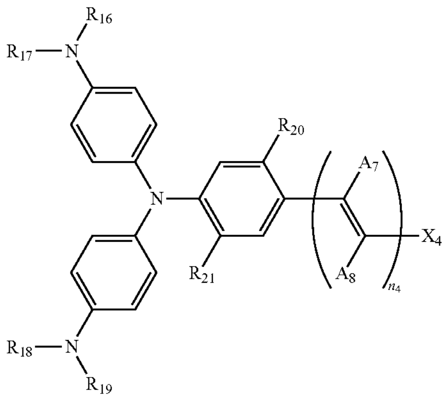

| Compound | $n_4$ | $R_{16}$ | $R_{17}$ | $R_{18}$ | $R_{19}$ | $R_{20}$ | $R_{21}$ | $A_7$ | $A_8$ | $X_4$ |
|---|---|---|---|---|---|---|---|---|---|---|
| 27 | 5 | $CH_3$ | $CH_3$ | $CH_3$ | $CH_3$ | H | H | H | H | COOH |
| 28 | 6 | $CH_3$ | $CH_3$ | $CH_3$ | $CH_3$ | H | H | H | H | COOH |
| 29 | 7 | $CH_3$ | $CH_3$ | $CH_3$ | $CH_3$ | H | H | H | H | COOH |

TABLE 2

| Compound | $n_4$ | $R_{16}$ | $R_{17}$ | $R_{18}$ | $R_{19}$ | $R_{20}$ | $R_{21}$ | $A_7$ | $A_8$ | $X_4$ |
|---|---|---|---|---|---|---|---|---|---|---|
| 30 | 1 | $CH_3$ | $CH_3$ | $CH_3$ | $CH_3$ | H | H | H | H | Ring $B_1$ |
| 31 | 1 | $CH_3$ | $CH_3$ | $CH_3$ | $CH_3$ | H | H | H | H | Ring $B_2$ |
| 32 | 1 | $CH_3$ | $CH_3$ | $CH_3$ | $CH_3$ | H | H | H | H | Ring $B_3$ |
| 33 | 1 | $CH_3$ | $CH_3$ | $CH_3$ | $CH_3$ | H | H | H | H | Ring $B_4$ |
| 34 | 1 | $CH_3$ | $CH_3$ | $CH_3$ | $CH_3$ | H | H | H | H | Ring $B_5$ |
| 35 | 1 | $CH_3$ | $CH_3$ | $CH_3$ | $CH_3$ | H | H | H | H | Ring $B_6$ |
| 36 | 1 | $CH_3$ | $CH_3$ | $CH_3$ | $CH_3$ | H | H | H | H | Ring $B_7$ |
| 37 | 1 | $CH_3$ | $CH_3$ | $CH_3$ | $CH_3$ | H | H | H | H | Ring $B_8$ |
| 38 | 1 | $CH_3$ | $CH_3$ | $CH_3$ | $CH_3$ | H | H | H | H | Ring $B_9$ |
| 39 | 1 | $CH_3$ | $CH_3$ | $CH_3$ | $CH_3$ | H | H | H | H | Ring $B_{10}$ |
| 40 | 1 | $CH_3$ | $CH_3$ | $CH_3$ | $CH_3$ | H | H | H | H | Ring $B_{11}$ |
| 41 | 1 | $C_2H_5$ | $C_2H_5$ | $C_2H_5$ | $C_2H_5$ | H | H | H | H | Ring $B_{12}$ |
| 42 | 1 | $C_4H_9$ | $C_4H_9$ | $C_4H_9$ | $C_4H_9$ | H | H | H | H | Ring $B_{13}$ |
| 43 | 1 | $C_8H_{17}$ | $C_8H_{17}$ | $C_8H_{17}$ | $C_8H_{17}$ | H | H | H | $A_8$ and $X_4$ form a ring $B_{14}$ | |
| 44 | 1 | Ph | Ph | Ph | Ph | H | H | H | $A_8$ and $X_4$ form a ring $B_{15}$ | |
| 45 | 1 | Ph | $CH_3$ | Ph | $CH_3$ | H | H | H | $A_8$ and $X_4$ form a ring $B_{16}$ | |
| 46 | 1 | Ph | H | Ph | H | H | H | H | $A_8$ and $X_4$ form a ring $B_{17}$ | |
| 47 | 1 | $CH_3$ | $CH_3$ | $CH_3$ | $CH_3$ | H | H | H | $A_8$ and $X_4$ form a ring $B_{18}$ | |
| 48 | 1 | $CH_3$ | $CH_3$ | $CH_3$ | $CH_3$ | H | H | H | $A_8$ and $X_4$ form a ring $B_{19}$ | |
| 49 | 1 | $CH_3$ | $CH_3$ | $CH_3$ | $CH_3$ | H | H | H | $A_8$ and $X_4$ form a ring $B_{20}$ | |
| 50 | 1 | $CH_3$ | $CH_3$ | $CH_3$ | $CH_3$ | H | H | H | $A_8$ and $X_4$ form a ring $B_{21}$ | |
| 51 | 1 | $CH_3$ | $CH_3$ | $CH_3$ | $CH_3$ | H | H | H | $A_8$ and $X_4$ form a ring $B_{22}$ | |
| 52 | 1 | $CH_3$ | $CH_3$ | $CH_3$ | $CH_3$ | H | H | H | $A_8$ and $X_4$ form a ring $B_{23}$ | |
| 53 | 1 | $CH_3$ | $CH_3$ | $CH_3$ | $CH_3$ | H | H | H | $A_8$ and $X_4$ form a ring $B_{24}$ | |
| 54 | 1 | $CH_3$ | $CH_3$ | $CH_3$ | $CH_3$ | H | H | H | $A_8$ and $X_4$ form a ring $B_{25}$ | |
| 55 | 1 | $CH_3$ | $CH_3$ | $CH_3$ | $CH_3$ | H | H | H | $A_8$ and $X_4$ form a ring $B_{26}$ | |
| 56 | 1 | $CH_3$ | $CH_3$ | $CH_3$ | $CH_3$ | H | H | H | $A_8$ and $X_4$ form a ring $B_{27}$ | |
| 57 | 1 | $CH_3$ | $CH_3$ | $CH_3$ | $CH_3$ | H | H | H | $A_8$ and $X_4$ form a ring $B_{28}$ | |
| 58 | 1 | $CH_3$ | $CH_3$ | $CH_3$ | $CH_3$ | H | H | H | $A_8$ and $X_4$ form a ring $B_{29}$ | |

Other examples of dyes represented by Formula (8) are shown below.
(59)
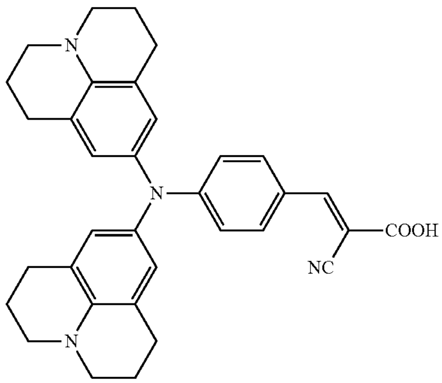
(60)
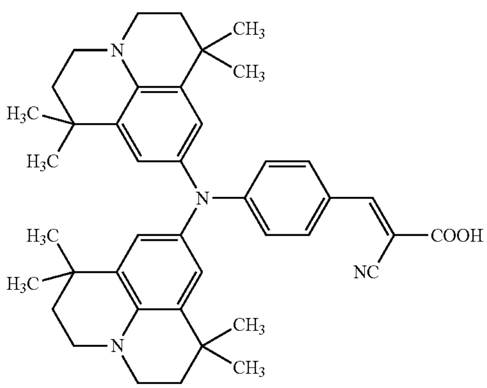
(61)
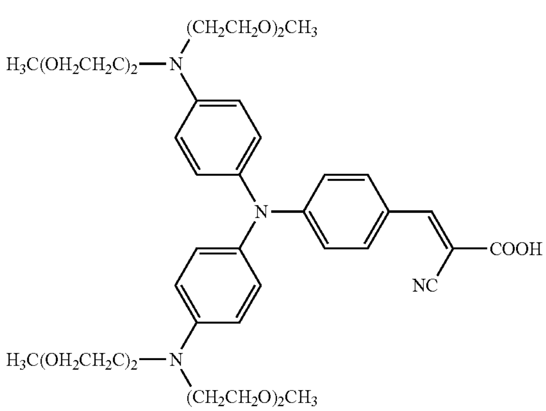
-continued
(62)
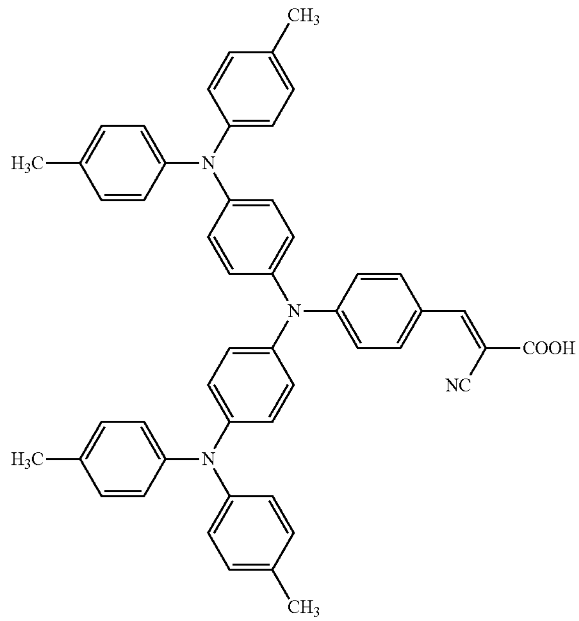
(63)
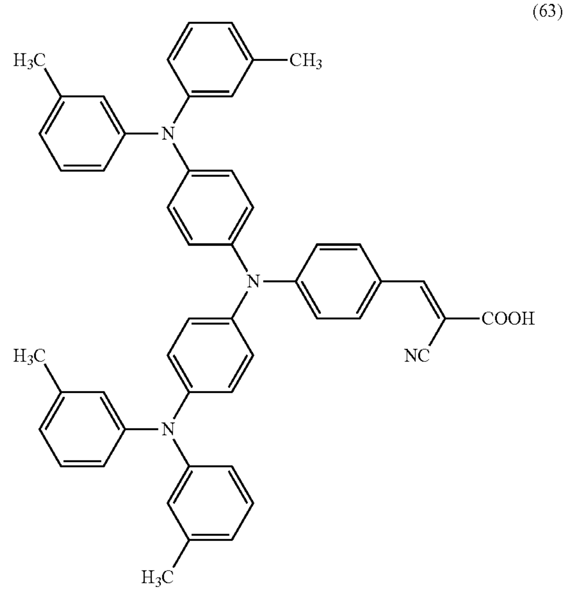
(64)
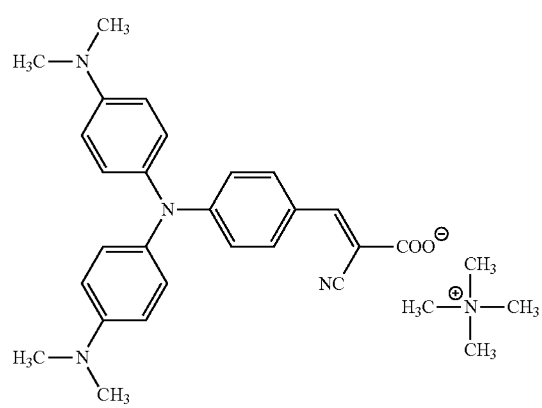

-continued
(65)
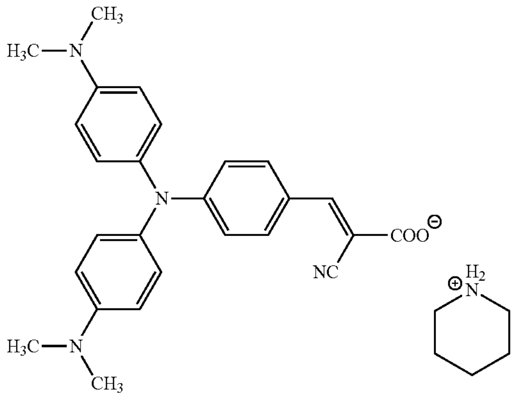
(66)
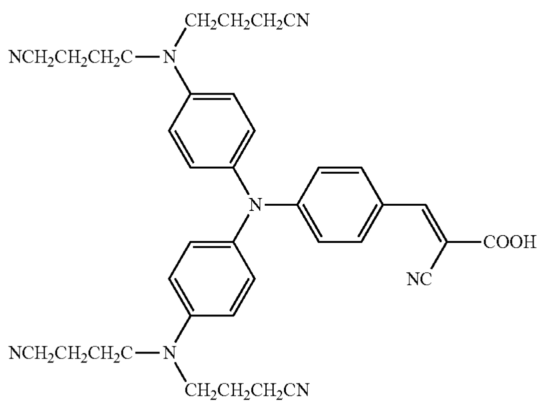
(67)
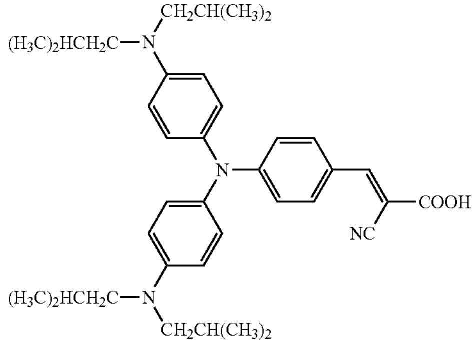
-continued
(68)
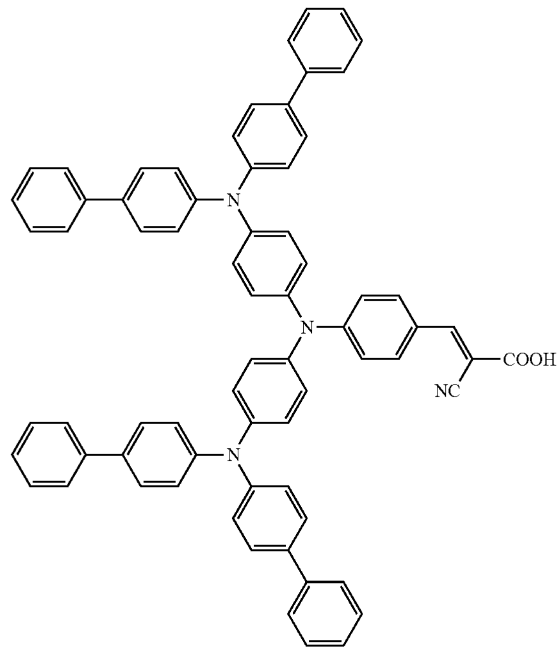
(69)
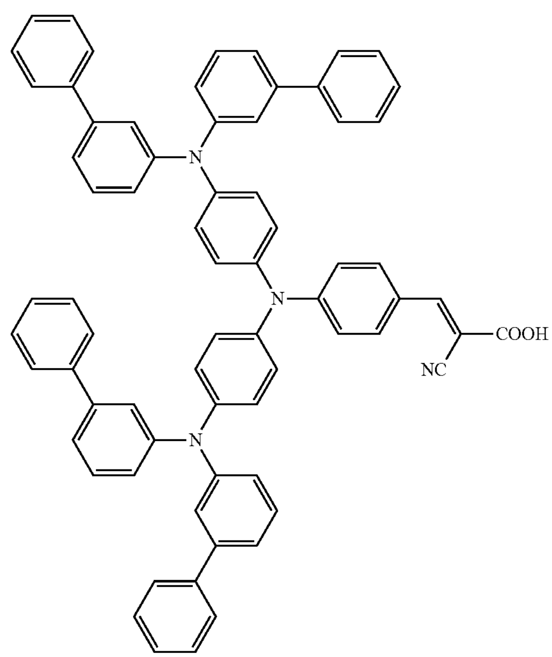

-continued
(70)
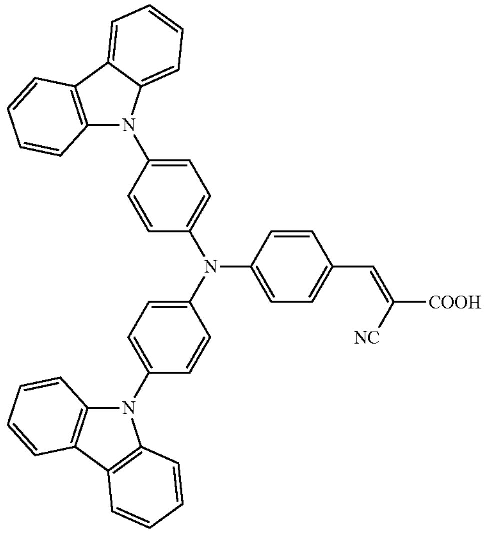
(71)
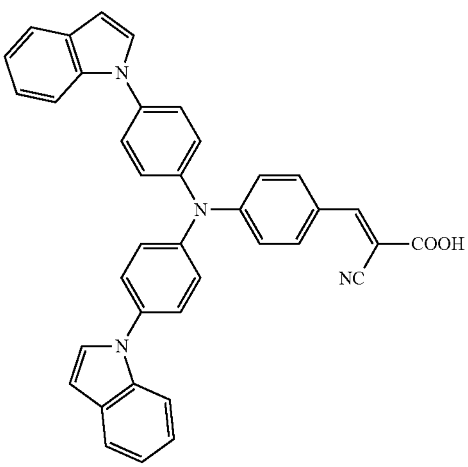
(72)
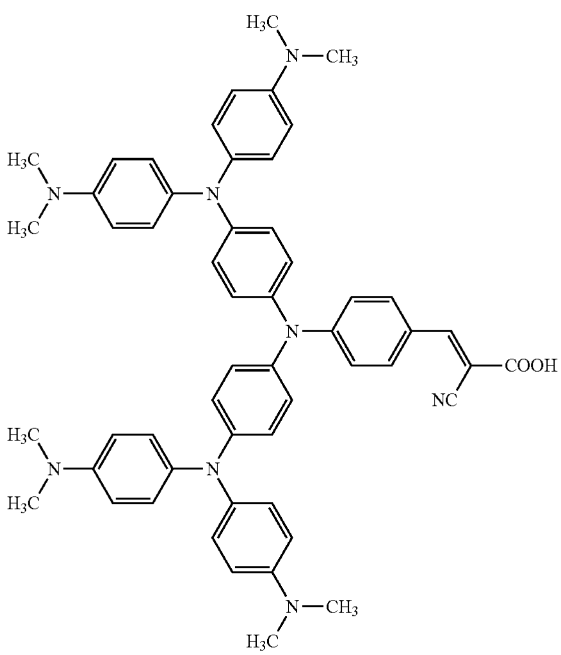
-continued
(73)
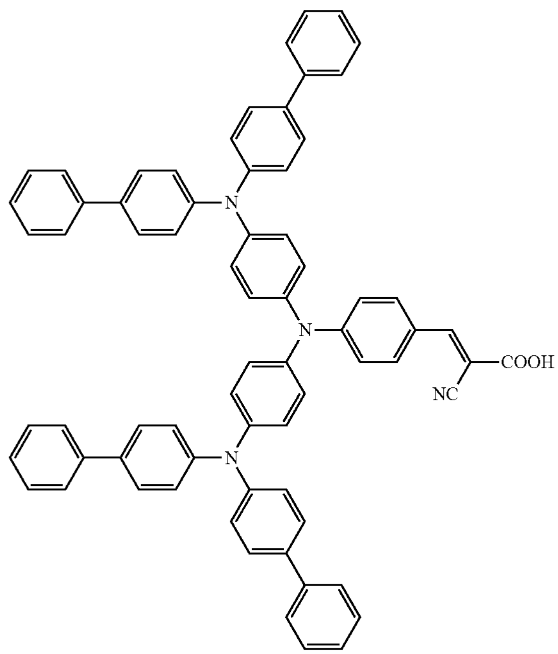
(74)
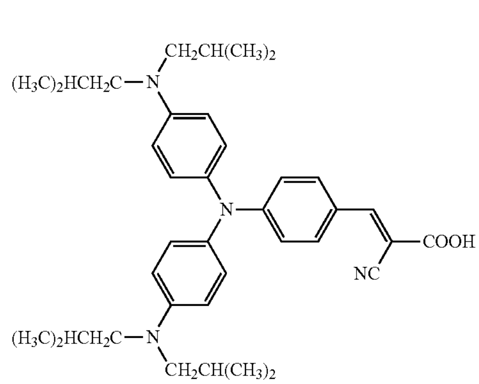

-continued
(75)
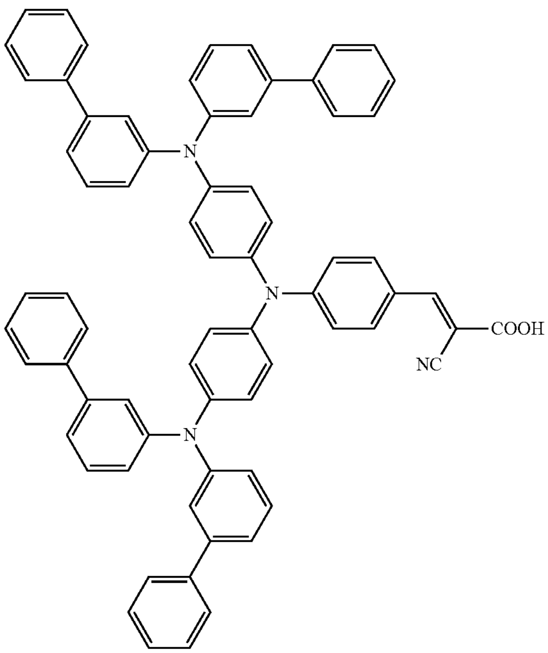
(76)
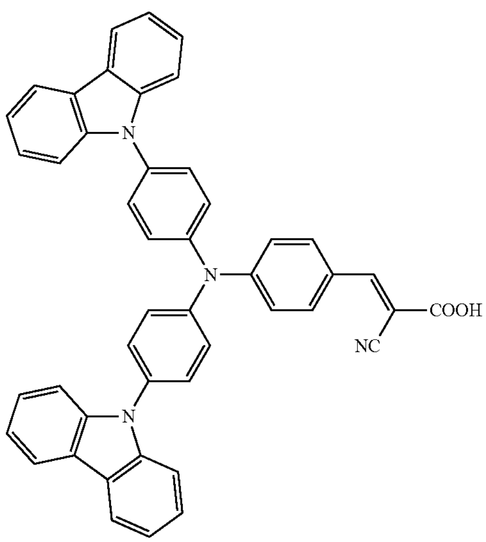
(77)
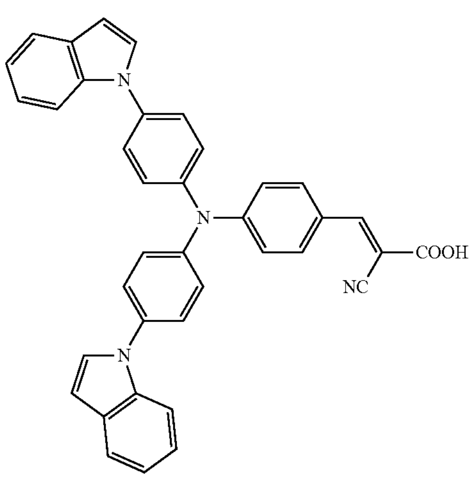
-continued
(78)
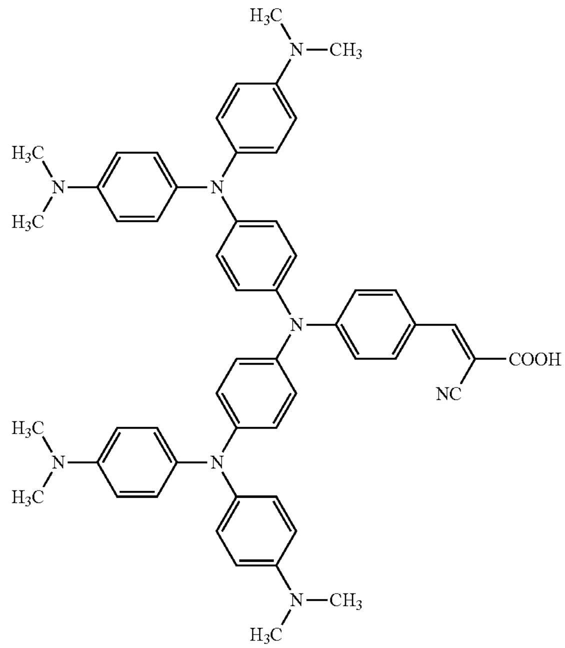
(79)
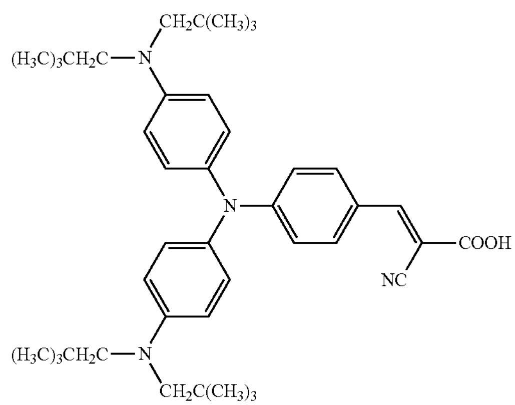
(80)
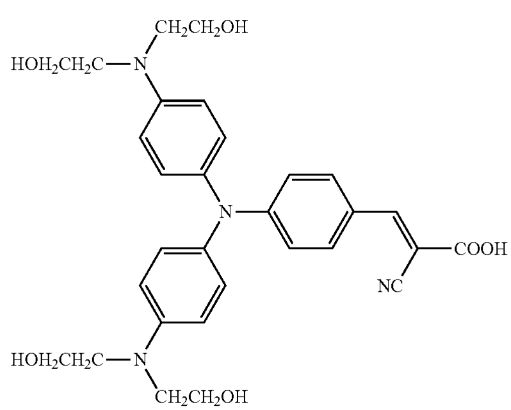

-continued
(81)
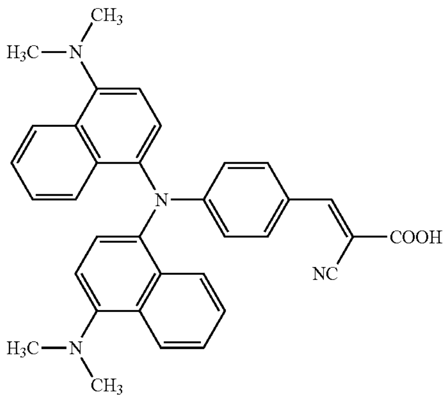
(82)
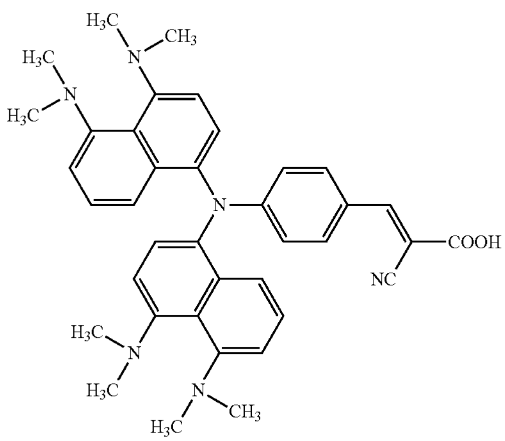
(83)
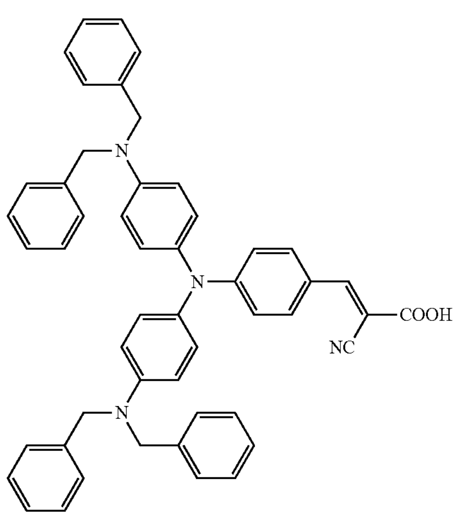
-continued
(84)
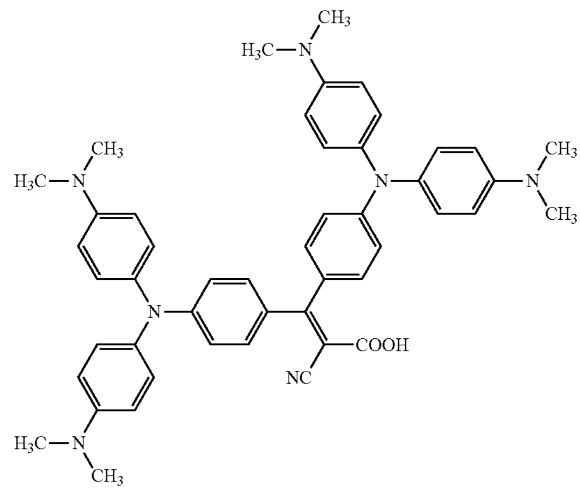
(85)
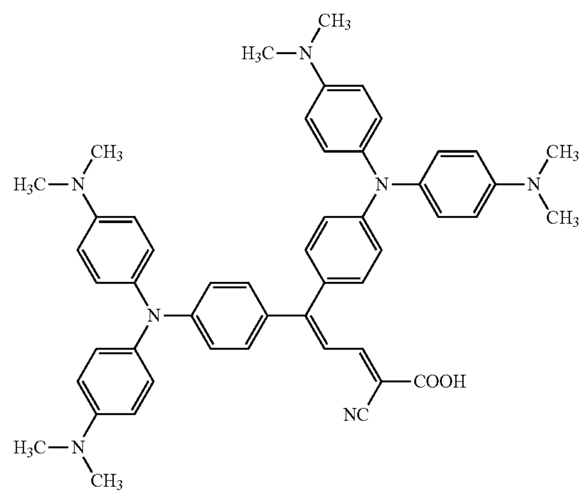
(86)
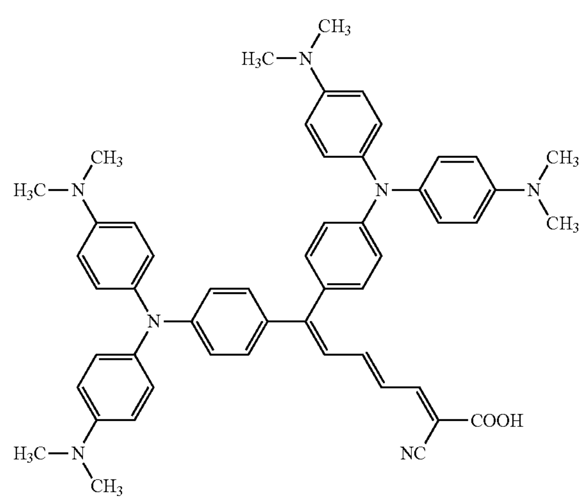

-continued
(87)
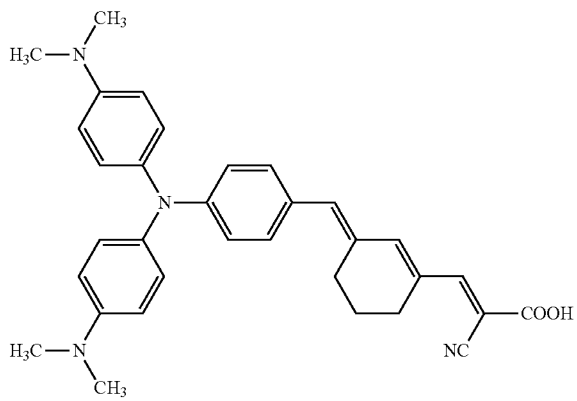
(88)
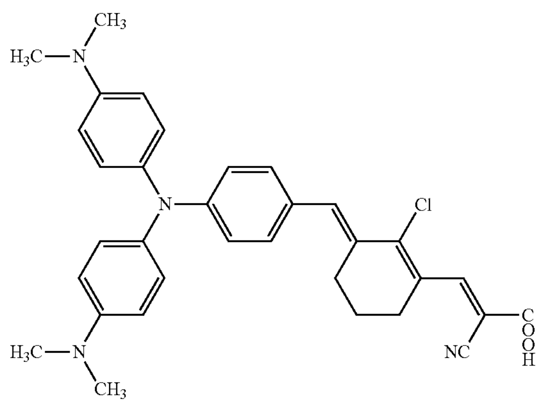
(89)
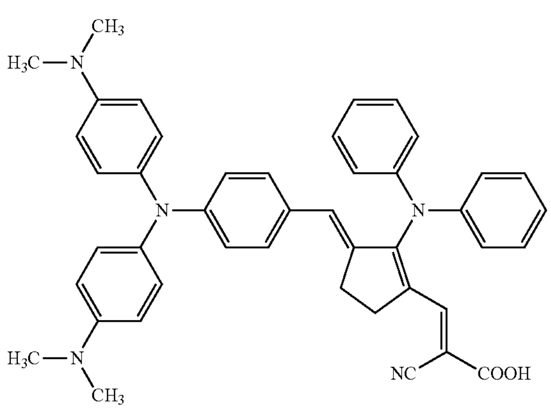
(90)
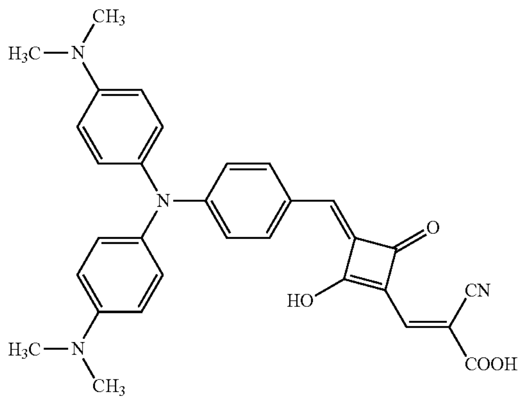
-continued
(91)
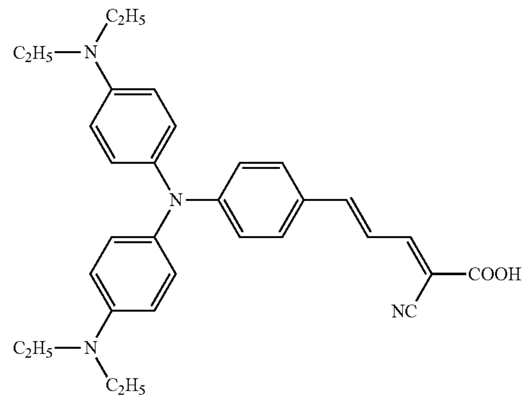
(92)
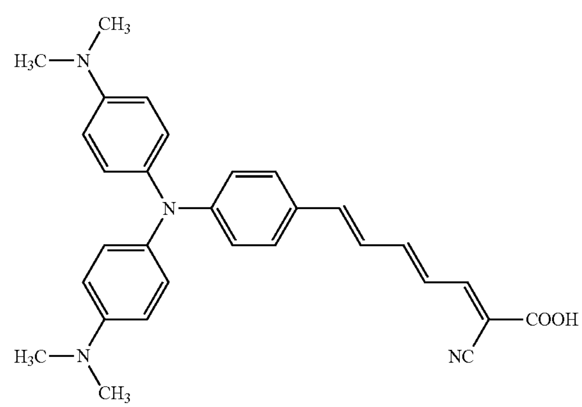
(93)
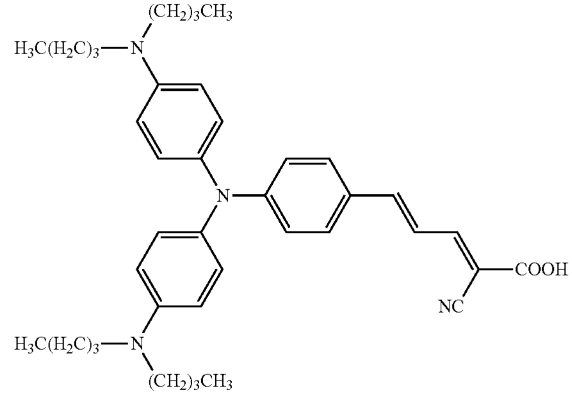

-continued
(94)
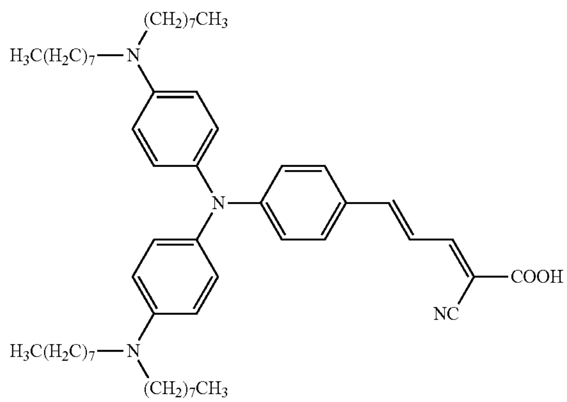
(95)
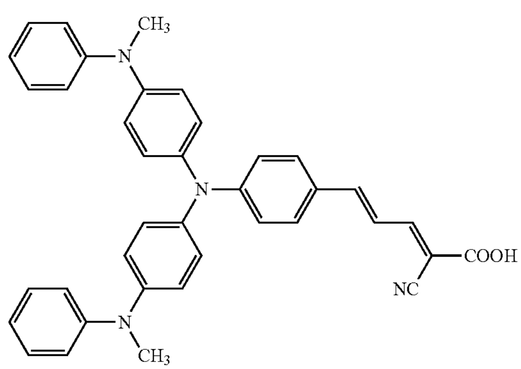
(96)
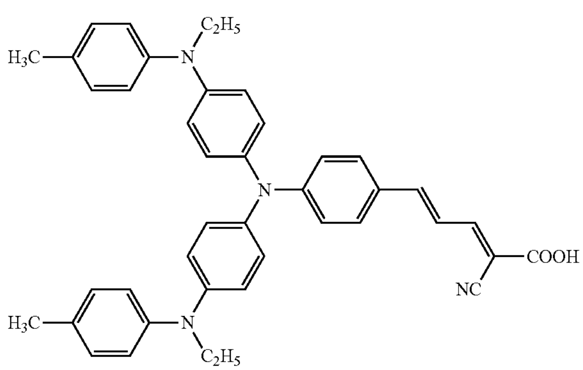
(97)
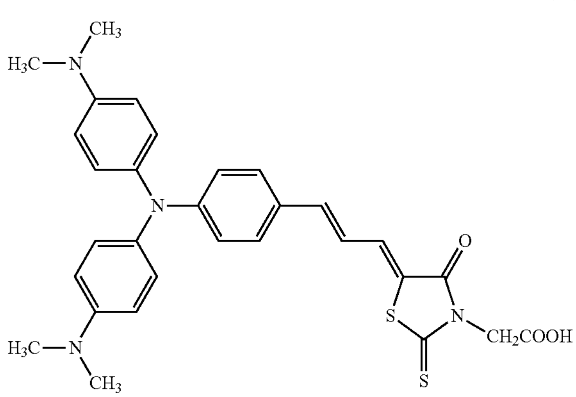
-continued
(98)
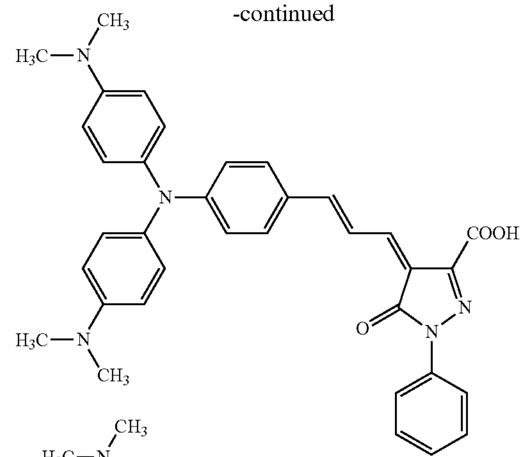
(99)
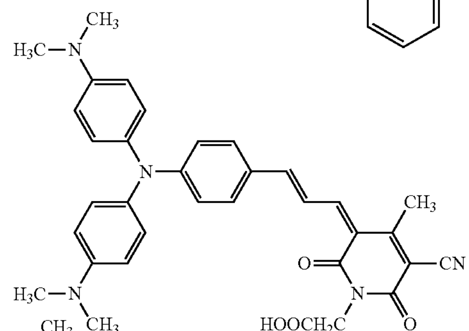
(100)
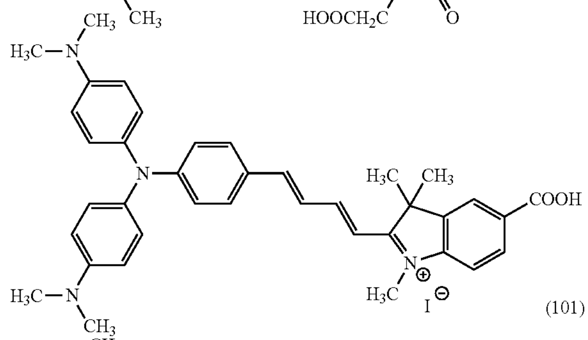
(101)
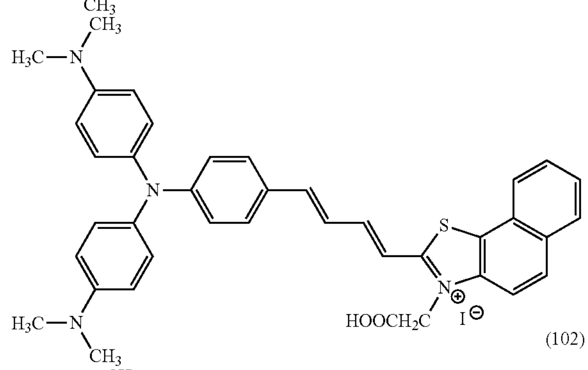
(102)
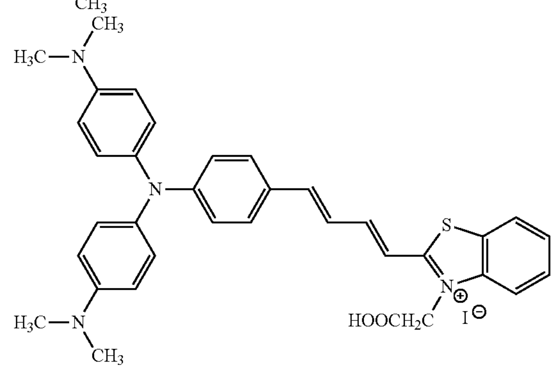

-continued (103)

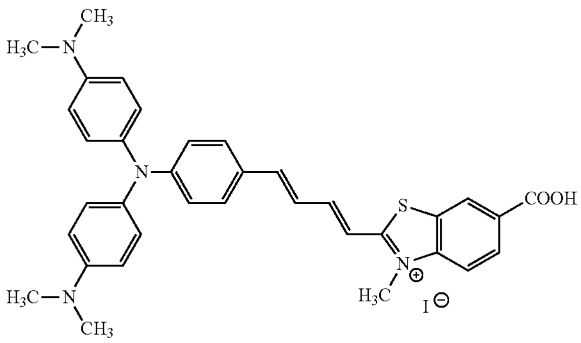

(104)

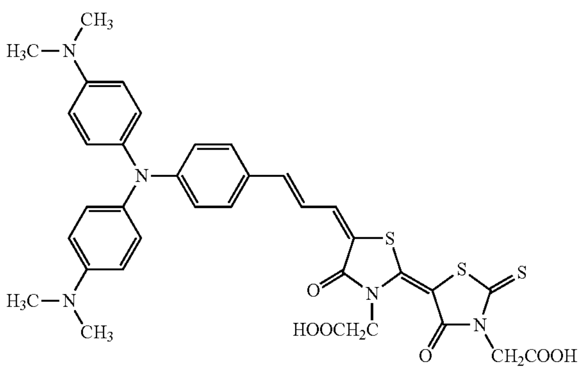

-continued (105)

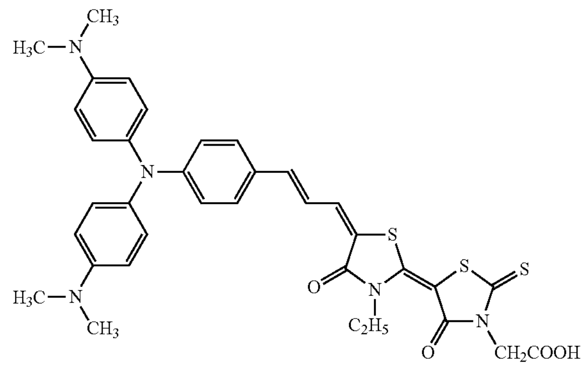

(106)

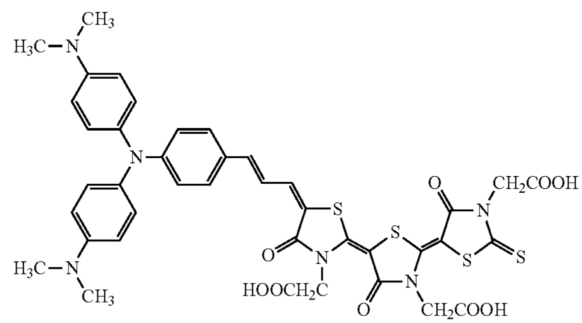

Specific examples of dyes represented by the following Formula (9) are shown in Table 3 and Table 4, wherein a phenyl group is abbreviated as "Ph". A ring of $X_5$ and a ring (a ring B) formed by $X_5$ with $A_{10}$ is shown below.

TABLE 3

(9)

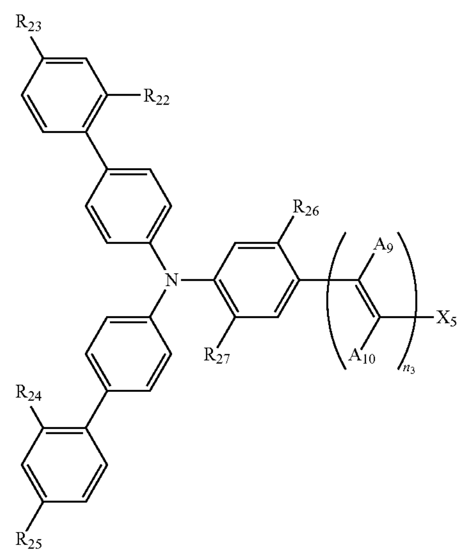

| compound | $n_5$ | $R_{22}$ | $R_{23}$ | $R_{24}$ | $R_{25}$ | $R_{26}$ | $R_{27}$ | $A_9$ | $A_{10}$ | $X_5$ |
|---|---|---|---|---|---|---|---|---|---|---|
| 107 | 1 | H | H | H | H | H | H | H | H | COOH |
| 108 | 1 | H | H | H | H | H | H | H | CN | COOH |
| 109 | 1 | H | $CH_3$ | H | $CH_3$ | H | H | H | CN | COOH |
| 110 | 1 | H | H | H | H | H | H | H | COOH | COOH |
| 111 | 1 | H | H | H | H | H | H | H | $CF_3$ | COOH |
| 112 | 1 | H | H | H | H | H | H | H | $COCF_3$ | COOH |

TABLE 3-continued (9)

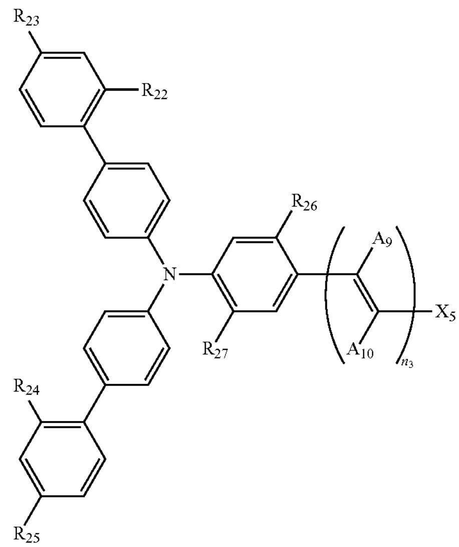

| compound | $n_5$ | $R_{22}$ | $R_{23}$ | $R_{24}$ | $R_{25}$ | $R_{26}$ | $R_{27}$ | $A_9$ | $A_{10}$ | $X_5$ |
|---|---|---|---|---|---|---|---|---|---|---|
| 113 | 1 | H | H | H | H | H | H | H | $COCH_3$ | COOH |
| 114 | 1 | H | Ph | H | Ph | H | H | H | CN | COOH |
| 115 | 1 | H | H | H | H | H | H | H | CN | $COOCH_3$ |
| 116 | 1 | H | H | H | H | H | H | H | CN | COOLi |
| 117 | 1 | H | H | H | H | H | H | H | CN | COONa |
| 118 | 1 | H | H | H | H | H | H | H | CN | COOK |
| 119 | 1 | H | H | H | H | H | H | H | CN | $PO(OH)_2$ |
| 120 | 1 | $CH_3$ | H | $CH_3$ | H | H | H | H | CN | COOH |
| 121 | 1 | $C_4H_9$ | H | $C_4H_9$ | H | H | H | H | CN | COOH |
| 122 | 1 | $C_8H_{17}$ | H | $C_8H_{17}$ | H | H | H | H | CN | COOH |
| 123 | 1 | Cl | H | Cl | H | H | H | H | CN | COOH |
| 124 | 1 | Br | H | Br | H | H | H | H | CN | COOH |
| 125 | 1 | I | H | I | H | H | H | H | CN | COOH |
| 126 | 1 | H | H | H | H | $OCH_3$ | H | H | CN | COOH |
| 127 | 7 | H | H | H | H | OH | H | H | CN | COOH |
| 128 | 1 | H | H | H | H | H | $CH_3$ | H | CN | COOH |
| 129 | 1 | H | H | H | H | H | H | $CH_3$ | CN | COOH |
| 130 | 2 | H | H | H | H | H | H | H | H | COOH |
| 131 | 3 | H | H | H | H | H | H | H | H | COOH |
| 132 | 4 | H | H | H | H | H | H | H | H | COOH |
| 133 | 5 | H | H | H | H | H | H | H | H | COOH |
| 134 | 6 | H | H | H | H | H | H | H | H | COOH |
| 135 | 7 | H | H | H | H | H | H | H | H | COOH |

TABLE 4

| Compound | $n_5$ | $R_{22}$ | $R_{23}$ | $R_{24}$ | $R_{25}$ | $R_{26}$ | $R_{27}$ | $A_9$ | $A_{10}$ | $X_5$ |
|---|---|---|---|---|---|---|---|---|---|---|
| 136 | 1 | H | H | H | H | H | H | H | H | Ring $B_1$ |
| 137 | 1 | H | H | H | H | H | H | H | H | Ring $B_2$ |
| 138 | 1 | H | H | H | H | H | H | H | H | Ring $B_3$ |
| 139 | 1 | H | H | H | H | H | H | H | H | Ring $B_4$ |
| 140 | 1 | H | H | H | H | H | H | H | H | Ring $B_5$ |
| 141 | 1 | H | H | H | H | H | H | H | H | Ring $B_6$ |
| 142 | 1 | H | H | H | H | H | H | H | H | Ring $B_7$ |
| 143 | 1 | H | H | H | H | H | H | H | H | Ring $B_8$ |
| 144 | 1 | H | H | H | H | H | H | H | H | Ring $B_9$ |
| 145 | 1 | H | H | H | H | H | H | H | H | Ring $B_{10}$ |
| 146 | 1 | H | H | H | H | H | H | H | H | Ring $B_{11}$ |
| 147 | 1 | H | H | H | H | H | H | H | H | Ring $B_{12}$ |
| 148 | 1 | H | H | H | H | H | H | H | H | Ring $B_{13}$ |
| 149 | 1 | H | H | H | H | H | H | H | $A_{10}$ and $X_5$ form a ring $B_{14}$ | |
| 150 | 1 | H | H | H | H | H | H | H | $A_{10}$ and $X_5$ form a ring $B_{15}$ | |
| 151 | 1 | H | H | H | H | H | H | H | $A_{10}$ and $X_5$ form a ring $B_{16}$ | |
| 152 | 1 | H | H | H | H | H | H | H | $A_{10}$ and $X_5$ form a ring $B_{17}$ | |
| 153 | 1 | H | H | H | H | H | H | H | $A_{10}$ and $X_5$ form a ring $B_{18}$ | |
| 154 | 1 | H | H | H | H | H | H | H | $A_{10}$ and $X_5$ form a ring $B_{19}$ | |
| 155 | 1 | H | H | H | H | H | H | H | $A_{10}$ and $X_5$ form a ring $B_{20}$ | |

TABLE 4-continued

| Compound | $n_5$ | $R_{22}$ | $R_{23}$ | $R_{24}$ | $R_{25}$ | $R_{26}$ | $R_{27}$ | $A_9$ | $A_{10}$ | $X_5$ |
|---|---|---|---|---|---|---|---|---|---|---|
| 156 | 1 | H | H | H | H | H | H | H | $A_{10}$ and $X_5$ form a ring $B_{21}$ | |
| 157 | 1 | H | H | H | H | H | H | H | $A_{10}$ and $X_5$ form a ring $B_{22}$ | |
| 158 | 1 | H | H | H | H | H | H | H | $A_{10}$ and $X_5$ form a ring $B_{23}$ | |
| 159 | 1 | H | H | H | H | H | H | H | $A_{10}$ and $X_5$ form a ring $B_{24}$ | |
| 160 | 1 | H | H | H | H | H | H | H | $A_{10}$ and $X_5$ form a ring $B_{25}$ | |
| 161 | 1 | H | H | H | H | H | H | H | $A_{10}$ and $X_5$ form a ring $B_{26}$ | |
| 162 | 1 | H | H | H | H | H | H | H | $A_{10}$ and $X_5$ form a ring $B_{27}$ | |
| 163 | 1 | H | H | H | H | H | H | H | $A_{10}$ and $X_5$ form a ring $B_{28}$ | |
| 164 | 1 | H | H | H | H | H | H | H | $A_{10}$ and $X_5$ form a ring $B_{29}$ | |

Other examples of dyes represented by Formula (9) are shown below.

(165)

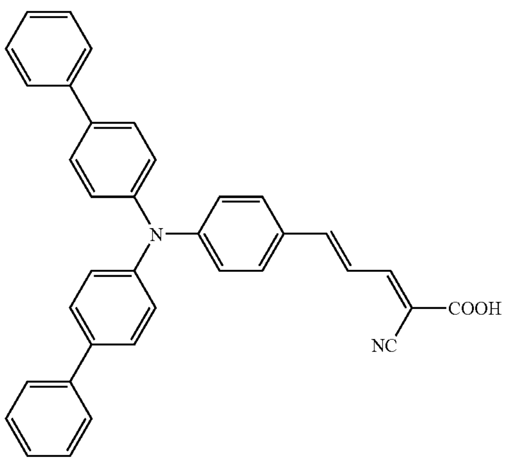

(166)

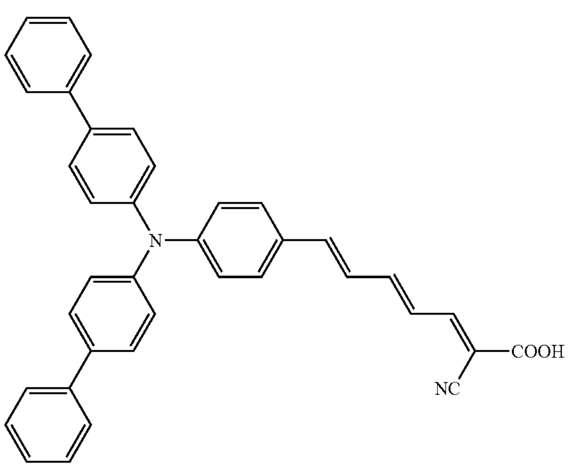

-continued (167)

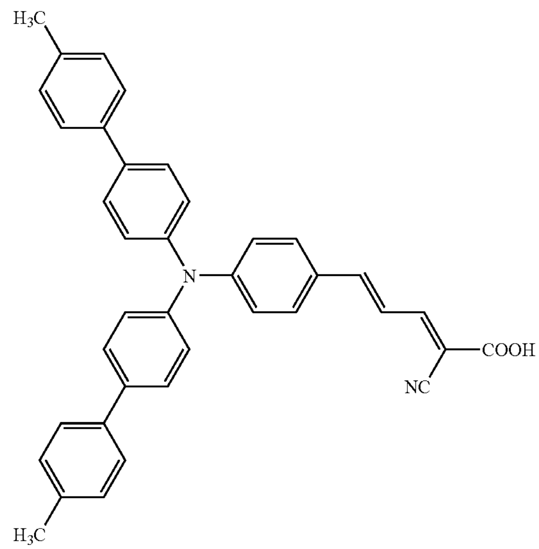

(168)

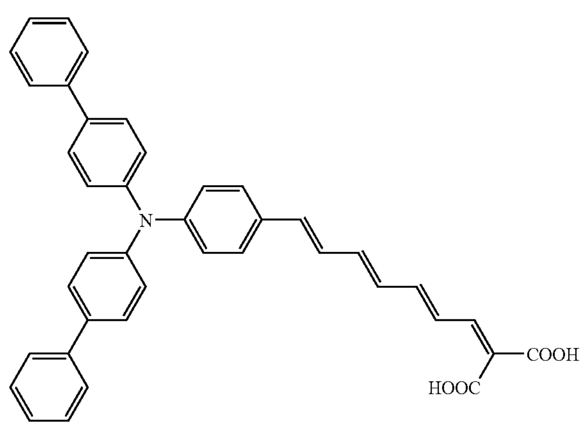

-continued
(169)
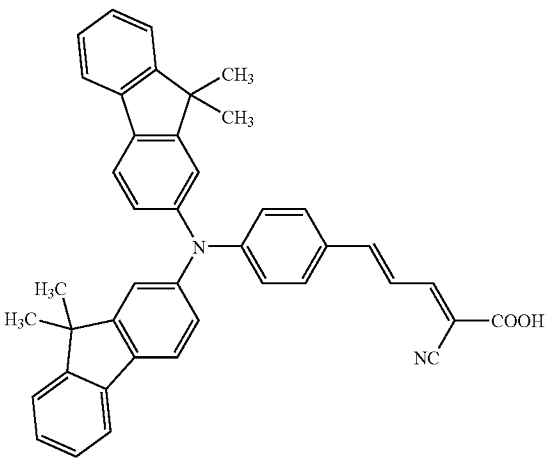
(170)
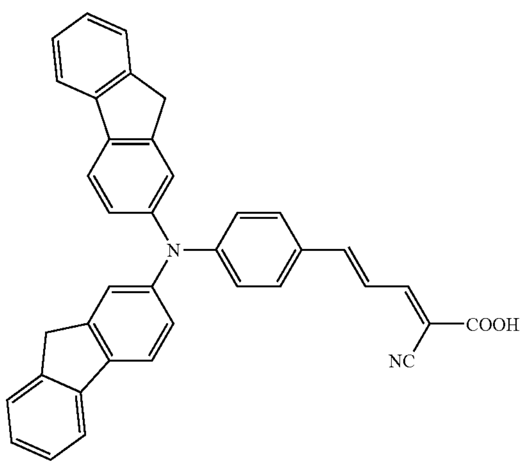
(171)
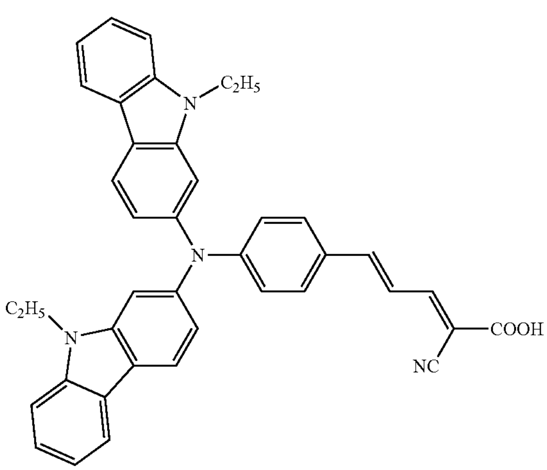
-continued
(172)
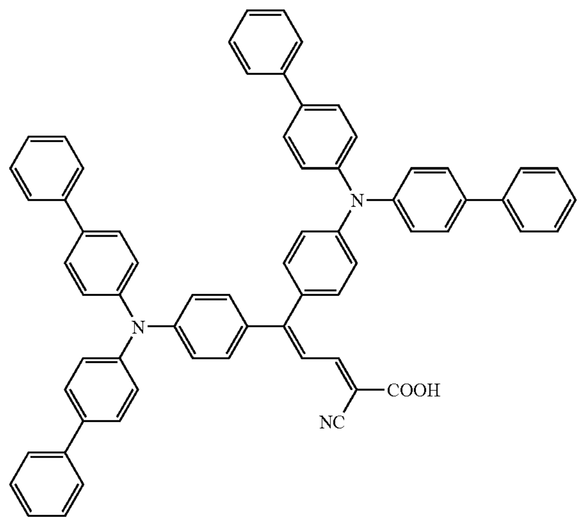
(173)
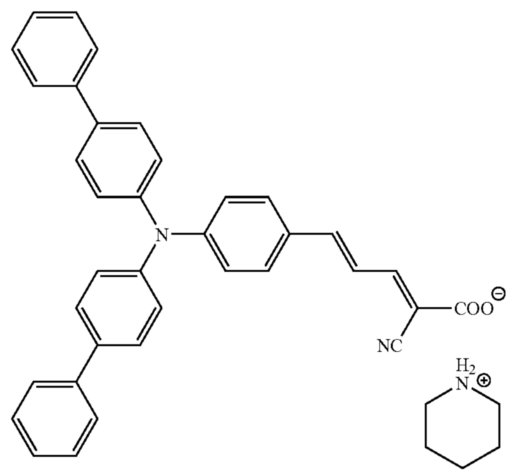
(174)
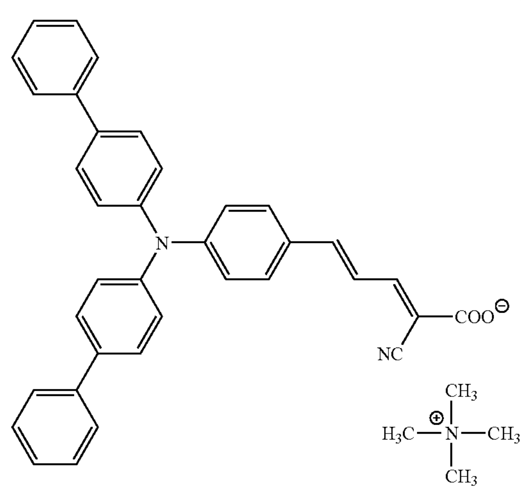

-continued
(175)
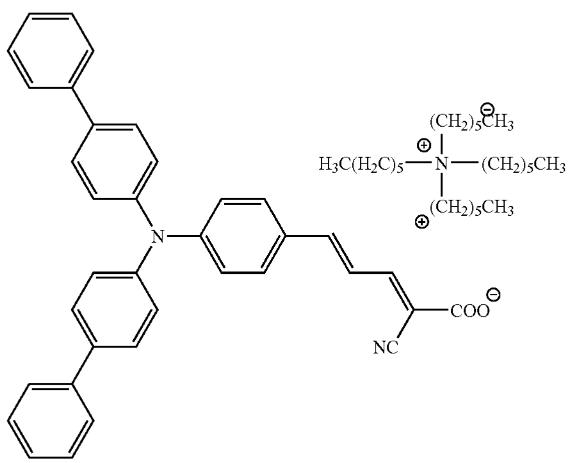
(176)
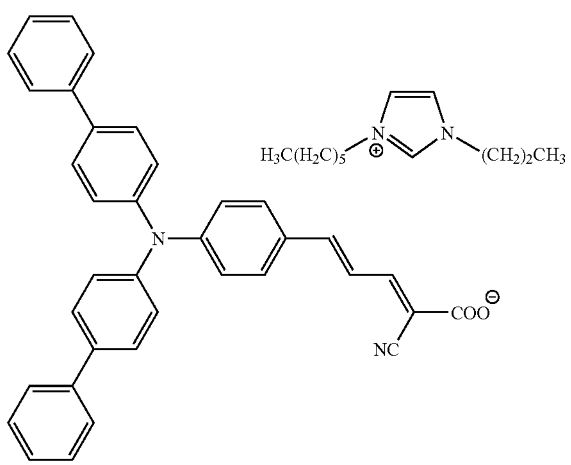
(177)
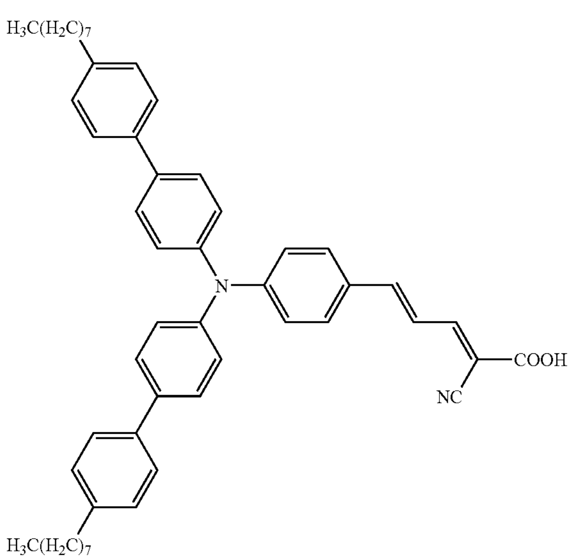
-continued
(178)
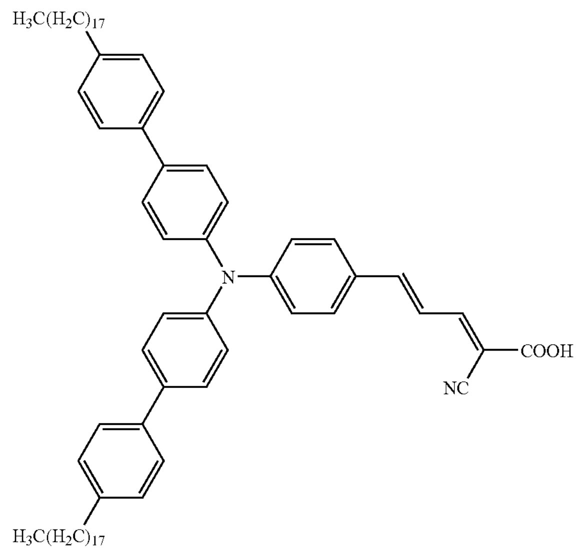
(179)
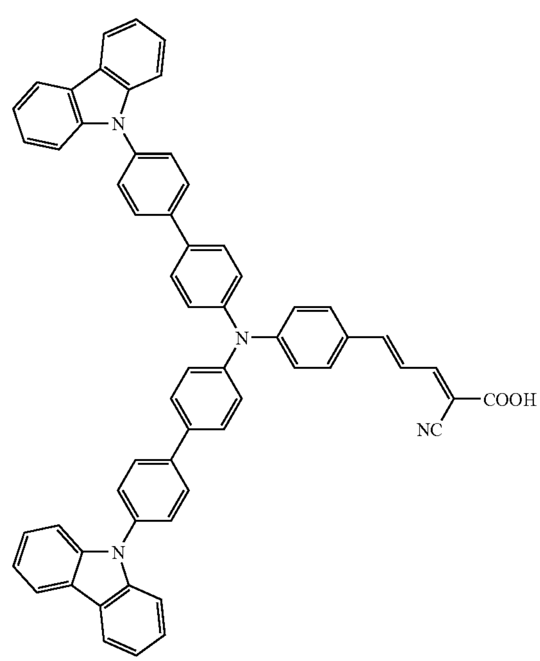

-continued
(180)
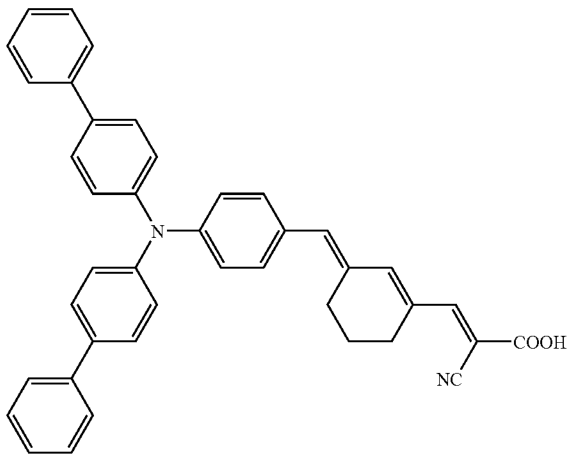
(181)
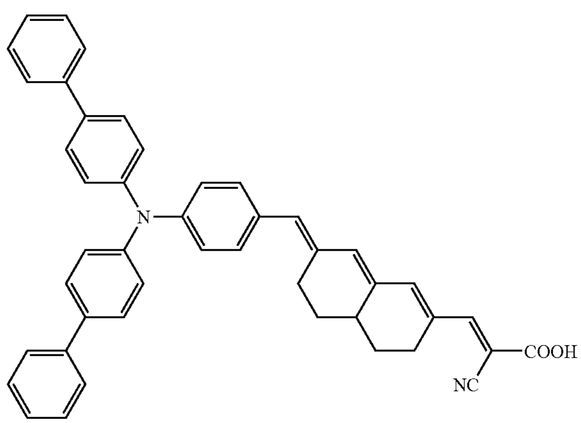
(182)
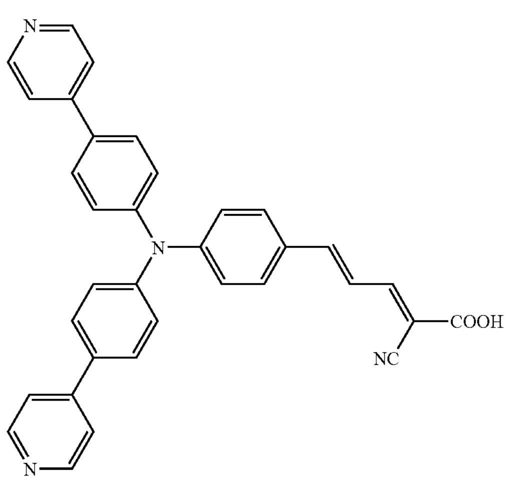
-continued
(183)
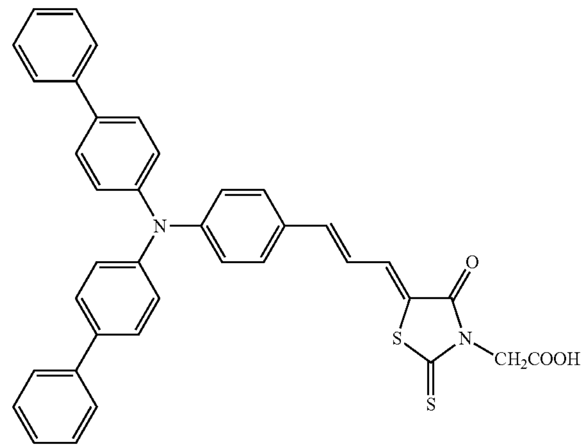
(184)
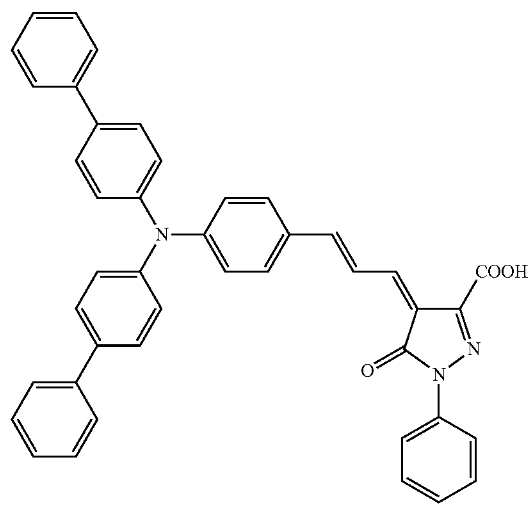
(185)
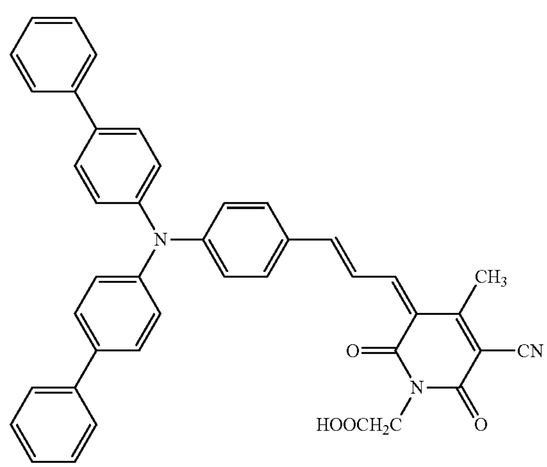

-continued
(186)
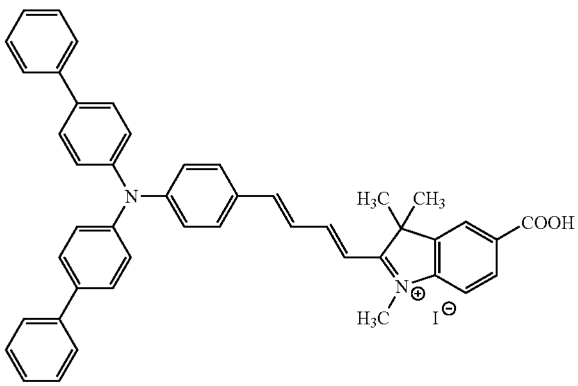
(187)
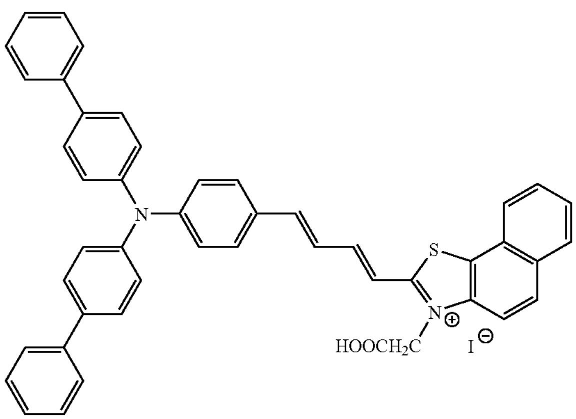
(188)
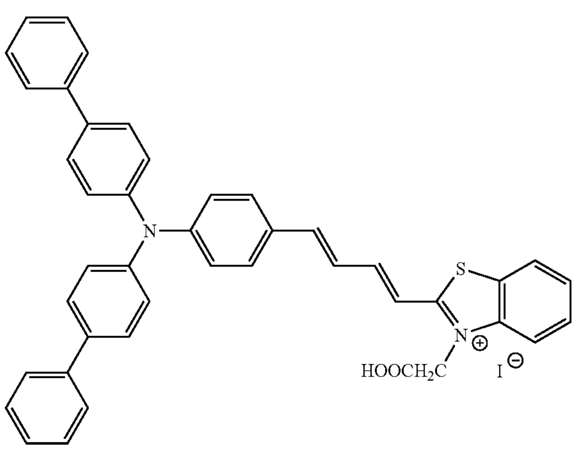
-continued
(189)
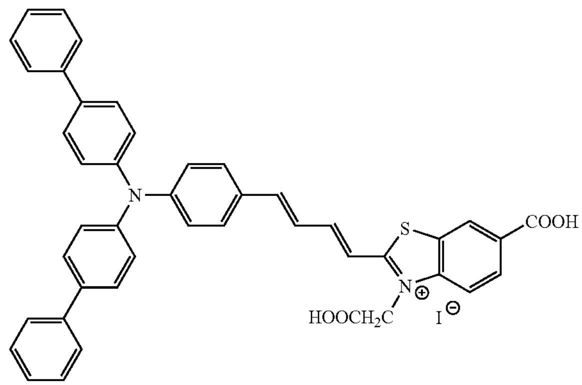
(190)
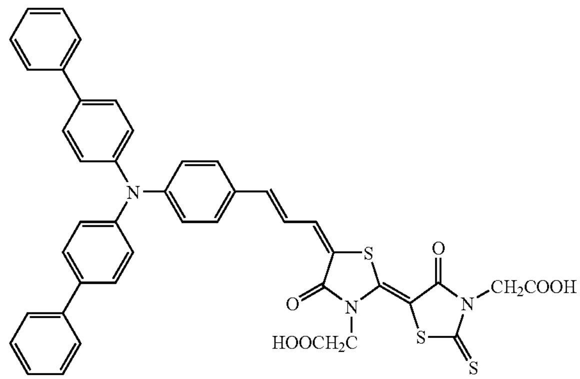
(191)
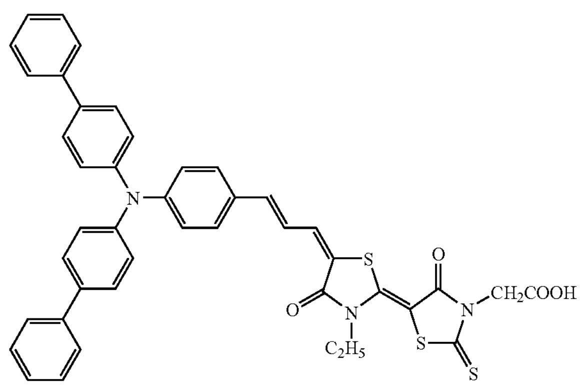
(192)
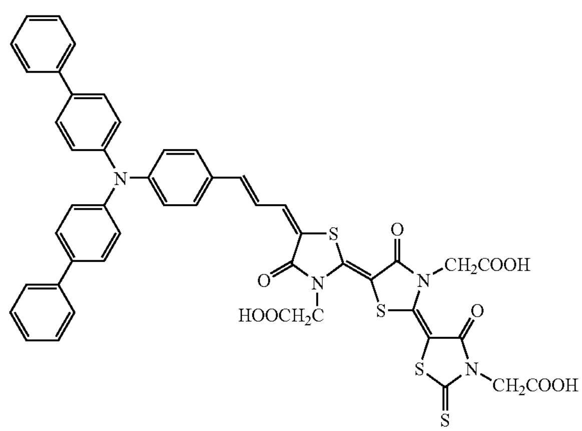

A dye (1) in a methine dye represented by Formula (1), wherein $m_1$ is not smaller than 1, can be produced by the following reaction scheme. A compound (14), an intermediate for synthesis of a methine dye represented by Formula (1) can be produced generally by a method of Ogura, et al. (for example, see JP-A-2000-252071) (a compound (10) is converted to a boric acid derivatized compound (11), followed by reaction thereof with a compound (12)) (in the following reaction scheme, Z in a compound (12) represents a halogen atom such as Cl, Br and I.). Further by metallization of a compound represented by this Formula (13) using a base such as butyllithium, followed by reaction with an amide derivative such as dimethylformamide, or by reaction with Vilsmeier reagent, obtained by reaction of such as dimethylformamide with such as phosphoryl chloride, a compound (14), a precursor of a compound (1) can be obtained. When $n_1$ is not smaller than 2, it can also be obtained by a method for Claisen condensation of a formyl group and the like, amethod for using an amido derivative such as dimethylaminoacrolein and dimethylaminovinylacrolein, and amethod for subjecting a formyl group to Wittig reaction or Grignard reaction to obtain a vinyl group, followed by further formyl reaction above to obtain a propenal group, a pentadienal group, etc. Further, by fusing a compound (14) and a compound (6) having an active methylene group in a solvent, for example, alcohols such as methanol, ethanol, isopropanol and butanol, aprotic polar solvents such as dimethylformamide and N-methylpyrrolidone, toluene, acetic anhydride, and the like; in the presence of a basic catalyst such as caustic soda, sodium methylate, sodium acetate, diethylamine, triethylamine, piperidine, piperazine and diazabicycloundecene, if necessary; at 20° C. to 180° C., preferably at about 50° C. to 150° C., a dye (1) can be obtained. When $X_1$ is a carboxyl group or a phosphate group, by reaction of an active methylene compound having an alkoxycarbonyl group or a phosphate group, respectively with a compound (14), followed by hydrolysis, a compound (1) can also be obtained.

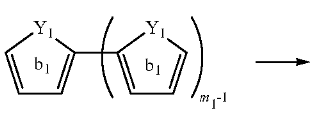

(10)

-continued

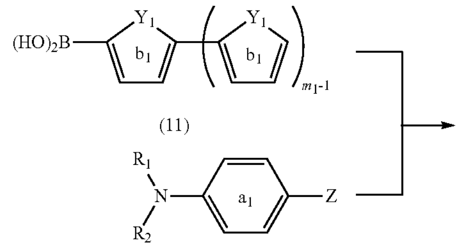

(11)

(12)

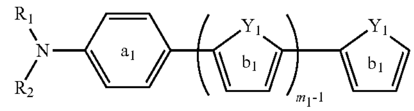

(13)

(13) ⟶

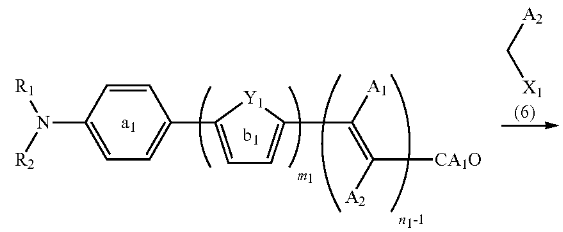

(14)

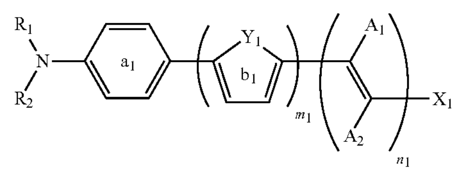

(1)

Compounds are exemplified below.

Specific examples of dyes represented by the following Formula (15) are shown in Table 5 to Table 7, wherein a phenyl group is abbreviated as "Ph". A ring of $X_6$ and a ring (a ring B) formed by $X_6$ with $A_{12}$ is shown below.

TABLE 5

(15)

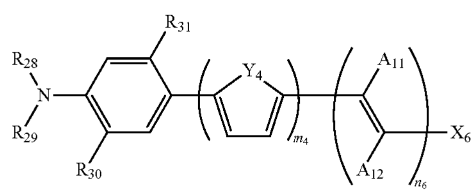

| Compound | $m_4$ | $n_6$ | $R_{26}$ | $R_{29}$ | $R_{30}$ | $R_{31}$ | $Y_4$ | $A_{11}$ | $A_{12}$ | $X_6$ |
|---|---|---|---|---|---|---|---|---|---|---|
| 193 | 1 | 1 | H | H | H | H | S | H | H | COOH |
| 194 | 1 | 1 | H | H | H | H | Se | H | OH | COOH |
| 195 | 1 | 1 | H | H | H | H | NH | H | H | COOH |
| 196 | 1 | 1 | H | H | H | H | $NCH_3$ | H | H | COOH |
| 197 | 1 | 1 | $CH_3$ | $CH_3$ | H | H | S | H | CN | COOH |
| 198 | 1 | 1 | $CH_3$ | $CH_3$ | H | H | Se | H | $CONH_2$ | COOH |
| 199 | 1 | 1 | $C_2H_5$ | $C_2H_5$ | H | H | S | H | CN | COOH |
| 200 | 1 | 1 | $C_2H_5$ | $C_2H_5$ | H | H | Te | H | CN | COOH |
| 201 | 1 | 1 | $C_3H_7$ | $C_3H_7$ | H | $NO_2$ | S | H | CN | COOH |

TABLE 5-continued (15)

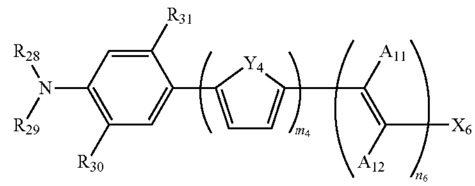

| Compound | $m_4$ | $n_6$ | $R_{26}$ | $R_{29}$ | $R_{30}$ | $R_{31}$ | $Y_4$ | $A_{11}$ | $A_{12}$ | $X_6$ |
|---|---|---|---|---|---|---|---|---|---|---|
| 202 | 1 | 1 | $C_4H_9$ | $C_4H_9$ | H | H | S | H | CN | COOH |
| 203 | 1 | 1 | $C_8H_{17}$ | $C_8H_{17}$ | H | H | S | H | CN | COOH |
| 204 | 1 | 1 | $C_{18}H_{37}$ | $C_{18}H_{37}$ | H | H | S | H | CN | COOH |
| 205 | 1 | 1 | Ph | Ph | H | H | S | H | CN | COOH |
| 206 | 1 | 1 | Ph | H | H | H | S | H | CN | COOH |
| 207 | 1 | 1 | Ph | $CH_3$ | H | H | S | H | CN | COOH |
| 208 | 1 | 1 | Ph | $C_2H_5$ | H | H | S | H | CN | COOH |
| 209 | 1 | 1 | Ph | $C_{18}H_{37}$ | H | H | S | H | CN | COOH |
| 210 | 1 | 1 | $CH_3$ | $C_2H_5$ | H | Cl | S | H | CN | COOH |
| 211 | 1 | 1 | $COCH_3$ | $C_2H_5$ | H | H | S | H | CN | COOH |
| 212 | 1 | 1 | $CH_3$ | $CH_3$ | H | H | S | $CH_3$ | CN | COOH |
| 213 | 1 | 1 | $CH_3$ | $CH_3$ | H | CN | S | $C_4H_9$ | CN | COOH |
| 214 | 1 | 1 | $CH_3$ | $CH_3$ | H | H | S | $C_8H_{17}$ | CN | COOH |
| 215 | 1 | 1 | $CH_3$ | $CH_3$ | H | $OCH_3$ | S | H | CN | COOH |
| 216 | 1 | 1 | $CH_3$ | $CH_3$ | H | $OC_2H_5$ | S | H | CN | COOH |
| 217 | 1 | 1 | Ph | Ph | H | $OC_8H_{17}$ | S | H | CN | COOH |
| 218 | 1 | 1 | Ph | Ph | H | OH | S | H | CN | COOH |
| 219 | 1 | 1 | Ph | Ph | $CH_3$ | $CH_3$ | S | H | CN | COOH |
| 220 | 1 | 1 | Ph | Ph | $NHCOCH_3$ | $OCH_3$ | S | H | CN | COOH |
| 221 | 1 | 1 | Ph | Ph | $CH_3$ | Ph | S | H | CN | COOH |
| 222 | 1 | 1 | Ph | Ph | H | H | S | H | COOH | COOH |
| 223 | 1 | 1 | Ph | Ph | H | H | S | H | CN | COOLi |
| 224 | 1 | 1 | Ph | Ph | H | $COCH_3$ | S | H | CN | COONa |
| 225 | 1 | 1 | Ph | Ph | H | H | S | H | CN | COOK |

TABLE 6

| Compound | $m_4$ | $n_6$ | $R_{28}$ | $R_{29}$ | $R_{30}$ | $R_{31}$ | $Y_4$ | $A_{11}$ | $A_{12}$ | $X_6$ |
|---|---|---|---|---|---|---|---|---|---|---|
| 226 | 1 | 1 | Ph | Ph | H | $C_8H_{17}$ | S | H | CN | COOH |
| 227 | 1 | 1 | Ph | Ph | H | H | S | H | CN | $PO(OH)_2$ |
| 228 | 1 | 1 | Ph | Ph | H | H | S | H | $CF_3$ | COOH |
| 229 | 1 | 1 | Ph | Ph | H | H | S | H | $COCH_3$ | COOH |
| 230 | 1 | 1 | Ph | Ph | H | H | S | H | $COCF_3$ | COOH |
| 231 | 1 | 1 | Ph | Ph | Ph | Ph | S | H | CN | $SO_3H$ |
| 232 | 1 | 1 | Ph | Ph | H | H | S | H | $NO_2$ | COOH |
| 233 | 1 | 1 | Ph | Ph | H | H | S | H | CN | $COOCH_3$ |
| 234 | 1 | 1 | Ph | Ph | H | H | S | H | $COOCH_3$ | $COOCH_3$ |
| 235 | 1 | 1 | Ph | Ph | H | H | S | H | Cl | COOH |
| 236 | 1 | 1 | Ph | Ph | H | H | S | $CH_3$ | $CH_3$ | COOH |
| 237 | 1 | 1 | Ph | Ph | H | H | S | Ph | H | $CONH_2$ |
| 238 | 1 | 2 | Ph | Ph | H | $N(CH_3)_2$ | S | H | H | COOH |
| 239 | 1 | 2 | Ph | Ph | H | H | S | $CH_3$ | H | COOH |
| 240 | 1 | 2 | Ph | Ph | H | H | S | H | $CH_3$ | COOH |
| 241 | 1 | 3 | Ph | Ph | H | H | S | H | H | COOH |
| 242 | 1 | 4 | Ph | Ph | H | H | S | H | H | COOH |
| 243 | 1 | 5 | Ph | Ph | H | H | S | H | H | COOH |
| 244 | 1 | 7 | Ph | Ph | H | H | S | H | H | COOH |
| 245 | 2 | 1 | $CH_3$ | $CH_3$ | H | H | S | H | CN | COOH |
| 246 | 2 | 1 | Ph | Ph | H | H | S | H | CN | COOH |
| 247 | 2 | 1 | Ph | Ph | H | H | S | $CH_3$ | CN | COOH |
| 248 | 3 | 1 | Ph | Ph | H | H | S | H | CN | COOH |
| 249 | 4 | 1 | Ph | Ph | H | H | S | H | CN | COOH |
| 250 | 5 | 1 | Ph | Ph | H | H | S | H | CN | COOH |
| 251 | 7 | 1 | Ph | Ph | H | H | S | H | CN | COOH |
| 252 | 2 | 2 | Ph | Ph | H | H | S | H | H | COOH |
| 253 | 3 | 2 | Ph | Ph | H | H | S | H | H | COOH |
| 254 | 4 | 2 | Ph | Ph | H | H | S | H | H | COOH |
| 255 | 5 | 2 | Ph | Ph | H | H | S | H | H | COOH |

TABLE 7

| Compound | $m_4$ | $n_6$ | $R_{28}$ | $R_{29}$ | $R_{30}$ | $R_{31}$ | $Y_4$ | $A_{11}$ | $A_{12}$ | $X_6$ |
|---|---|---|---|---|---|---|---|---|---|---|
| 256 | 1 | 1 | Ph | Ph | H | H | S | H | H | Ring $B_1$ |
| 257 | 1 | 1 | Ph | Ph | H | H | S | H | H | Ring $B_2$ |
| 258 | 1 | 1 | Ph | Ph | H | H | S | H | H | Ring $B_3$ |
| 259 | 1 | 1 | Ph | Ph | H | H | S | H | H | Ring $B_4$ |
| 260 | 1 | 1 | Ph | Ph | H | H | S | H | H | Ring $B_5$ |
| 261 | 1 | 1 | Ph | Ph | H | H | S | H | H | Ring $B_6$ |
| 262 | 1 | 1 | Ph | Ph | H | H | S | H | H | Ring $B_7$ |
| 263 | 1 | 1 | Ph | Ph | H | H | S | H | H | Ring $B_8$ |
| 264 | 1 | 1 | Ph | Ph | H | H | S | H | H | Ring $B_9$ |
| 265 | 1 | 1 | Ph | Ph | H | H | S | H | H | Ring $B_{10}$ |
| 266 | 1 | 1 | Ph | Ph | H | H | S | H | H | Ring $B_{11}$ |
| 267 | 1 | 1 | Ph | Ph | H | H | S | H | H | Ring $B_{12}$ |
| 268 | 1 | 1 | Ph | Ph | H | H | S | H | H | Ring $B_{13}$ |
| 269 | 1 | 1 | Ph | Ph | H | H | S | H | $A_{12}$ and $X_6$ form a ring $B_{14}$ | |
| 270 | 1 | 1 | Ph | Ph | H | H | S | H | $A_{12}$ and $X_6$ form a ring $B_{15}$ | |
| 271 | 1 | 1 | Ph | Ph | H | H | S | H | $A_{12}$ and $X_6$ form a ring $B_{16}$ | |
| 272 | 1 | 1 | Ph | Ph | H | H | S | H | $A_{12}$ and $X_6$ form a ring $B_{17}$ | |
| 273 | 1 | 1 | Ph | Ph | H | H | S | H | $A_{12}$ and $X_6$ form a ring $B_{18}$ | |
| 274 | 1 | 1 | Ph | Ph | H | H | S | H | $A_{12}$ and $X_6$ form a ring $B_{19}$ | |
| 275 | 1 | 1 | Ph | Ph | H | H | S | H | $A_{12}$ and $X_6$ form a ring $B_{20}$ | |
| 276 | 1 | 1 | Ph | Ph | H | H | S | H | $A_{12}$ and $X_6$ form a ring $B_{21}$ | |
| 277 | 1 | 1 | Ph | Ph | H | H | S | H | $A_{12}$ and $X_6$ form a ring $B_{22}$ | |
| 278 | 1 | 1 | Ph | Ph | H | H | S | H | $A_{12}$ and $X_6$ form a ring $B_{23}$ | |
| 279 | 1 | 1 | Ph | Ph | H | H | S | H | $A_{12}$ and $X_6$ form a ring $B_{24}$ | |
| 280 | 1 | 1 | Ph | Ph | H | H | S | H | $A_{12}$ and $X_6$ form a ring $B_{25}$ | |
| 281 | 1 | 1 | Ph | Ph | H | H | S | H | $A_{12}$ and $X_6$ form a ring $B_{26}$ | |
| 282 | 1 | 1 | Ph | Ph | H | H | S | H | $A_{12}$ and $X_6$ form a ring $B_{27}$ | |
| 283 | 1 | 1 | Ph | Ph | H | H | S | H | $A_{12}$ and $X_6$ form a ring $B_{28}$ | |
| 284 | 1 | 1 | Ph | Ph | H | H | S | H | $A_{12}$ and $X_6$ form a ring $B_{29}$ | |

Specific examples of dyes represented by the following Formula (16) are shown in Table 8 and Table 9, wherein a phenyl group is abbreviated as "Ph". A ring of $X_7$ and a ring (a ring B) formed by $X_7$ with $A_{14}$ is shown below.

TABLE 8

(16)

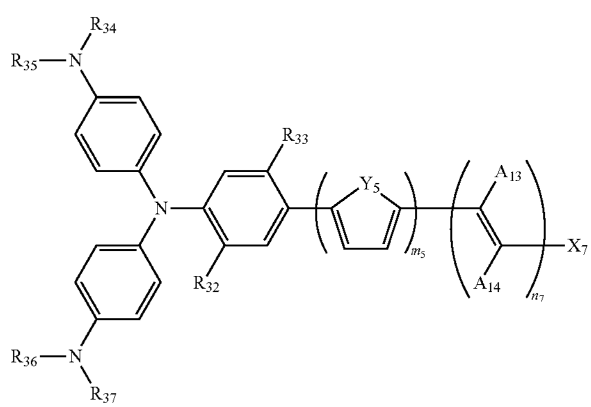

| Compound | $m_5$ | $n_7$ | $R_{32}$ | $R_{33}$ | $R_{34}$ | $R_{35}$ | $R_{36}$ | $R_{37}$ | $Y_5$ | $A_{13}$ | $A_{14}$ | $X_7$ |
|---|---|---|---|---|---|---|---|---|---|---|---|---|
| 285 | 1 | 1 | H | H | H | H | H | H | S | H | H | COOH |
| 286 | 1 | 1 | H | H | H | H | H | H | NH | H | H | COOH |
| 287 | 1 | 1 | H | H | H | H | H | H | $NCH_3$ | H | H | COOH |
| 288 | 1 | 1 | H | H | H | H | H | H | NPh | H | H | COOH |
| 289 | 1 | 1 | H | H | H | H | H | H | S | H | CN | COOH |
| 290 | 1 | 1 | H | H | $CH_3$ | $CH_3$ | $CH_3$ | $CH_3$ | S | H | CN | COOH |
| 291 | 1 | 1 | H | H | $CH_3$ | $CH_3$ | $CH_3$ | $CH_3$ | NH | H | CN | COOH |
| 292 | 1 | 1 | H | H | $CH_3$ | $CH_3$ | $CH_3$ | $CH_3$ | $NCH_3$ | H | CN | COOH |
| 293 | 1 | 1 | H | H | $CH_3$ | $CH_3$ | $CH_3$ | $CH_3$ | NPh | H | CN | COOH |
| 294 | 1 | 1 | H | H | $C_2H_5$ | $C_2H_5$ | $C_2H_5$ | $C_2H_5$ | S | H | CN | COOH |
| 295 | 1 | 1 | H | H | $C_3H_7$ | $C_3H_7$ | $C_3H_7$ | $C_3H_7$ | S | H | $CF_3$ | COOH |
| 296 | 1 | 1 | H | H | $C_4H_9$ | $C_4H_9$ | $C_4H_9$ | $C_4H_9$ | S | H | CN | COOH |
| 297 | 1 | 1 | H | H | $C_8H_{17}$ | $C_8H_{17}$ | $C_8H_{17}$ | $C_8H_{17}$ | S | H | CN | COOH |
| 298 | 1 | 1 | H | H | $C_{18}H_{37}$ | $C_{18}H_{37}$ | $C_{18}H_{37}$ | $C_{18}H_{37}$ | S | H | CN | COOH |

TABLE 8-continued (16)

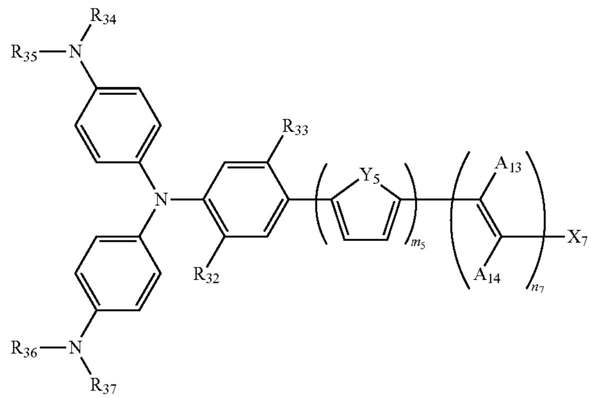

| Compound | $m_5$ | $n_7$ | $R_{32}$ | $R_{33}$ | $R_{34}$ | $R_{35}$ | $R_{36}$ | $R_{37}$ | $Y_5$ | $A_{13}$ | $A_{14}$ | $X_7$ |
|---|---|---|---|---|---|---|---|---|---|---|---|---|
| 299 | 1 | 1 | H | H | Ph | Ph | Ph | Ph | S | H | CN | COOH |
| 300 | 1 | 1 | H | H | $C_2H_5$ | $C_2H_5$ | $C_2H_5$ | $C_2H_5$ | S | $CH_3$ | CN | COOH |
| 301 | 1 | 1 | H | H | $C_2H_5$ | $C_2H_5$ | $C_2H_5$ | $C_2H_5$ | S | F | CN | COOH |
| 302 | 1 | 1 | H | H | $C_2H_5$ | $C_2H_5$ | $C_2H_5$ | $C_2H_5$ | S | Cl | CN | COOH |
| 303 | 1 | 1 | H | H | $C_2H_5$ | $C_2H_5$ | $C_2H_5$ | $C_2H_5$ | S | Br | CN | COOH |
| 304 | 1 | 1 | H | H | $C_2H_5$ | $C_2H_5$ | $C_2H_5$ | $C_2H_5$ | S | I | CN | COOH |
| 305 | 1 | 1 | H | OH | $C_2H_5$ | $C_2H_5$ | $C_2H_5$ | $C_2H_5$ | S | H | CN | COOH |
| 306 | 1 | 1 | $CH_3$ | H | $C_2H_5$ | $C_2H_5$ | $C_2H_5$ | $C_2H_5$ | S | H | CN | COOH |
| 307 | 1 | 1 | $CH_3$ | $OCH_3$ | $C_2H_5$ | $C_2H_5$ | $C_2H_5$ | $C_2H_5$ | S | H | CN | COOH |
| 308 | 1 | 1 | $CH_3$ | $C_8H_{17}$ | $C_2H_5$ | $C_2H_5$ | $C_2H_5$ | $C_2H_5$ | S | H | CN | COOH |
| 309 | 1 | 1 | H | H | $C_2H_5$ | $C_2H_5$ | $C_2H_5$ | $C_2H_5$ | S | H | COOH | COOH |
| 310 | 1 | 1 | H | H | $C_2H_5$ | $C_2H_5$ | $C_2H_5$ | $C_2H_5$ | S | H | COONa | COONa |
| 311 | 1 | 1 | H | H | $C_2H_5$ | $C_2H_5$ | $C_2H_5$ | $C_2H_5$ | S | H | CN | COOLi |
| 312 | 1 | 1 | H | H | $C_2H_5$ | $C_2H_5$ | $C_2H_5$ | $C_2H_5$ | S | H | CN | COONa |
| 313 | 1 | 1 | H | H | $C_2H_5$ | $C_2H_5$ | $C_2H_5$ | $C_2H_5$ | S | H | CN | COOK |
| 314 | 1 | 1 | H | H | $C_2H_5$ | $C_2H_5$ | $C_2H_5$ | $C_2H_5$ | S | H | CN | $PO(OH)_2$ |
| 315 | 1 | 1 | H | H | $C_2H_5$ | $C_2H_5$ | $C_2H_5$ | $C_2H_5$ | S | H | $COCH_3$ | COOH |
| 316 | 1 | 1 | H | H | $C_2H_5$ | $C_2H_5$ | $C_2H_5$ | $C_2H_5$ | S | H | $COCF_3$ | COOH |
| 317 | 1 | 1 | H | H | $C_2H_5$ | $C_2H_5$ | $C_2H_5$ | $C_2H_5$ | S | H | $COCH_2F$ | COOH |
| 318 | 1 | 1 | H | H | $C_2H_5$ | $C_2H_5$ | $C_2H_5$ | $C_2H_5$ | S | H | $COCHF_2$ | COOH |
| 319 | 2 | 1 | H | H | Ph | Ph | Ph | Ph | S | H | H | COOH |
| 320 | 3 | 1 | H | H | Ph | Ph | Ph | Ph | S | H | H | COOH |

TABLE 9

| Compound | $m_5$ | $n_7$ | $R_{32}$ | $R_{33}$ | $R_{34}$ | $R_{35}$ | $R_{36}$ | $R_{37}$ | $Y_5$ | $A_{13}$ | $A_{14}$ | $X_7$ |
|---|---|---|---|---|---|---|---|---|---|---|---|---|
| 321 | 4 | 1 | H | H | Ph | Ph | Ph | Ph | S | H | H | COOH |
| 322 | 5 | 1 | H | H | Ph | Ph | Ph | Ph | S | H | H | COOH |
| 323 | 6 | 1 | H | H | Ph | Ph | Ph | Ph | S | H | H | COOH |
| 324 | 1 | 2 | H | H | Ph | Ph | Ph | Ph | S | H | H | COOH |
| 325 | 1 | 3 | H | H | Ph | Ph | Ph | Ph | S | H | H | COOH |
| 326 | 1 | 4 | H | H | Ph | Ph | Ph | Ph | S | H | H | COOH |
| 327 | 1 | 5 | H | H | Ph | Ph | Ph | Ph | S | H | H | COOH |
| 328 | 1 | 6 | H | H | Ph | Ph | Ph | Ph | S | H | H | COOH |
| 329 | 1 | 1 | H | H | $C_2H_5$ | $C_2H_5$ | $C_2H_5$ | $C_2H_5$ | S | H | CN | Ring $B_1$ |
| 330 | 1 | 1 | H | H | $C_2H_5$ | $C_2H_5$ | $C_2H_5$ | $C_2H_5$ | S | H | CN | Ring $B_2$ |
| 331 | 1 | 1 | H | H | $C_2H_5$ | $C_2H_5$ | $C_2H_5$ | $C_2H_5$ | S | H | CN | Ring $B_3$ |
| 332 | 1 | 1 | H | H | $C_2H_5$ | $C_2H_5$ | $C_2H_5$ | $C_2H_5$ | S | H | CN | Ring $B_4$ |
| 333 | 1 | 1 | H | H | $C_2H_5$ | $C_2H_5$ | $C_2H_5$ | $C_2H_5$ | S | H | CN | Ring $B_5$ |
| 334 | 1 | 1 | H | H | $C_2H_5$ | $C_2H_5$ | $C_2H_5$ | $C_2H_5$ | S | H | CN | Ring $B_6$ |
| 335 | 1 | 1 | H | H | $C_2H_5$ | $C_2H_5$ | $C_2H_5$ | $C_2H_5$ | S | H | CN | Ring $B_7$ |
| 336 | 1 | 1 | H | H | $C_2H_5$ | $C_2H_5$ | $C_2H_5$ | $C_2H_5$ | S | H | CN | Ring $B_8$ |
| 337 | 1 | 1 | H | H | $C_2H_5$ | $C_2H_5$ | $C_2H_5$ | $C_2H_5$ | S | H | CN | Ring $B_9$ |
| 338 | 1 | 1 | H | H | $C_2H_5$ | $C_2H_5$ | $C_2H_5$ | $C_2H_5$ | S | H | CN | Ring $B_{10}$ |
| 339 | 1 | 1 | H | H | $C_2H_5$ | $C_2H_5$ | $C_2H_5$ | $C_2H_5$ | S | H | CN | Ring $B_{11}$ |
| 340 | 1 | 1 | H | H | $C_2H_5$ | $C_2H_5$ | $C_2H_5$ | $C_2H_5$ | S | H | CN | Ring $B_{12}$ |
| 341 | 1 | 1 | H | H | $C_2H_5$ | $C_2H_5$ | $C_2H_5$ | $C_2H_5$ | S | H | CN | Ring $B_{13}$ |
| 342 | 1 | 1 | H | H | $C_2H_5$ | $C_2H_5$ | $C_2H_5$ | $C_2H_5$ | S | H | $A_{14}$ and $X_7$ form a ring $B_{14}$ | |
| 343 | 1 | 1 | H | H | $C_2H_5$ | $C_2H_5$ | $C_2H_5$ | $C_2H_5$ | S | H | $A_{14}$ and $X_7$ form a ring $B_{15}$ | |
| 344 | 1 | 1 | H | H | $C_2H_5$ | $C_2H_5$ | $C_2H_5$ | $C_2H_5$ | S | H | $A_{14}$ and $X_7$ form a ring $B_{16}$ | |
| 345 | 1 | 1 | H | H | $C_2H_5$ | $C_2H_5$ | $C_2H_5$ | $C_2H_5$ | S | H | $A_{14}$ and $X_7$ form a ring $B_{17}$ | |
| 346 | 1 | 1 | H | H | $C_2H_5$ | $C_2H_5$ | $C_2H_5$ | $C_2H_5$ | S | H | $A_{14}$ and $X_7$ form a ring $B_{18}$ | |
| 347 | 1 | 1 | H | H | $C_2H_5$ | $C_2H_5$ | $C_2H_5$ | $C_2H_5$ | S | H | $A_{14}$ and $X_7$ form a ring $B_{19}$ | |

TABLE 9-continued

| Compound | $m_5$ | $n_7$ | $R_{32}$ | $R_{33}$ | $R_{34}$ | $R_{35}$ | $R_{36}$ | $R_{37}$ | $Y_5$ | $A_{13}$ | $A_{14}$ $X_7$ |
|---|---|---|---|---|---|---|---|---|---|---|---|
| 348 | 1 | 1 | H | H | $C_2H_5$ | $C_2H_5$ | $C_2H_5$ | $C_2H_5$ | S | H | $A_{14}$ and $X_7$ form a ring $B_{20}$ |
| 349 | 1 | 1 | H | H | $C_2H_5$ | $C_2H_5$ | $C_2H_5$ | $C_2H_5$ | S | H | $A_{14}$ and $X_7$ form a ring $B_{21}$ |
| 350 | 1 | 1 | H | H | $C_2H_5$ | $C_2H_5$ | $C_2H_5$ | $C_2H_5$ | S | H | $A_{14}$ and $X_7$ form a ring $B_{22}$ |
| 351 | 1 | 1 | H | H | $C_2H_5$ | $C_2H_5$ | $C_2H_5$ | $C_2H_5$ | S | H | $A_{14}$ and $X_7$ form a ring $B_{23}$ |
| 352 | 1 | 1 | H | H | $C_2H_5$ | $C_2H_5$ | $C_2H_5$ | $C_2H_5$ | S | H | $A_{14}$ and $X_7$ form a ring $B_{24}$ |
| 353 | 1 | 1 | H | H | $C_2H_5$ | $C_2H_5$ | $C_2H_5$ | $C_2H_5$ | S | H | $A_{14}$ and $X_7$ form a ring $B_{25}$ |
| 354 | 1 | 1 | H | H | $C_2H_5$ | $C_2H_5$ | $C_2H_5$ | $C_2H_5$ | S | H | $A_{14}$ and $X_7$ form a ring $B_{26}$ |
| 355 | 1 | 1 | H | H | $C_2H_5$ | $C_2H_5$ | $C_2H_5$ | $C_2H_5$ | S | H | $A_{14}$ and $X_7$ form a ring $B_{27}$ |
| 356 | 1 | 1 | H | H | $C_2H_5$ | $C_2H_5$ | $C_2H_5$ | $C_2H_5$ | S | H | $A_{14}$ and $X_7$ form a ring $B_{28}$ |
| 357 | 1 | 1 | H | H | $C_2H_5$ | $C_2H_5$ | $C_2H_5$ | $C_2H_5$ | S | H | $A_{14}$ and $X_7$ form a ring $B_{29}$ |

Specific examples of dyes represented by the following Formula (17) are shown in Table 10 and Table 11, wherein a phenyl group is abbreviated as "Ph". $X_3$ and a ring (a ring B) formed by $X_3$ with $A_8$ is shown below.

TABLE 10

(17)

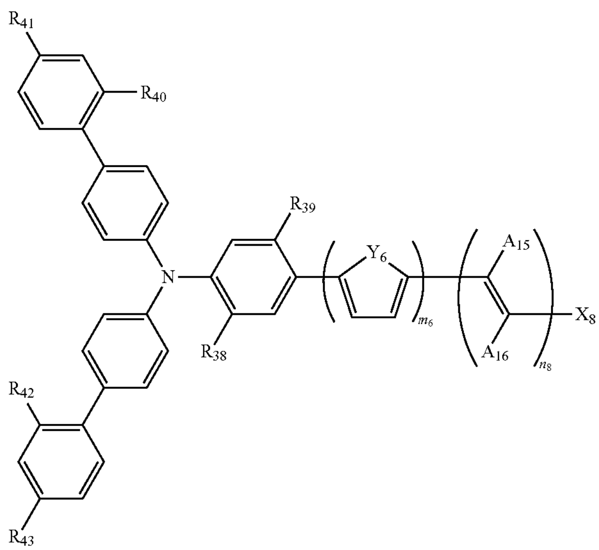

| Compound | $m_6$ | $n_8$ | $R_{38}$ | $R_{39}$ | $R_{40}$ | $R_{41}$ | $R_{42}$ | $R_{43}$ | $Y_6$ | $A_{15}$ | $A_{16}$ | $X_8$ |
|---|---|---|---|---|---|---|---|---|---|---|---|---|
| 358 | 1 | 1 | H | H | H | H | H | H | S | H | H | COOH |
| 359 | 1 | 1 | H | H | H | H | H | H | NH | H | H | COOH |
| 360 | 1 | 1 | H | H | H | H | H | H | $NCH_3$ | H | H | COOH |
| 361 | 1 | 1 | H | H | H | H | H | H | NPh | H | H | COOH |
| 362 | 1 | 1 | H | H | H | H | H | H | S | H | CN | COOH |
| 363 | 1 | 1 | H | H | H | H | H | H | S | H | CN | COOH |
| 364 | 1 | 1 | H | H | $CH_3$ | $CH_3$ | $CH_3$ | $CH_3$ | NH | H | CN | COOH |
| 365 | 1 | 1 | H | H | $CH_3$ | $CH_3$ | $CH_3$ | $CH_3$ | $NCH_3$ | H | CN | COOH |
| 366 | 1 | 1 | H | H | H | $CH_3$ | H | $CH_3$ | S | H | CN | COOH |
| 367 | 1 | 1 | H | H | H | $C_2H_5$ | $H_5$ | $C_2H_5$ | S | H | CN | COOH |
| 368 | 1 | 1 | H | H | H | $C_3H_7$ | H | $C_3H_7$ | S | H | CN | COOH |
| 369 | 1 | 1 | H | H | H | $C_4H_9$ | H | $C_4H_9$ | S | H | CN | COOH |
| 370 | 1 | 1 | H | H | H | $C_8H_{17}$ | H | $C_8H_{17}$ | S | H | CN | COOH |
| 371 | 1 | 1 | H | H | H | $C_{18}H_{37}$ | H | $C_{18}H_{37}$ | S | H | CN | COOH |
| 372 | 1 | 1 | H | H | H | Ph | H | Ph | S | H | CN | COOH |
| 373 | 1 | 1 | H | H | H | $C_2H_5$ | H | $C_2H_5$ | S | $CH_3$ | CN | COOH |
| 374 | 1 | 1 | H | H | H | $C_2H_5$ | H | $C_2H_5$ | S | F | CN | COOH |
| 375 | 1 | 1 | H | H | H | $C_2H_5$ | H | $C_2H_5$ | S | Cl | CN | COOH |
| 376 | 1 | 1 | H | H | H | $C_2H_5$ | H | $C_2H_5$ | S | Br | CN | COOH |
| 377 | 1 | 1 | H | H | H | $C_2H_5$ | H | $C_2H_5$ | S | I | CN | COOH |
| 378 | 1 | 1 | H | OH | H | $C_2H_5$ | H | $C_2H_5$ | S | H | CN | COOH |
| 379 | 1 | 1 | $CH_3$ | H | H | $C_2H_5$ | H | $C_2H_5$ | S | H | CN | COOH |
| 380 | 1 | 1 | $CH_3$ | $OCH_3$ | H | $C_2H_5$ | H | $C_2H_5$ | S | H | CN | COOH |
| 381 | 1 | 1 | $CH_3$ | $C_8H_{17}$ | H | $C_2H_5$ | H | $C_2H_5$ | S | H | CN | COOH |
| 382 | 1 | 1 | H | H | H | $C_2H_5$ | H | $C_2H_5$ | S | H | COOH | COOH |
| 383 | 1 | 1 | H | H | H | $C_2H_5$ | H | $C_2H_5$ | S | H | COONa | COONa |

TABLE 10-continued (17)

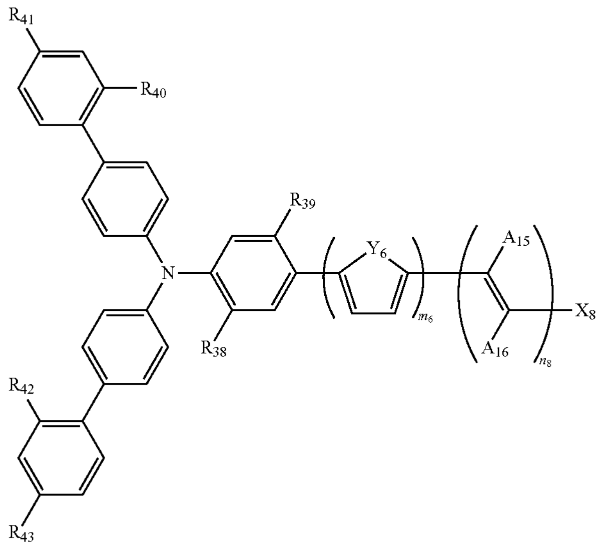

| Compound | $m_6$ | $n_8$ | $R_{38}$ | $R_{39}$ | $R_{40}$ | $R_{41}$ | $R_{42}$ | $R_{43}$ | $Y_6$ | $A_{15}$ | $A_{16}$ | $X_8$ |
|---|---|---|---|---|---|---|---|---|---|---|---|---|
| 384 | 1 | 1 | H | H | H | $C_2H_5$ | H | $C_2H_5$ | S | H | CN | COOLi |
| 385 | 1 | 1 | H | H | H | $C_2H_5$ | H | $C_2H_5$ | S | H | CN | COONa |
| 386 | 1 | 1 | H | H | H | $C_2H_5$ | H | $C_2H_5$ | S | H | CN | COOK |
| 387 | 1 | 1 | H | H | H | $C_2H_5$ | H | $C_2H_5$ | S | H | CN | $PO(OH)_2$ |
| 388 | 1 | 1 | H | H | H | $C_2H_5$ | H | $C_2H_5$ | S | H | $COCH_3$ | COOH |
| 389 | 1 | 1 | H | H | H | $C_2H_5$ | H | $C_2H_5$ | S | H | $COCF_3$ | COOH |
| 390 | 1 | 1 | H | H | H | $C_2H_5$ | H | $C_2H_5$ | S | H | $COCH_2F$ | COOH |
| 391 | 1 | 1 | H | H | H | $C_2H_5$ | H | $C_2H_5$ | S | H | $COCHF_2$ | COOH |
| 392 | 2 | 1 | H | H | H | Ph | H | Ph | S | H | H | COOH |
| 393 | 3 | 1 | H | H | H | Ph | H | Ph | S | H | H | COOH |
| 394 | 4 | 1 | H | H | H | Ph | H | Ph | S | H | H | COOH |

TABLE 11

| Compound | $M_6$ | $n_8$ | $R_{38}$ | $R_{39}$ | $R_{40}$ | $R_{41}$ | $R_{42}$ | $R_{43}$ | $Y_6$ | $A_{15}$ | $A_{16}$ | $X_8$ |
|---|---|---|---|---|---|---|---|---|---|---|---|---|
| 395 | 5 | 1 | H | H | H | Ph | H | Ph | S | H | H | COOH |
| 396 | 6 | 1 | H | H | H | Ph | H | Ph | S | H | H | COOH |
| 397 | 1 | 2 | H | H | H | Ph | H | Ph | S | H | H | COOH |
| 398 | 1 | 3 | H | H | H | Ph | H | Ph | S | H | H | COOH |
| 399 | 1 | 4 | H | H | H | Ph | H | Ph | S | H | H | COOH |
| 400 | 1 | 5 | H | H | H | Ph | H | Ph | S | H | H | COOH |
| 401 | 1 | 6 | H | H | H | Ph | H | Ph | S | H | H | COOH |
| 402 | 1 | 1 | H | H | H | H | H | H | S | H | CN | Ring $B_1$ |
| 403 | 1 | 1 | H | H | H | H | H | H | S | H | CN | Ring $B_2$ |
| 404 | 1 | 1 | H | H | H | H | H | H | S | H | CN | Ring $B_3$ |
| 405 | 1 | 1 | H | H | H | H | H | H | S | H | CN | Ring $B_4$ |
| 406 | 1 | 1 | H | H | H | H | H | H | S | H | CN | Ring $B_5$ |
| 407 | 1 | 1 | H | H | H | H | H | H | S | H | CN | Ring $B_6$ |
| 408 | 1 | 1 | H | H | H | H | H | H | S | H | CN | Ring $B_7$ |
| 409 | 1 | 1 | H | H | H | H | H | H | S | H | CN | Ring $B_8$ |
| 410 | 1 | 1 | H | H | H | H | H | H | S | H | CN | Ring $B_9$ |
| 411 | 1 | 1 | H | H | H | H | H | H | S | H | CN | Ring $B_{10}$ |
| 412 | 1 | 1 | H | H | H | H | H | H | S | H | CN | Ring $B_{11}$ |
| 413 | 1 | 1 | H | H | H | H | H | H | S | H | CN | Ring $B_{12}$ |
| 414 | 1 | 1 | H | H | H | H | H | H | S | H | CN | Ring $B_{13}$ |
| 415 | 1 | 1 | H | H | H | H | H | H | S | H | $A_{16}$ and $X_4$ form a ring $B_{14}$ | |
| 416 | 1 | 1 | H | H | H | H | H | H | S | H | $A_{16}$ and $X_4$ form a ring $B_{15}$ | |
| 417 | 1 | 1 | H | H | H | H | H | H | S | H | $A_{16}$ and $X_4$ form a ring $B_{16}$ | |
| 418 | 1 | 1 | H | H | H | H | H | H | S | H | $A_{16}$ and $X_4$ form a ring $B_{17}$ | |
| 419 | 1 | 1 | H | H | H | H | H | H | S | H | $A_{16}$ and $X_4$ form a ring $B_{18}$ | |
| 420 | 1 | 1 | H | H | H | H | H | H | S | H | $A_{16}$ and $X_4$ form a ring $B_{19}$ | |
| 421 | 1 | 1 | H | H | H | H | H | H | S | H | $A_{16}$ and $X_4$ form a ring $B_{20}$ | |
| 422 | 1 | 1 | H | H | H | H | H | H | S | H | $A_{16}$ and $X_4$ form a ring $B_{21}$ | |
| 423 | 1 | 1 | H | H | H | H | H | H | S | H | $A_{16}$ and $X_4$ form a ring $B_{22}$ | |
| 424 | 1 | 1 | H | H | H | H | H | H | S | H | $A_{16}$ and $X_4$ form a ring $B_{23}$ | |
| 425 | 1 | 1 | H | H | H | H | H | H | S | H | $A_{16}$ and $X_4$ form a ring $B_{24}$ | |

TABLE 11-continued
| Compound | $M_6$ | $n_8$ | $R_{38}$ | $R_{39}$ | $R_{40}$ | $R_{41}$ | $R_{42}$ | $R_{43}$ | $Y_6$ | $A_{15}$ | $A_{16}$ | $X_8$ |
|---|---|---|---|---|---|---|---|---|---|---|---|---|
| 426 | 1 | 1 | H | H | H | H | H | H | S | H | $A_{16}$ and $X_4$ form a ring $B_{25}$ | |
| 427 | 1 | 1 | H | H | H | H | H | H | S | H | $A_{16}$ and $X_4$ form a ring $B_{26}$ | |
| 428 | 1 | 1 | H | H | H | H | H | H | S | H | $A_{16}$ and $X_4$ form a ring $B_{27}$ | |
| 429 | 1 | 1 | H | H | H | H | H | H | S | H | $A_{16}$ and $X_4$ form a ring $B_{28}$ | |
| 430 | 1 | 1 | H | H | H | H | H | H | S | H | $A_{16}$ and $X_4$ form a ring $B_{29}$ | |
Other examples of dyes represented by Formulas (15) to (17) are shown below.
(431)
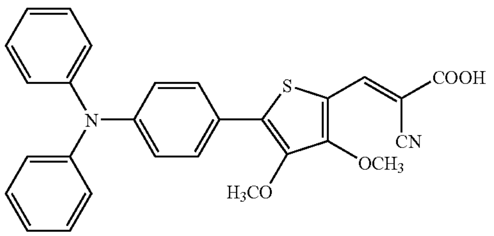
(432)
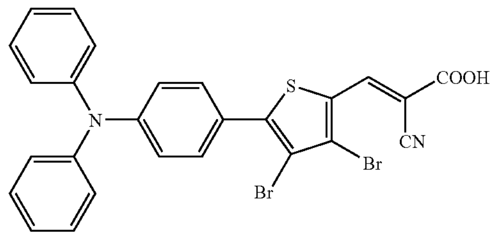
(433)
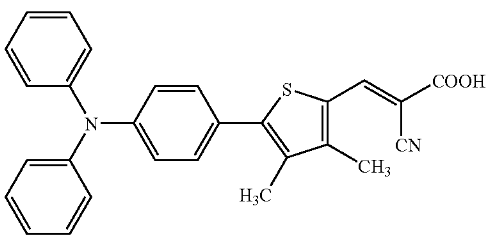
(434)
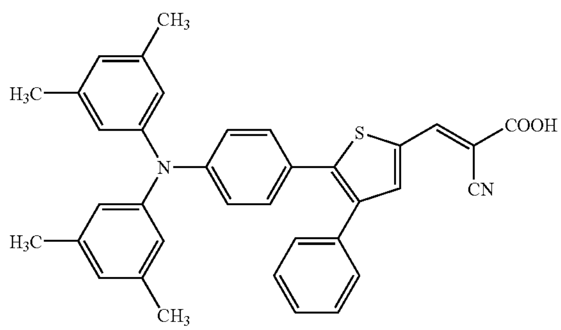
(435)
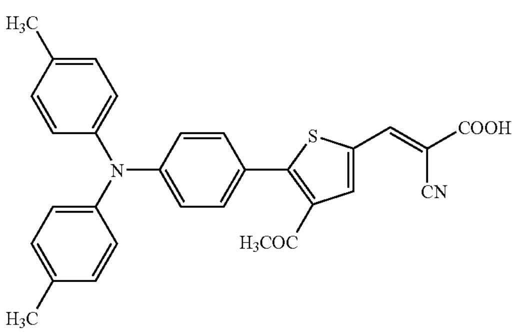
(436)
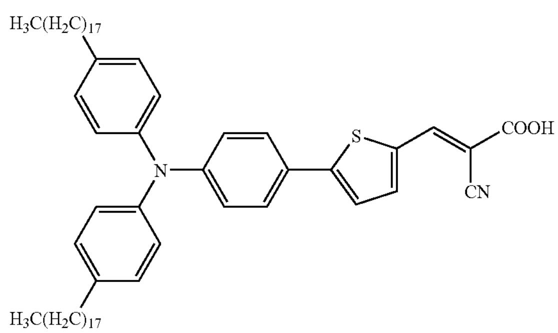
(437)
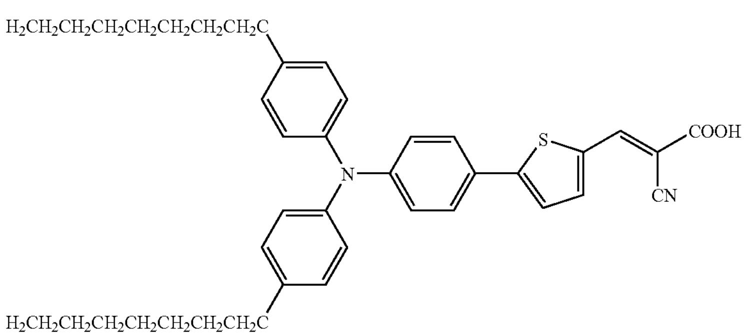

-continued
(438)
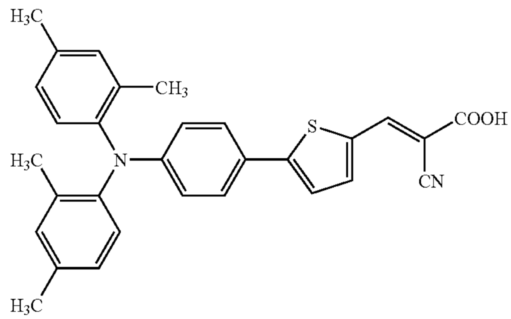
(439)
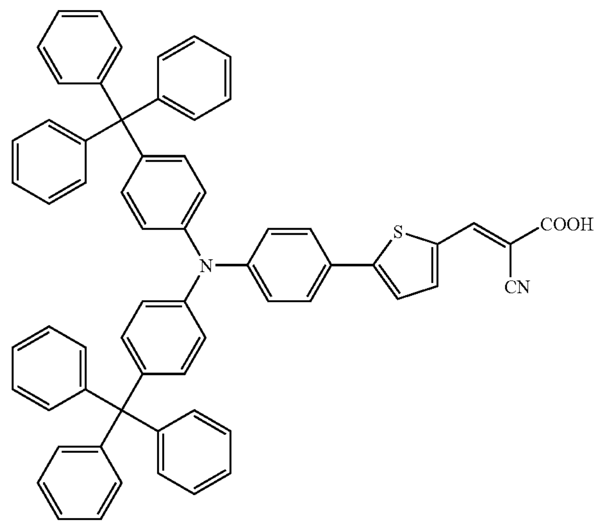
(440)
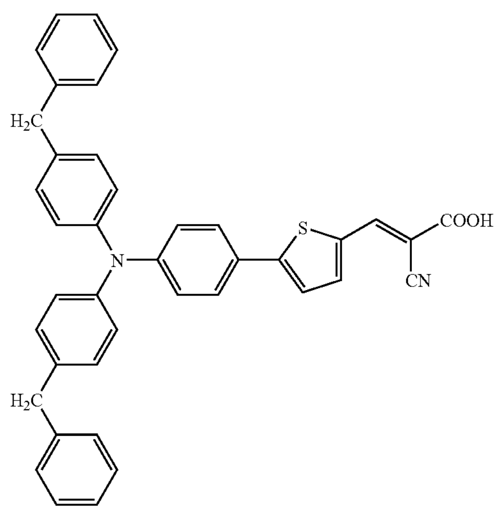
(441)
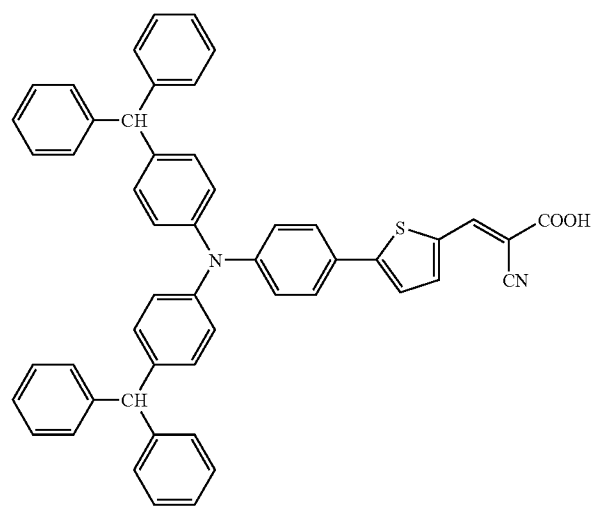
(442)
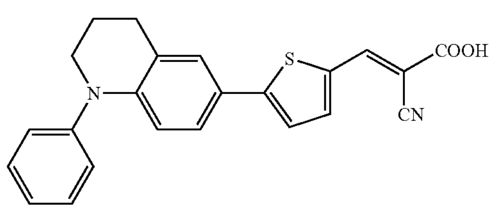
(443)
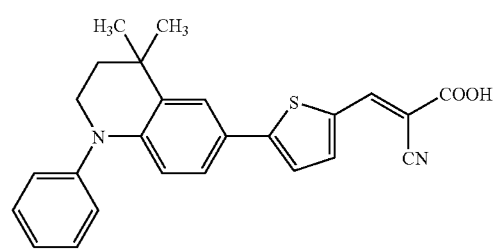
(444)
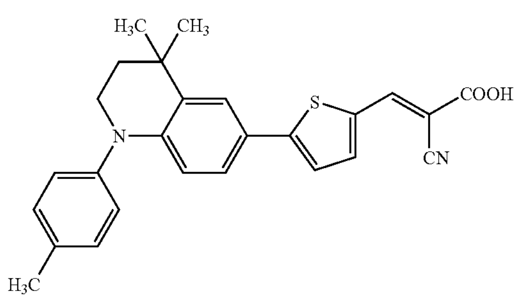
(445)
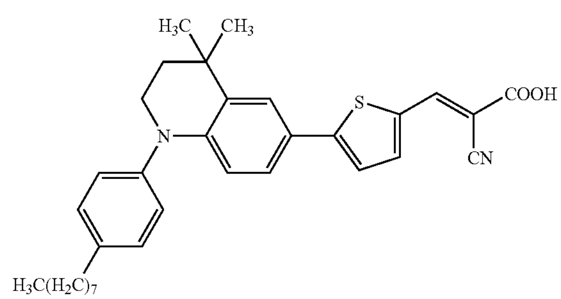

-continued
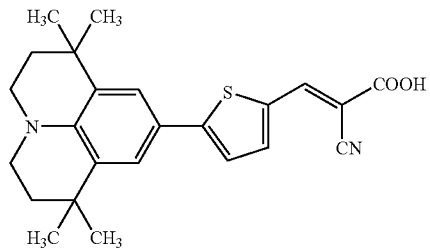
(446)
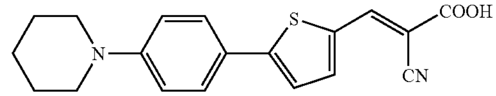
(447)
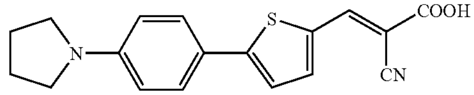
(448)
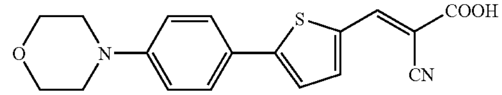
(449)
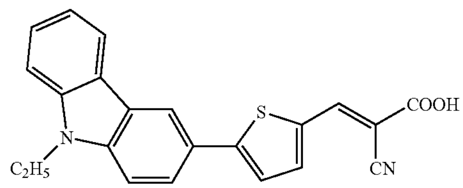
(450)
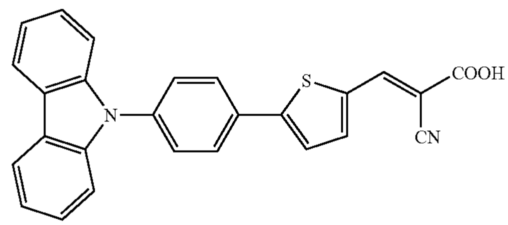
(451)
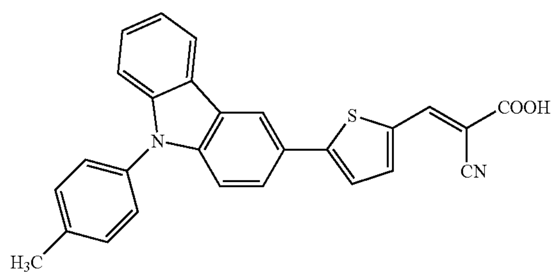
(452)
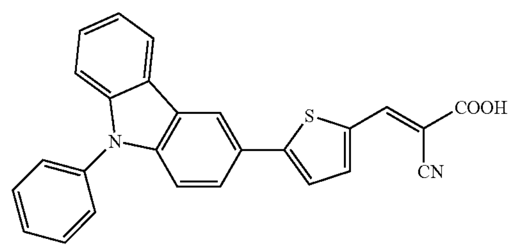
(453)
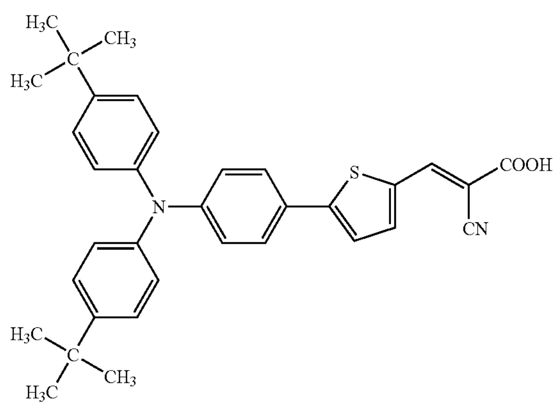
(454)
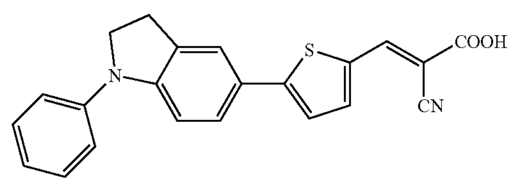
(455)
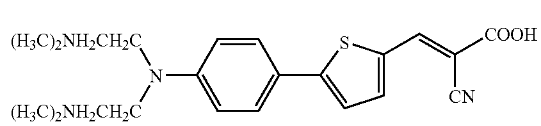
(456)
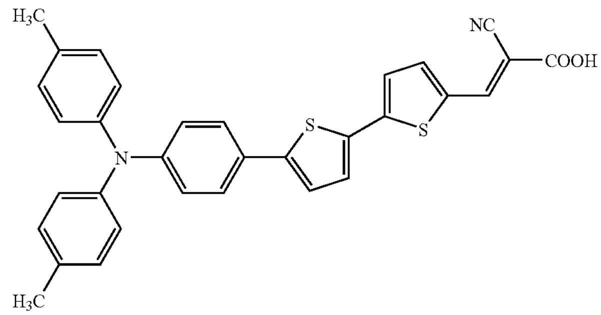
(457)

-continued
(458)
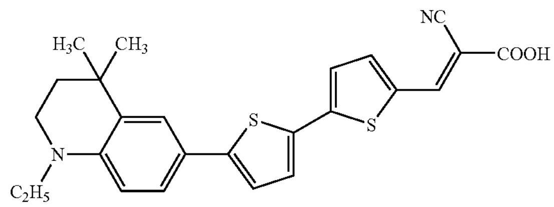
(459)
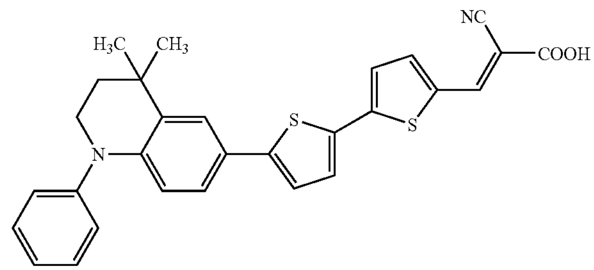
(460)
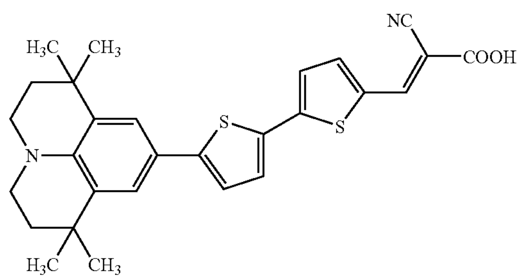
(461)
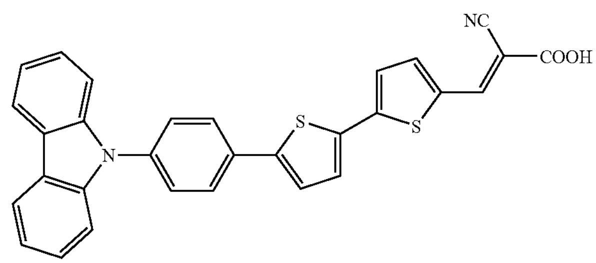
(462)
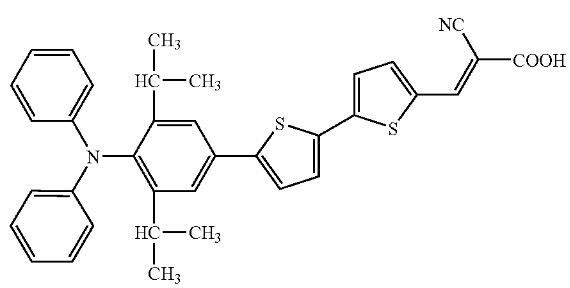
(463)
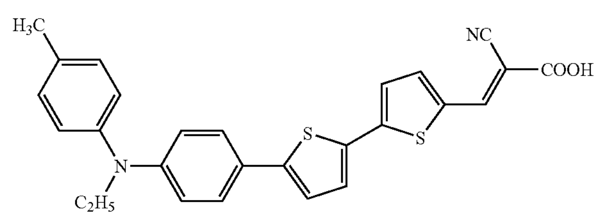
(464)
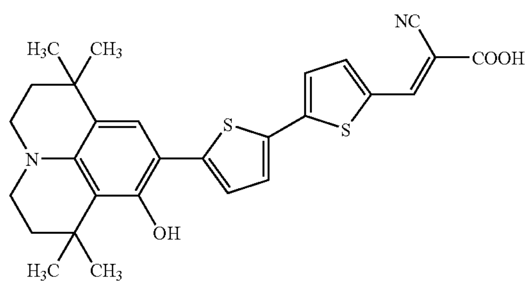
(465)
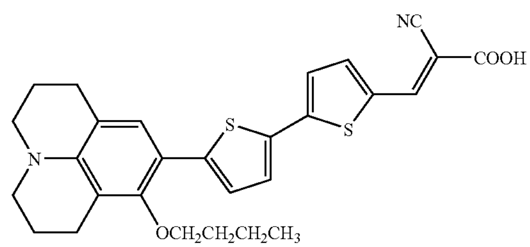
(466)
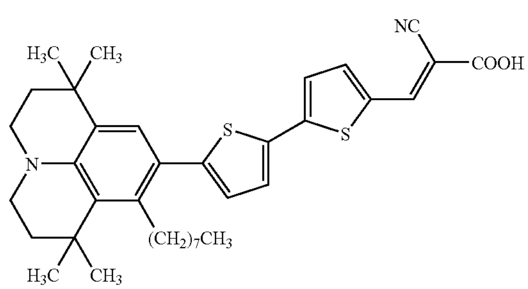
(467)
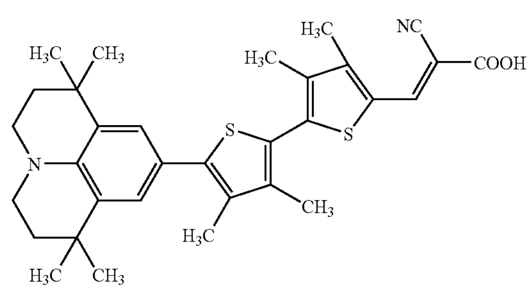

-continued
(468)
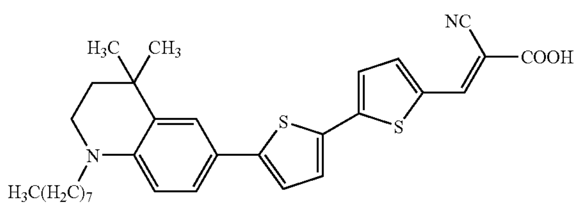
(469)
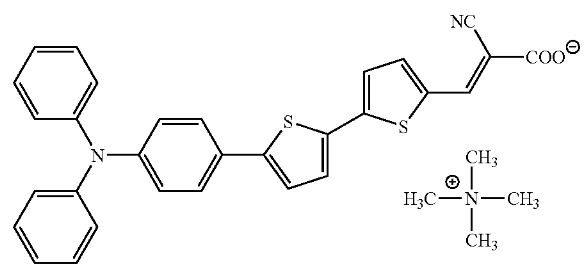
(470)
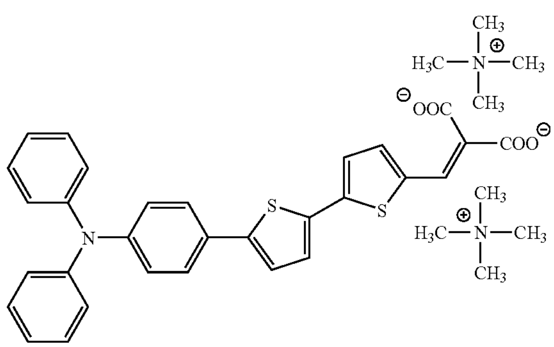
(47I)
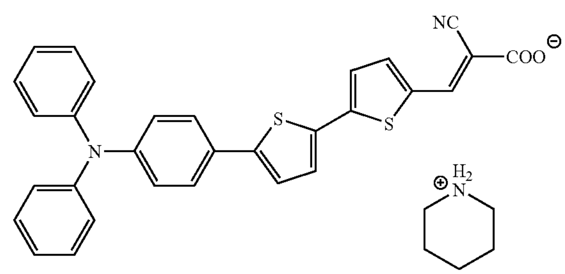
(472)
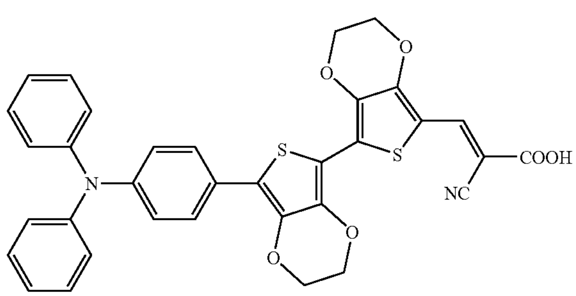
(473)
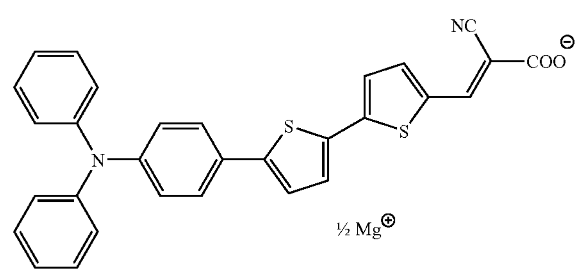
(474)
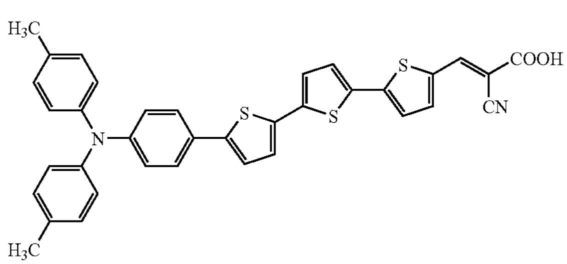
(475)
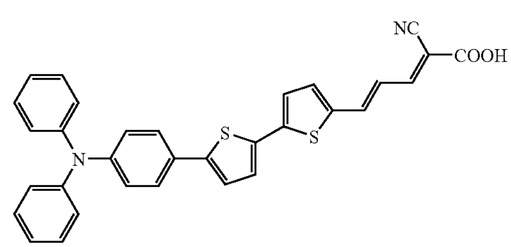
(476)
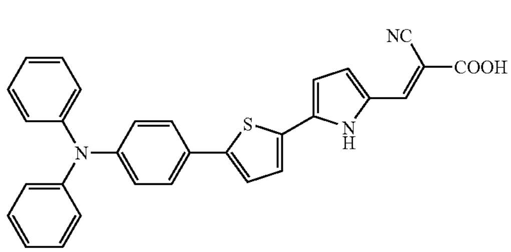
(477)
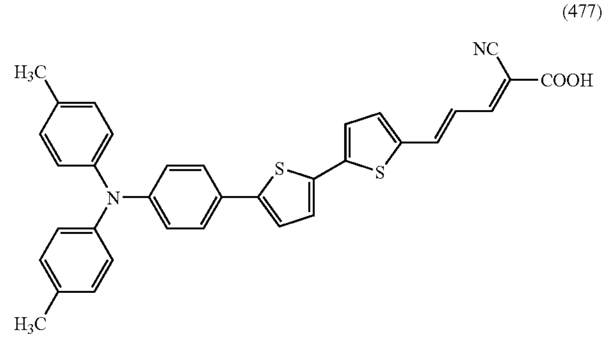

-continued
(478)
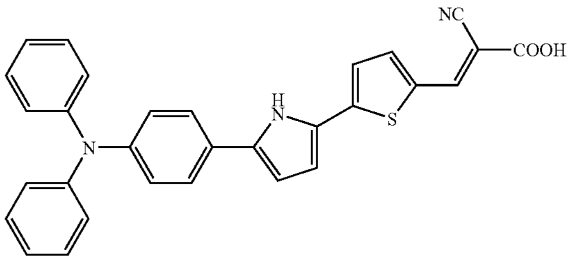
(479)
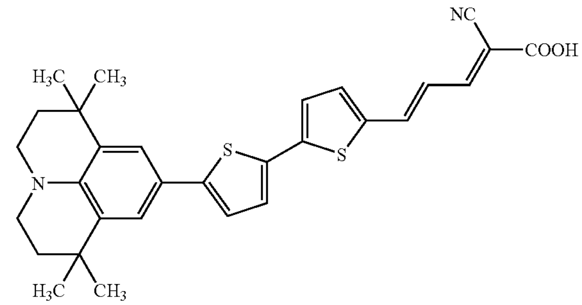
(480)
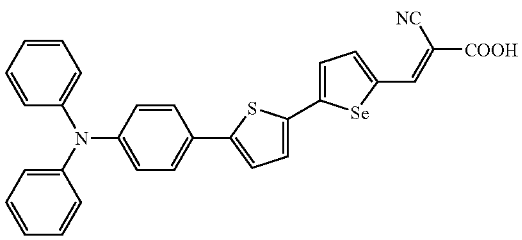
(481)
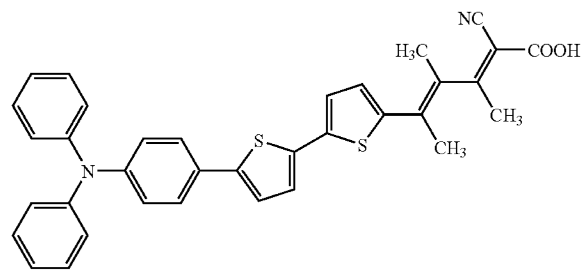
(482)
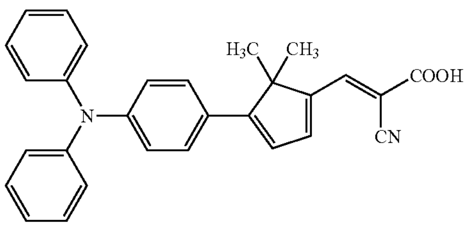
(483)
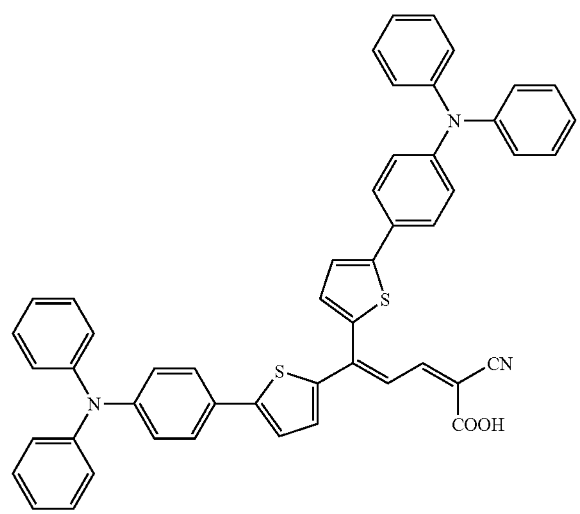
(484)
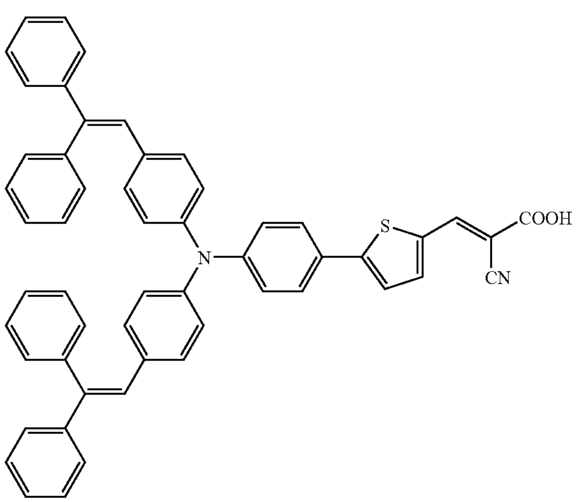
(485)
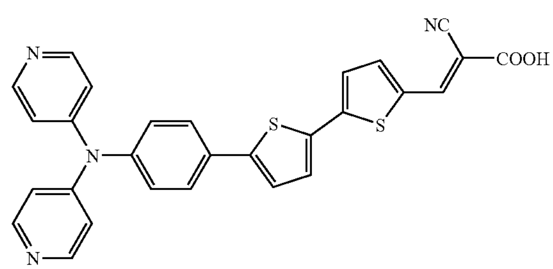

-continued
(486)
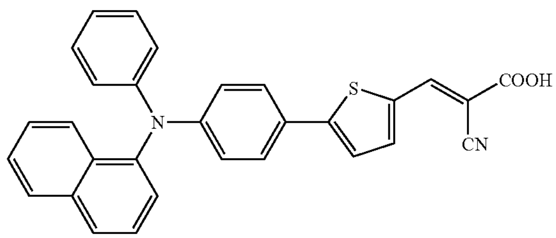
(487)
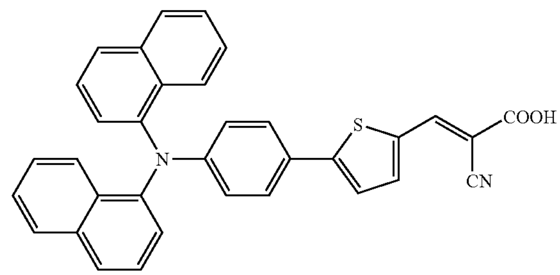
(488)
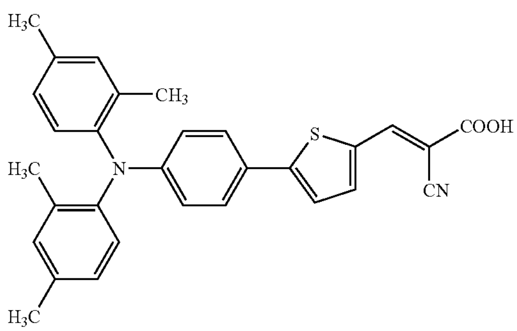
(489)
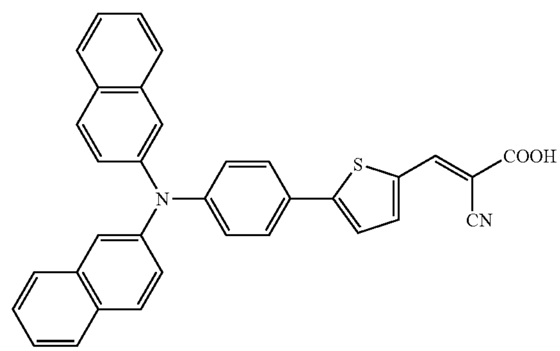
(490)
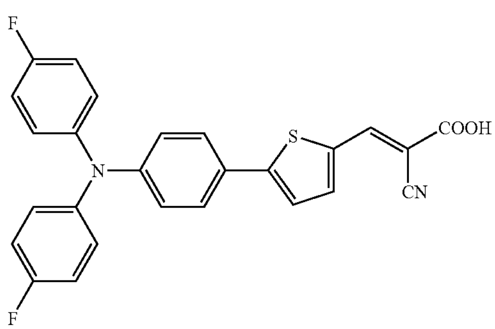
(491)
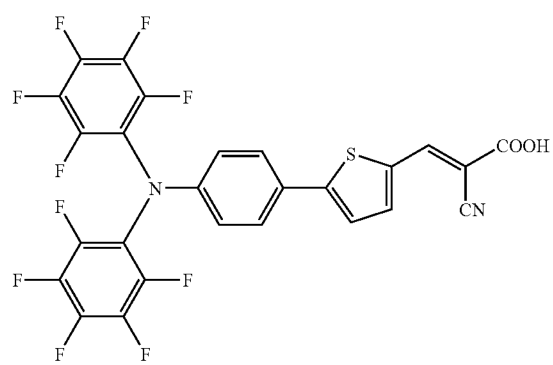
(492)
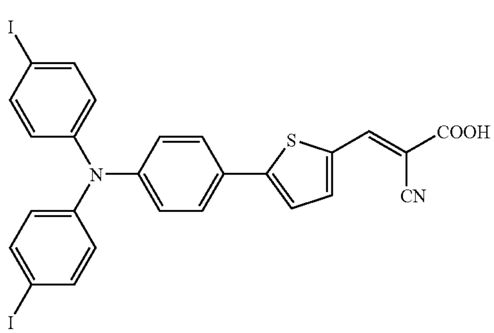
(493)
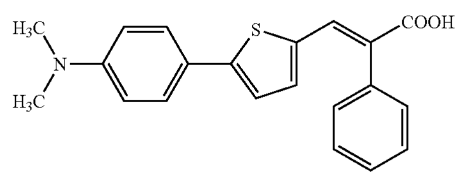
(494)
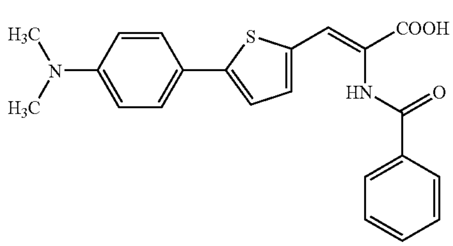
(495)
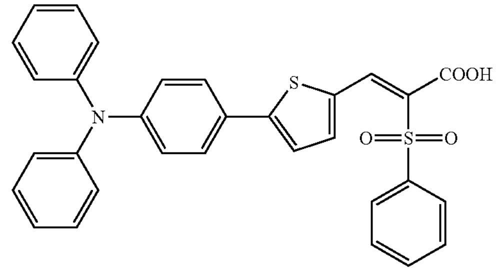

-continued
(496)
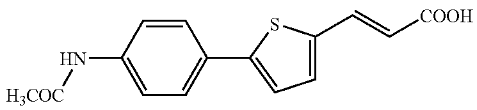
(497)
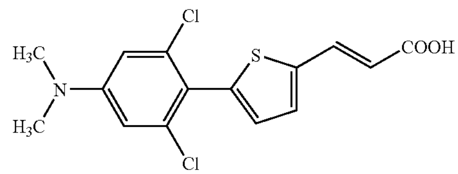
(498)
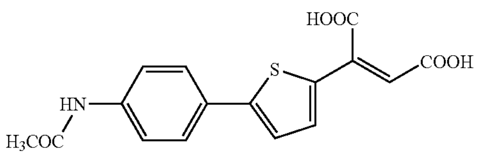
(499)
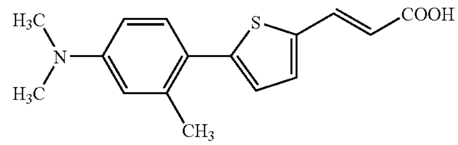
(500)
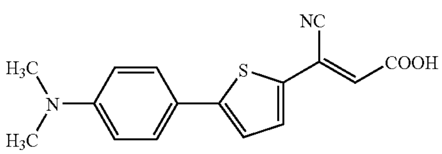
(501)
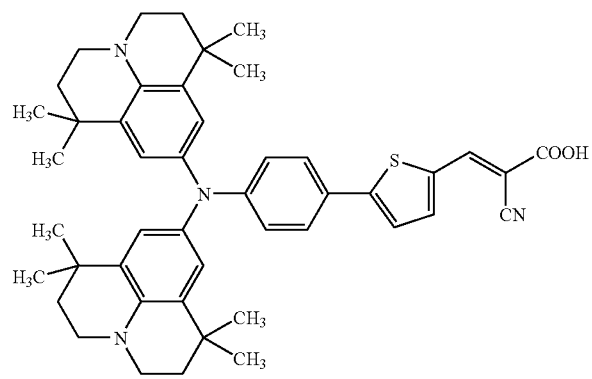
(502)
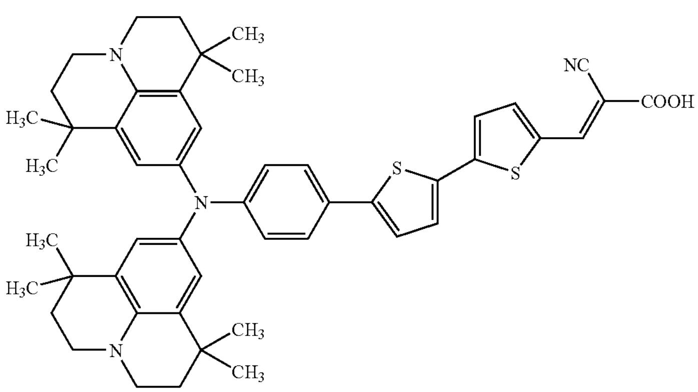
(503)
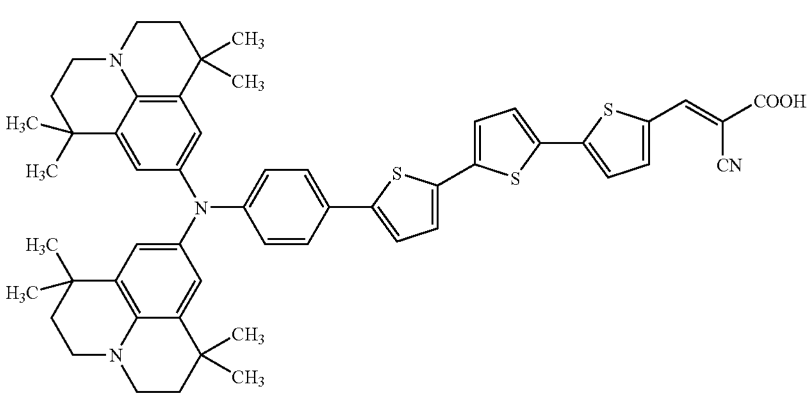

-continued
(504)
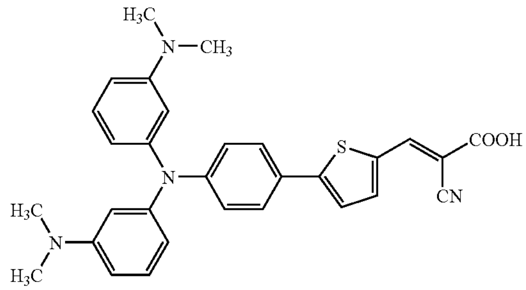
(505)
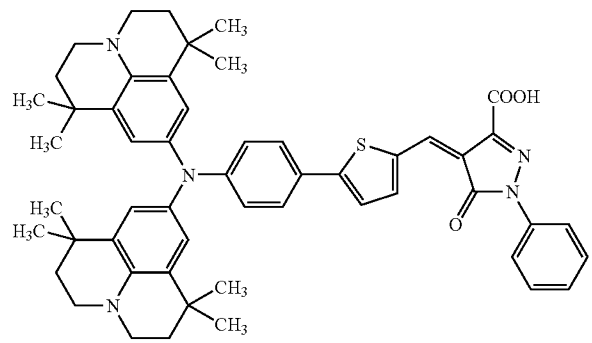
(506)
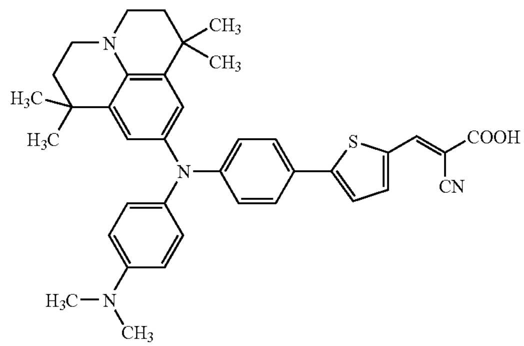
(507)
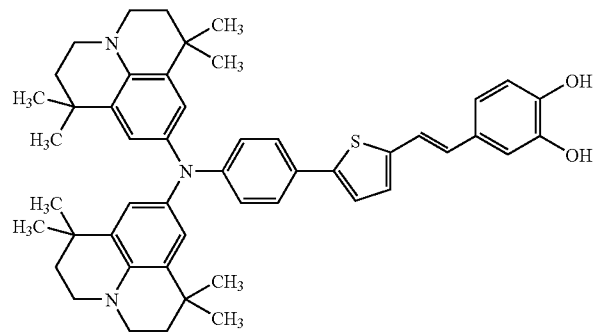
(508)
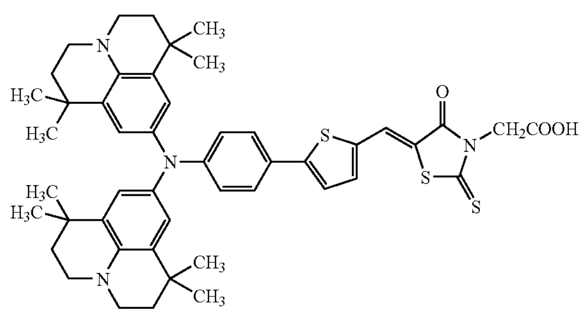
(509)
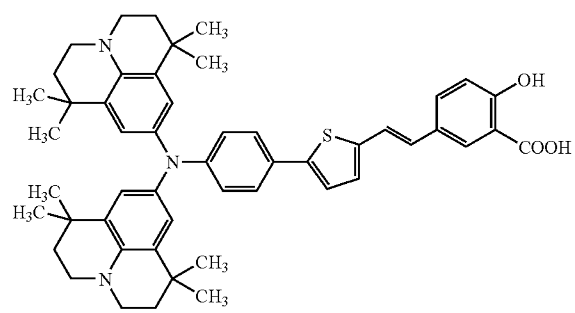
(510)
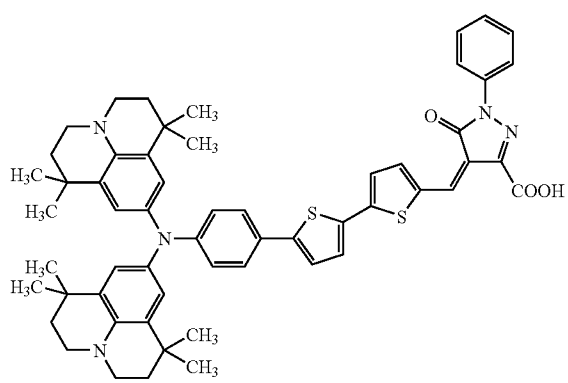
(511)
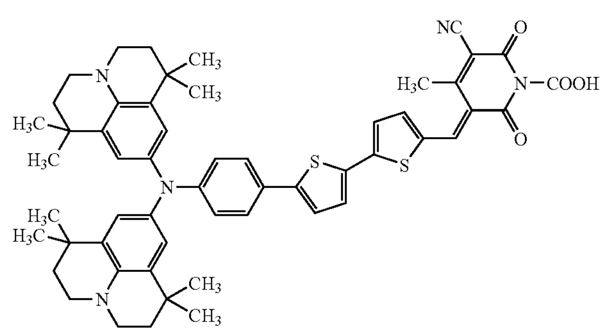

-continued
(512)
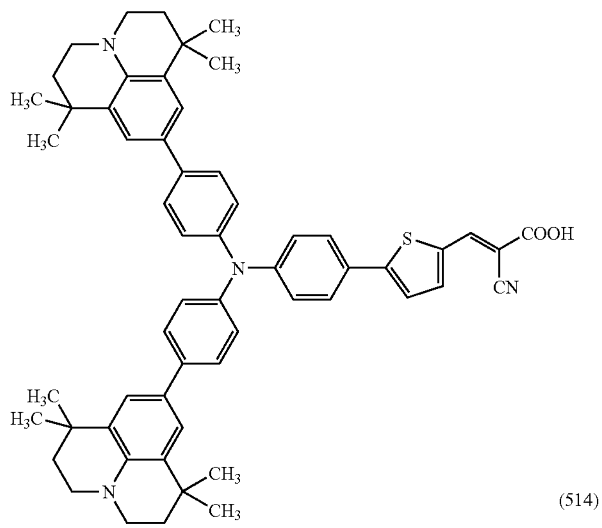
(513)
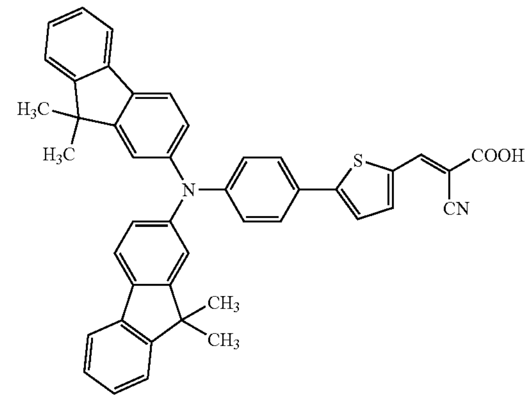
(514)
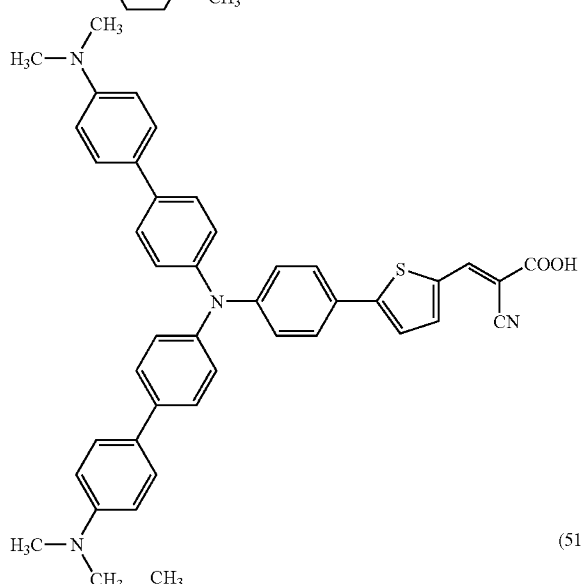
(515)
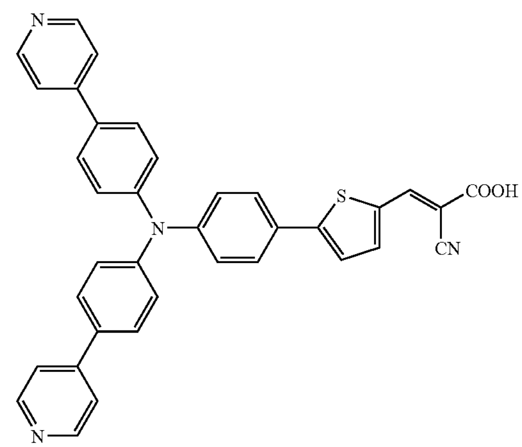
(516)
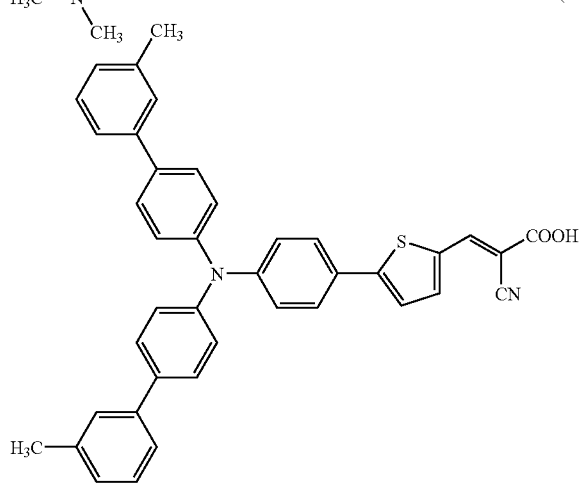
(517)
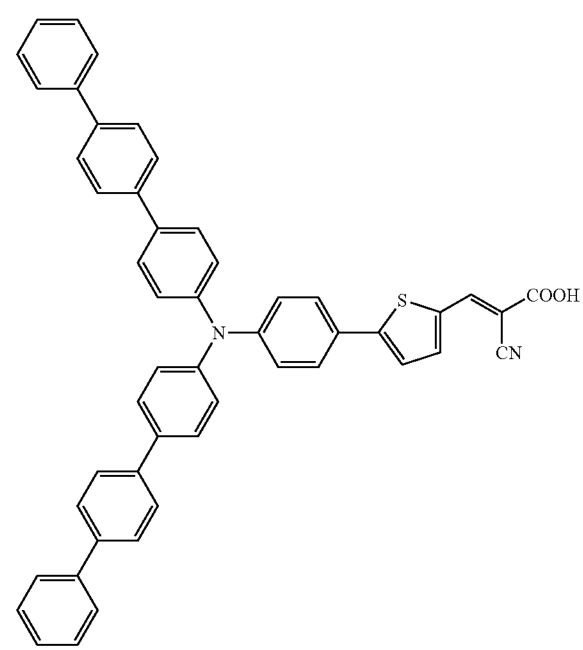

-continued
(518)
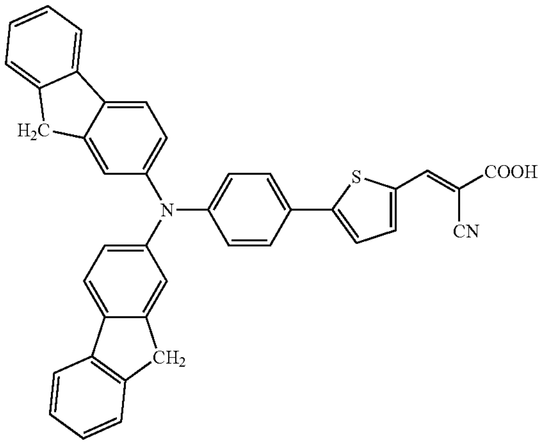
(519)
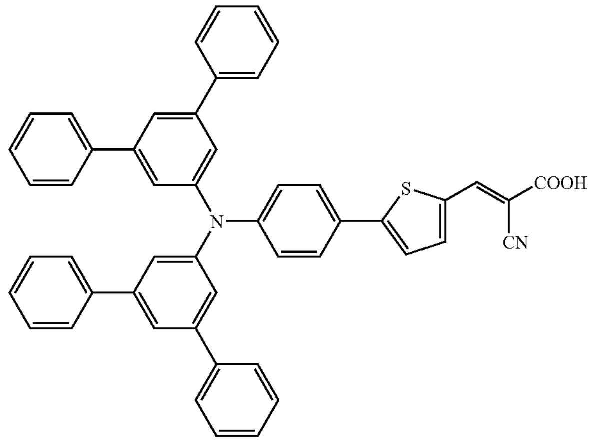
(520)
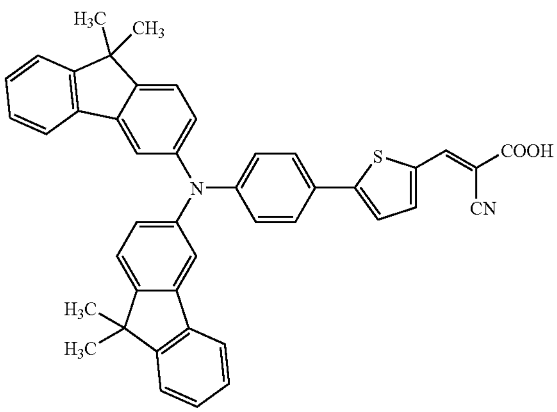
(521)
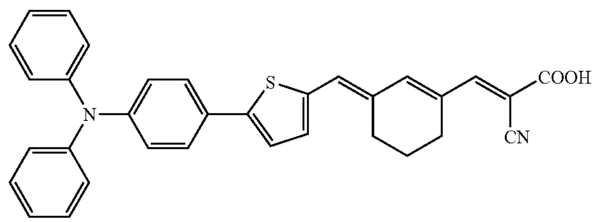
(522)
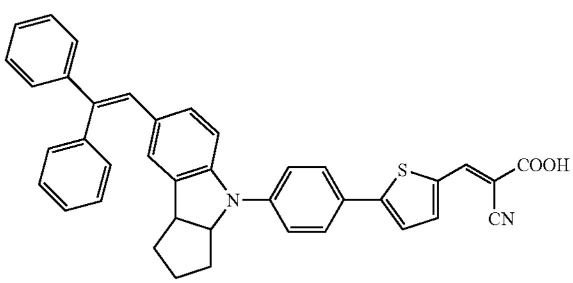
(523)
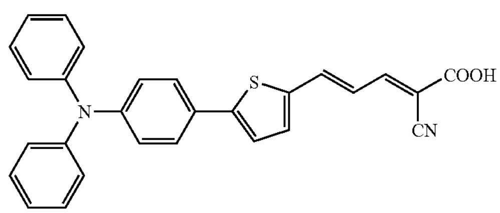
(524)
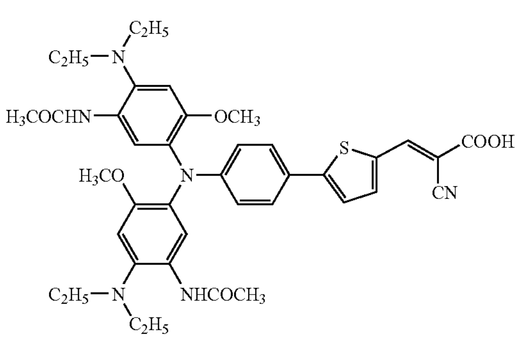
(525)
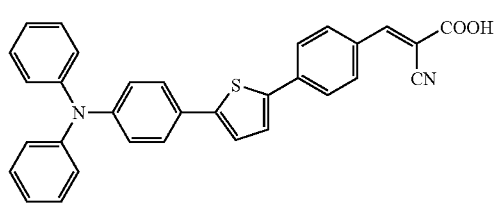

-continued
(526)
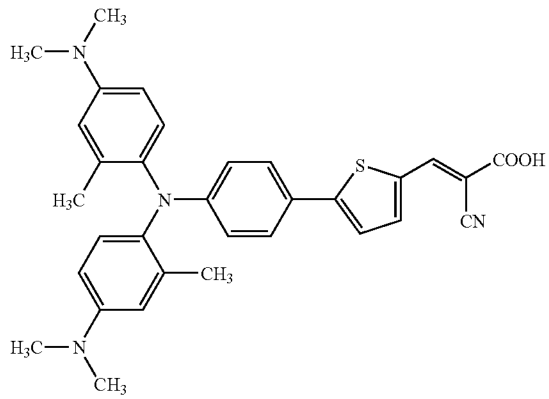
(527)
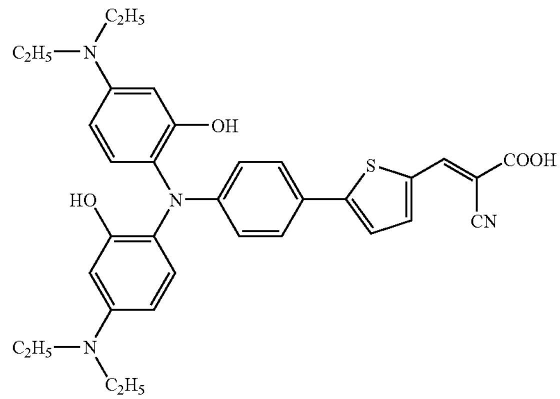
(528)
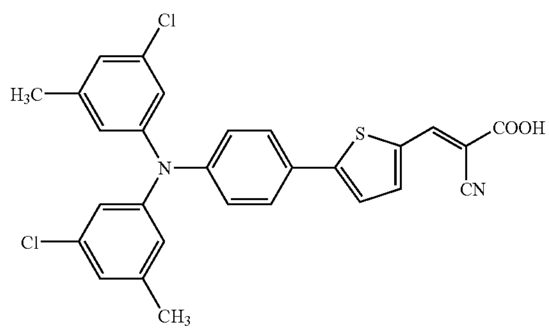
(529)
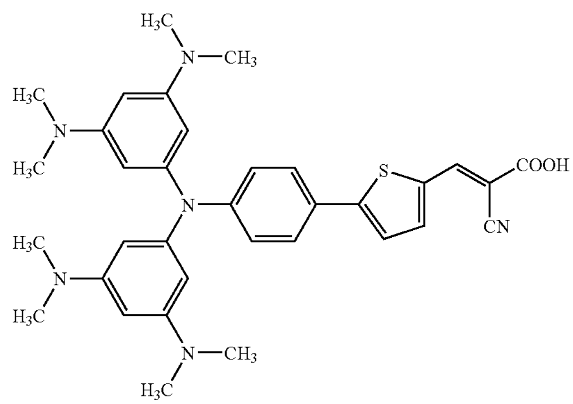
(530)
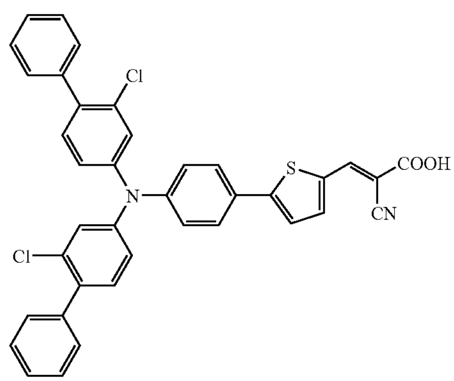
(530)
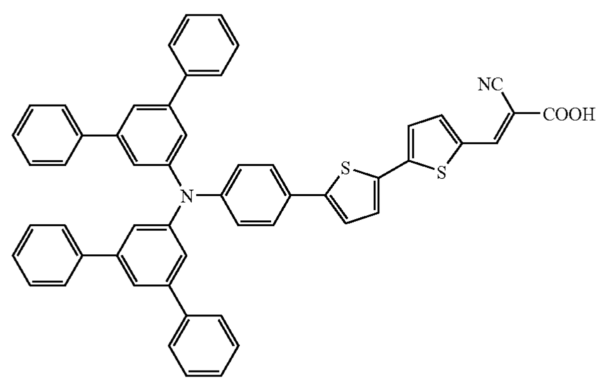
Structures of rings B are shown belo
B$_1$
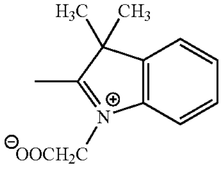
-continued
B$_2$
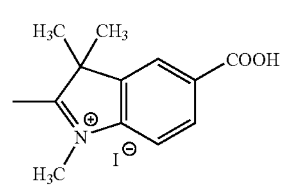
B$_3$
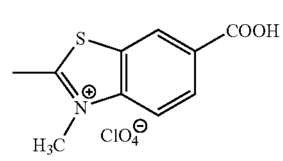

-continued
$B_4$
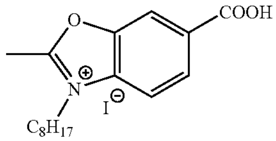
$B_5$
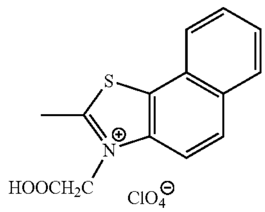
$B_6$
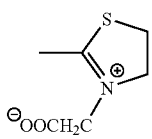
$B_7$
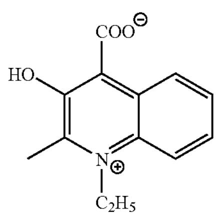
$B_8$
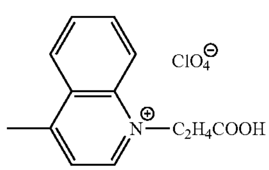
$B_9$
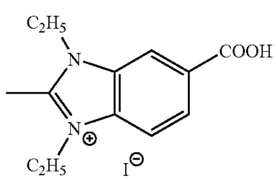
$B_{10}$
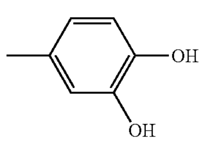
$B_{11}$
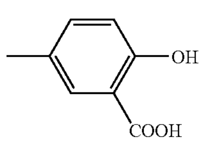
$B_{12}$
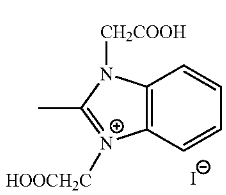
-continued
$B_{13}$
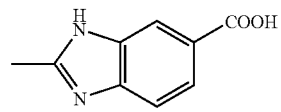
$B_{14}$
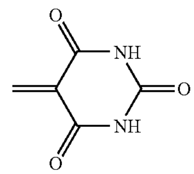
$B_{15}$
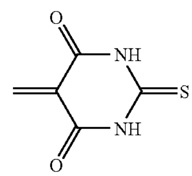
$B_{16}$
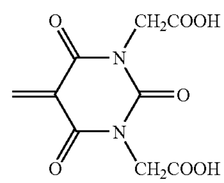
$B_{17}$
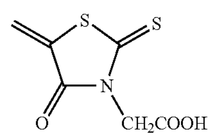
$B_{18}$
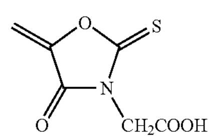
$B_{19}$
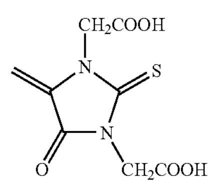
$B_{20}$
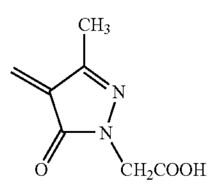
$B_{21}$
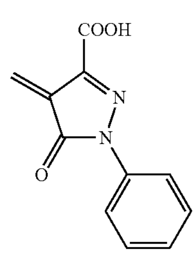

-continued

B22

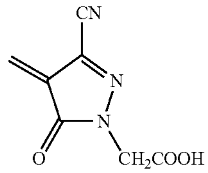

B23

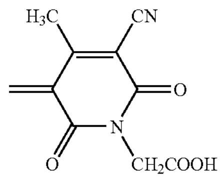

B24

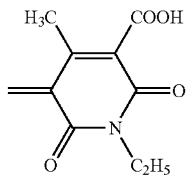

B25

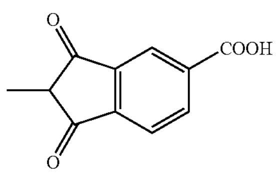

B26

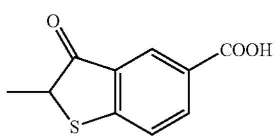

B27

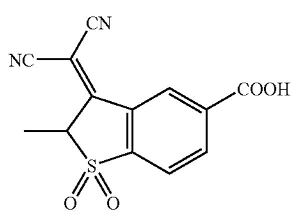

B28

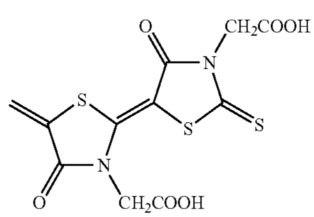

B29

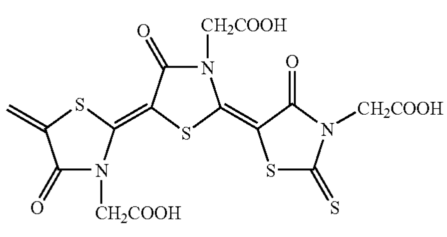

A dye-sensitized photoelectric conversion device of the present invention is made by subjecting fine oxide semiconductor particles to carry a dye represented by Formula (1). In a preferred embodiment, a dye-sensitized photoelectric conversion device of the present invention is made by producing a thin film of an oxide semiconductor on a substrate using fine oxide semiconductor particles, followed by subjecting this film to carrying a dye represented by Formula (1).

A substrate for making thin film of an oxide semiconductor thereon, in the present invention, preferably has electric conductivity at the surface, and such a substrate is easily available on the market. Specifically, for example, such one as has a thin film of an electric conductive metal oxide such as tin oxide doped with indium, fluorine or antimony, or of a metal such as copper, silver and gold, which are formed on the surface of glass or transparent polymeric materials such as polyethylene terephthalate and polyether sulfone can be used. Electric conductivity thereof is usually not higher than 1000Ω and particularly preferably not higher than 100Ω.

As fine oxide semiconductor particles, a metal oxide is preferable, including specifically an oxide of such as titanium, tin, zinc, tungsten, zirconium, gallium, indium, yttrium, niobium, tantalum and vanadium. Among these, oxides of titanium, tin, zinc, niobium, indium, and the like are preferable and titanium oxide, zinc oxide and tin oxide are most preferable among them. These oxide semiconductors can be used alone or also by mixing thereof or coating of the semiconductor surface. Average particle diameter of fine oxide semiconductor particles is usually 1 to 500 nm, preferably 1 to 100 nm. These fine oxide semiconductor particles can also be used by mixing or making a multilayer of those with large particle diameter and those with small particle diameter.

A thin film of an oxide semiconductor can be produced by a method for forming a thin film on a substrate by spraying of fine oxide semiconductor particles; a method for electrical deposition of a thin film of fine semiconductor particles on a substrate as an electrode; and a method for hydrolysis of slurry of fine semiconductor particles or precursors of fine semiconductor particles such as semiconductor alkoxide to obtain paste containing fine particles, followed by coating on a substrate, drying, hardening or firing. A method for using slurry is preferable in view of performance of an oxide semiconductor electrode. In this method, slurry is obtained by dispersing secondary agglomerated fine oxide semiconductor particles in a dispersing medium by a common method so as to obtain average primary particle diameter of 1 to 200 nm.

Any dispersing medium to disperse slurry may be used as long as it can disperse fine semiconductor particles, and water, alcohols such as ethanol, ketones such as acetone and acetylacetone, and hydrocarbons such as hexane are used. They may be used as a mixture and use of water is preferable in view of suppressing viscosity change of slurry. Also to stabilize dispersion state of fine oxide semiconductor particles, a dispersion stabilizer can be used. A typical example of the dispersion stabilizer includes, for example, an acid such as acetic acid, hydrochloric acid and nitric acid; and acetylacetone, acrylic acid, polyethylene glycol, polyvinyl alcohol, etc.

A substrate coated with slurry may be fired and firing temperature is usually not lower than 100° C., preferably not lower than 200° C., and upper limit thereof is not higher than about melting point (softening point) of a substrate, usually 900° C., preferably not higher than 600° C. That is, firing time in the present invention is not especially limited, and, it is preferably within about 4 hours. Thickness of a thin film on a substrate is usually 1 to 200 μm, preferably 1 to 50μm. When firing is carried out, a thin film of fine oxide semiconductor particles is partially melt welded but such melt welding is not any obstacle to the present invention.

A thin film of an oxide semiconductor may be subjected to secondary treatment, that is, by directly dipping the thin film along with a substrate in a solution of an alkoxide, a chloride, a nitrate, a sulfate, and the like of the same metal as a semiconductor, followed by drying or re-firing, performance of a semiconductor thin film can be enhanced. The metal alkoxide includes such as titanium ethoxide, titanium isopropoxide, titanium tert-butoxide and n-dibutyl-diacetyl tin, and an alcohol solution thereof is used. The chloride includes, such as titanium tetrachloride, tin tetrachloride and zinc dichloride, and an aqueous solution thereof is used. Thus obtained oxide semiconductor thin film is consisted of fine oxide semiconductor particles.

Then, a method for subjecting fine oxide semiconductor particles formed in thin film state to carrying a dye is explained. A method for carrying a methine dye represented by Formula (1) includes a method for dipping a substrate formed with the above oxide semiconductor thin film in a solution obtained by dissolving said dye in a good solvent or, a dispersing liquid obtained by dispersing the dye when the dye has low solubility. Concentration in a solution or dispersion liquid is determined by a dye, as appropriate. Into such a solution, a semiconductor thin film formed on a substrate is dipped. Dipping time is from about room temperature to boiling point of the solvent, and dipping time is from 1 minute to about 48 hours. A typical example of a solvent used to dissolve a dye includes methanol, ethanol, acetonitrile, dimethylsulfoxide, dimethylformamide, acetone, t-butanol, etc. Concentration of a dye in a solution is usually $1\times10^{-6}$ M to 1 M, preferably $1\times10^{-5}$ M to $1\times10^{-1}$ M. In such conditions, a photoelectric conversion device of the present invention, containing thin film state fine oxide semiconductor particles sensitized with a dye can be obtained.

A methine dye represented by Formula (1) to be carried may be one kind or a mixture of several kinds. The mixture may be prepared using various dyes of the present invention themselves or with other dyes or metal complex dyes. In particular, by mixing dyes with different absorption wavelength, wide absorption wavelength can be utilized and thus a solar cell with high conversion efficiency can be obtained. Examples of metal complex dyes to be mixed are not especially limited, and, include preferably a ruthenium complex shown in M. K. Nazeeruddin, A. Kay, I. Rodicio, R. Humphry-Baker, E. Muller, P. Liska, N. Vlachopoulos, M. Graetzel, J. Am. Chem. Soc., vol.115, 6382 (1993) or a quaternary salt thereof, phthalocyanine and porphyrin. An organic dye used as a mixture includes phthalocyanine which contains no metal, porphyrin and cyanine, merocyanine, oxonol, triphenylmethane type, a methine type such as acrylic acid dye disclosed in WO 2002011213, a xanthene type, an azo type, an anthraquinone type, and a perylene type. Preferably, a ruthenium complex, merocyanine or a methine dye such as acrylic acid dye, and the like are included. When two or more kinds of dyes are used, these dyes may be adsorbed sequentially on a semiconductor thin film or adsorbed after mixing and dissolving them.

Mixing ratio of these dyes is not limited and optimally selected depending on each of the dyes and is preferably from equal molar ratio to preferably not less than about 10% by mole by one dye generally. When a dye is subjected to adsorption on fine oxide semiconductor particles using a solution mixed of or dispersed with various dyes, total concentration of the dyes in the solution may be similar to one in carrying only one kind. As a solvent when dyes are used in mixture, such a solvent as described above can be used and the solvents for each dye to be used may be the same or different.

When a dye is carried on a thin film of fine oxide semiconductor particles, to prevent aggregation of dyes themselves, it is effective to carry the dyes in the presence of an inclusion compound. In this case, the inclusion compound includes a steroid type compound such as cholic acid, crown ether, cyclodextrin, calixarene and polyethylene oxide, and preferably includes cholic acid derivatives such as deoxycholic acid, dehydrodeoxycholic acid, chenodeoxycholic acid, cholic acid methyl ester and cholic acid sodium salts; polyethylene oxide, etc. After the carrying of a dye, the surface of a semiconductor electrode may be treated with an amine compound such as 4-tert-butylpyridine or a compound having an acidic group such as acetic acid, propionic acid, etc. A method for treatment includes, for example, a method for dipping a substrate, formed with a thin film of fine semiconductor particles carrying a dye, in an ethanol solution of an amine.

A solar cell of the present invention is composed of an electrode (cathode) of a photoelectric conversion device, that is the above fine oxide semiconductor particles carrying a dye, a counter electrode (anode), a redox electrolyte or a positive hole transportation material or a p-type semiconductor, and the like. Morphology of a redox electrolyte or a positive hole transportation material or a p-type semiconductor, and the like includes liquid, solidified substance (gel or gel-like substance), solid, and the like. The liquid-like morphology includes a solution of a redox electrolyte, a molten salt, a positive hole transportation material, a p-type semiconductor, and the like in a solvent, a molten salt at normal temperature, and the like. The solidified substance morphology (gel or gel-like substance) includes those containing these in polymer matrix or a low molecular weight gelling agent, and the like. As the solid morphology, a redox electrolyte, a molten salt, a positive hole transportation material, a p-type semiconductor, and the like can be used. The positive hole transporting material includes amine derivatives; electric conductive polymers such as polyacetylene, polyaniline and polythiophene; and discotic liquid crystals such as a triphenylene type compound. The p-type semiconductor includes CuI, CuSCN, and the like. As the counter electrode, such one is preferable as has electric conductivity and acts catalytically for reduction reaction of the redox electrolyte and such one can be used as glass or a polymer film on which platinum, carbon, rhodium, ruthenium, and the like are vapor depositioned or fine conductive particles are coated.

The redox electrolyte used as a solar cell of the present invention includes a halogen-type redox electrolyte comprising a halogen compound having a halogen ion as a counter ion and a halogen molecule; a metal redox-type electrolyte of a metal complex such as a ferrocyanide-ferricyanide salt or a ferrocene-ferricinium ion and a cobalt complex; an organic redox-type electrolyte such as an alkyl thiol-alkyl disulfide, a viologen dye, hydroquinone-quinone, and a halogen-type redox electrolyte is preferable. In the halogen-type redox electrolyte comprising a halogen compound and a halogen molecule, a halogen molecule includes such as an iodine molecule and a bromine molecule, and an iodine molecule is preferable. The halogen compound having a halogen ion as a counter ion includes, for example, a salt of a metal halide such as LiI, NaI, KI, CsI, $CaI_2$, $MgI_2$ and CuI or an organic quaternary ammonium salt such as tetraalkylammonium iodide, imidazolium iodide and pyridinium iodide, and a salt having an iodide ion as a counter ion is preferable. Salts having an iodide ion as a counter ion include, for example, lithium iodide, sodium iodide and trimethylammonium iodide.

When the redox electrolyte takes a solution form containing it, an electrochemically inert solvent is used including, for example, acetonitrile, propylene carbonate, ethylene carbonate, 3-methoxypropionitrile, methoxyacetonitrile, ethylene glycol, propylene glycol, diethylene glycol, triethylene glycol, γ-butyrolactone, dimethoxyethane, diethyl carbonate, diethyl ether, dimethyl carbonate, 1,2-dimethoxyethane, dimethylformamide, dimethylsulfoxide, 1,3-dioxolan, methyl formate, 2-methyltetrahydrofuran, 3-methoxy-oxazolidine-2-one, sulpholane, tetrahydrofuran and water, and among them, such as acetonitrile, propylene carbonate, ethylene carbonate, 3-methoxypropionitrile, methoxyacetonitrile, ethylene glycol, 3-methoxy-oxazolidine-2-one and γ-butyrolactone are particularly preferable. These solvents may be used alone or in combination of two or more kinds. The gel-like redox electrolyte includes matrix such as an oligomer, a polymer, and the like containing the electrolyte or an electrolyte solution; a low molecular weight gelling agent described in W. Kubo, K. Murakoshi, T. Kitamura, K. Hanabusa, H. Shirai and S. Yanagida, Chem. Lett., p.1241 (1998), and the like, similarly containing the electrolyte or an electrolyte solution; and the like. Concentration of the redox electrolyte is usually 0.01 to 99% by weight, preferably 0.1 to 90% by weight.

A solar cell of the present invention is composed of a photoelectric conversion device (cathode) carrying a dye on fine oxide semiconductor particles on a substrate and a counter electrode (anode) placed opposing to the cathode, and can be prepared by filling a solution containing the redox electrolyte between them.

EXAMPLES

The present invention is explained in more detail in reference to the following Examples, however, the scope of the present invention should not be limited thereto. In Examples, “parts” means “mass parts” unless otherwise specified. Absorption spectra, nuclear magnetic resonance spectra and luminescence spectra were measured using a UV-visible ray spectrometer (JASCO V-570 from JASCO), a nuclear magnetic resonance measurement instrument (Gemini 300 from Varian Inc.) and a spectrofluorometer (JASCO FP-6600 from JASCO), respectively.

Example 1

One part of the following compound (532) and 0.45 parts of methyl cyanoacetate were dissolved in 10 parts of ethanol, followed by the addition of 0.05 parts of anhydrous piperazine thereto. After reaction under reflux for 2 hours, the reaction liquid was cooled to obtain a solid, which was filtered, washed and dried. This solid was reacted in 20 parts of ethanol in the presence of 1 part of potassium hydroxide under reflux for 2 hours. To the reaction solution was added 50 parts of water, followed by neutralization with hydrochloric acid and filtering orange crystal deposited, which was washed with water and further re-crystallized in ethanol to obtain 0.71 g of a compound (197) as orange brown crystal.

λmax (EtOH: 435 nm)

$^1$H-NMR (PPM: d6-DMSO): 2.97(s.$CH_3$.6H), 6.77 (d.arom.2H), 7.42(d.thio.1H), 7.56(d.arom.2H), 7.66 (d.thio.1H), 8.08(s.—CH═.1H)

(532)

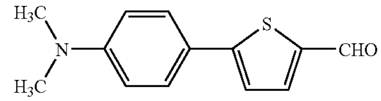

Example 2

By similar treatment as in Synthesis Example 1 except that one part of the compound (532) was changed to 1.6 parts of the following compound (533), 0.98 g of a compound (205) was obtained as orange brown crystal.

λmax (EtOH: 431 nm)

$^1$H-NMR(PPM:d6-DMSO): 6.98(d.arom.2H), 7.12 (m.arom.6H), 7.37(m.arom.4H), 7.64(d.thio.1H), 7.69 (d.arom.2H), 8.00(d.thio.1H),8.47(s.—CH═.1H)

(533)

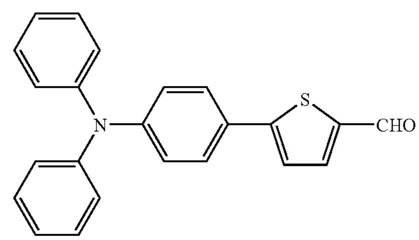

Example 3

By similar treatment as in Synthesis Example 1 except that one part of the compound (532) was changed to 1.7 parts of the following compound (534), 1.23 g of a compound (523) was obtained as brown crystal.

λmax (EtOH: 457 nm)

$^1$H-NMR (PPM: d6-DMSO): 6.98(d.arom.2H), 7.01-7.20 (m.(arom.6H+—CH═.1H)), 7.27-7.44(m.(arom.4H+—CH═.1H)), 7.64(d.thio.1H), 7.68(d.arom.2H), 7.99 (d.thio.1H), 8.47(s.—CH═.1H)

(534)

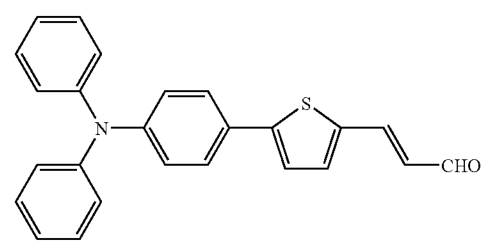

Example 4

By similar treatment as in Synthesis Example 1 except that one part of the compound (532) was changed to 1.9 parts of the following compound (535), 1.40 g of a compound (246) was obtained as brown crystal.

λmax (EtOH: 460 nm), the maximum luminescence (EtOH: 621 nm)

$^1$H-NMR (PPM: d6-DMSO): 6.97(d.arom.2H), 7.08 (m.arom.6H), 7.35(m.arom.4H), 7.49(d.thio.1H), 7.58

(d.thio.1H), 7.62(d.thio.1H), 7.62(d.arom.2H), 7.94 (d.thio.1H), 8.43(s.—CH═.1H)

(535)

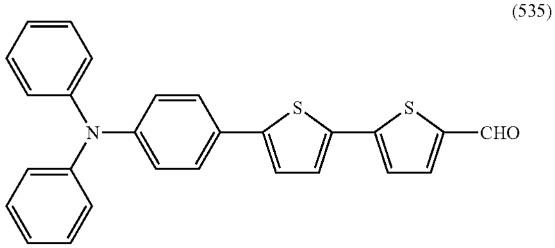

Example 5

One part of the compound (533) and 0.83 parts of rhodanine-3-acetic acid were dissolved in 10 parts of ethanol, followed by reaction under reflux for 2 hours. The reaction liquid was cooled to obtain a solid, which was filtered, washed, dried and further re-crystallized in ethanol to obtain 1.54 g of a compound (272) as brown crystal.

λmax (EtOH: 476 nm)

$^1$H-NMR (PPM: d6-DMSO): 4.71(s.$CH_2$.2H), 6.97 (d.arom.2H), 7.12(m.arom.6H), 7.36(m.arom.4H), 7.66 (d.thio.1H), 7.72(d.arom.2H), 7.82(d.thio.1H),8.16(s.—CH═.1H)

Example 6

By similar treatment as in Synthesis Example 1 except that one part of the compound (532) was changed to 1.7 parts of the following compound (536), 1.23 g of a compound (14) was obtained as brown crystal.

λmax (EtOH: 422 nm)

(536)

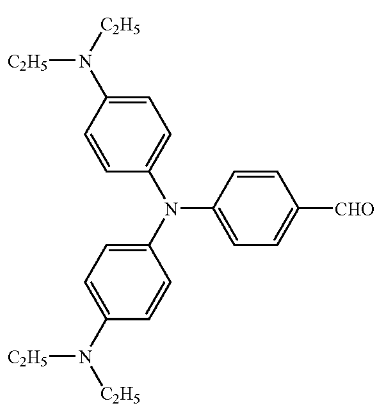

Example 7

By similar treatment as in Synthesis Example 1 except that one part of the compound (532) was changed to 1.9 parts of the following compound (537), 1.23 g of a compound (91) was obtained as brown crystal.

λmax (EtOH: 451 nm)

(537)

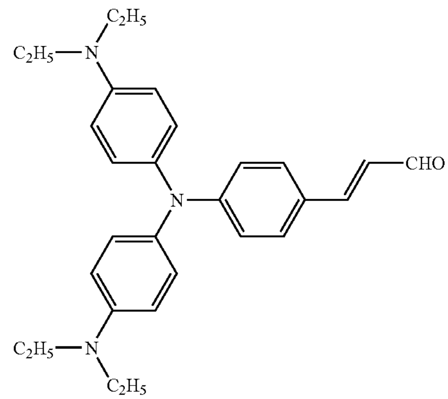

Example 8

By similar treatment as in Synthesis Example 1 except that one part of the compound (532) was changed to 1.7 parts of the following compound (538), 1.23 g of a compound (108) was obtained as brown crystal.

λmax (EtOH: 417 nm)

$^1$H-NMR (PPM: d6-DMSO): 7.04(d.arom.2H), 7.17-7.41 (m.arom.7H), 7.48(m.rom.4H), 7.66-7.78(m.arom.7H), 7.98 (d.arom.2H), 8.17(s.—CH═.1H)

(538)

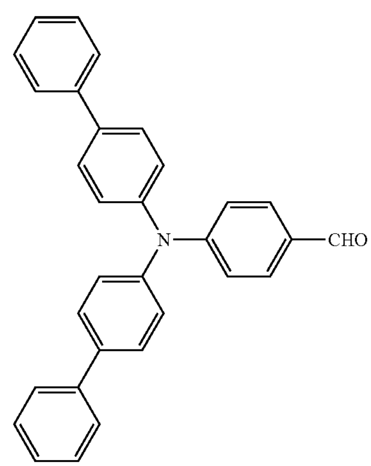

Example 9

A dye was dissolved in EtOH in concentration of $3.2\times10^{-4}$M. In this solution was dipped a porous substrate (a semiconductor thin film electrode obtained by sintering porous titanium oxide on transparent, electric conductive glass electrode at 450° C. for 30 minutes) at room temperature for from 3 hours to over night to carry a dye, followed by washing with a solvent and drying to obtain a photoelectric conversion device of a semiconductor thin film sensitized with a dye. In Examples 19 and 20, each concentration of two kinds of dyes in an EtOH solution was adjusted to be $1.6\times10^{-4}$ M to similarly obtain a photoelectric conversion device by carrying two kinds of dyes. In Examples 16, 19 and 20, an aqueous solution of 0.2 M of titanium tetrachloride was added dropwise onto thin film part of titanium oxide of a thin film semiconductor electrode, followed by standing still at room temperature for 24 hours, washing with water and firing again at 450° C. for 30 minutes to similarly carry a dye using a thin film semiconductor electrode treated with titanium tetrachloride. Further in Example 15, on carrying a dye on a semiconductor thin film, cholic acid was added as an inclusion compound in $3\times10^{-2}$ M to prepare the above dye solution to obtain a cholic acid-treated dye-sensitized semiconductor thin film. Electric conductive glass sputtered with platinum at the surface was fixed so as to sandwich this, and into clearance thereof, a solution containing an electrolyte was poured. The electrolyte solution was used by dissolving iodine/lithiumiodine/1,2-dimethyl-3-n-propylimidazol iumodide/t-butylpyridine into 3-methoxypropionitrile in 0.1M/0.1M/0.6M/1M, respectively.

Effective area of a cell to be measured was 0.25 $cm^2$. As a light source, a 500 W xenon lamp was used so that 100 $mW/cm^2$ could be obtained through AM (air mass) 1.5 filter. Short-circuit current, release voltage and conversion efficiency were measured using a potentio-galvanostat.

TABLE 12

| Example | Organic dye | Short-circuit current ($mA/cm^2$) | Release votage (V) | Conversion efficiency (%) | Treatment of thin film with $TiCl_4$ | Presence of cholic acid |
|---|---|---|---|---|---|---|
| 9 | 14 | 9.2 | 0.67 | 4.3 | non-treated | absent |
| 10 | 91 | 10.0 | 0.65 | 4.6 | non-treated | absent |
| 11 | 108 | 8.7 | 0.69 | 4.3 | non-treated | absent |
| 12 | 197 | 8.6 | 0.66 | 4.0 | non-treated | absent |
| 13 | 205 | 9.4 | 0.68 | 4.5 | non-treated | absent |
| 14 | 246 | 9.8 | 0.67 | 4.6 | non-treated | absent |
| 15 | 246 | 11.8 | 0.67 | 5.6 | non-treated | present |
| 16 | 246 | 13.5 | 0.67 | 6.5 | treated | absent |
| 17 | 272 | 8.6 | 0.64 | 3.8 | non-treated | absent |
| 18 | 523 | 8.9 | 0.67 | 4.2 | non-treated | absent |
| 19 | 14 + 108 | 10.1 | 0.67 | 4.9 | treated | absent |
| 20 | 246 + 523 | 13.9 | 0.66 | 6.6 | treated | absent |

As is clear from Table 12, by using a photoelectric conversion device sensitized with a methine dye represented by Formula (1), visible ray can effectively be converted to electricity.

Industrial Applicability

In a dye-sensitized photoelectric conversion device of the present invention, by using a dye with specified partial structure, a solar cell with high conversion efficiency and high stability could be provided. Furthermore, by using fine oxide semiconductor particles sensitized with two or more kinds of dyes used in combination, enhancement of conversion efficiency could be observed.

The invention claimed is:

1. A photoelectric conversion device, comprising fine oxide semiconductor particles sensitized with a methine dye represented by Formula (1):

(1)

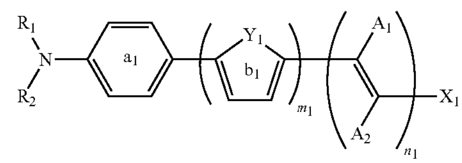

(in Formula (1), each of $R_1$ and $R_2$ represents a hydrogen atom, an optionally substituted aromatic residual group, an optionally substituted aliphatic hydrocarbon residual group or an acyl group, provided that $R_1$ and $R_2$ may form an optionally substituted ring, by bonding with each other or with a benzene ring $a_1$; $m_1$ is an integer of 0 to 7; $n_1$ is an integer of 1 to 7; $X_1$ represents a carboxyl group; each of $A_1$ and $A_2$ represents independently an optionally substituted aromatic residual group, a hydroxyl group, a phosphate group, a cyano group, a hydrogen atom, a halogen atom, an optionally substituted aliphatic hydrocarbon residual group, a carboxyl group, a carboamido group, an alkoxycarbonyl group or an acyl group, provided that when $n_1$ is not smaller than 2 and $A_1$ and $A_2$ are present in plural, each of $A_1$ and each of $A_2$ may be the same or different from each other; an optionally substituted ring optionally formed using multiple substituents selected from $A_1$ or each of $A_1$ when $A_1$ is present in plural, and $A_2$ or each of $A_2$ when $A_2$ is present in plural, along with $X_1$; $Y_1$ represents a sulfur atom, a selenium atom, a tellurium atom and $CR_3R_4$ or $NR_5$, wherein $R_3$ and $R_4$ represent a hydrogen atom, a halogen atom, an amide group, a hydroxyl group, a cyano group, a nitro group, an alkoxyl group, an acyl group, a substituted or unsubstituted amino group, an optionally substituted aliphatic hydrocarbon residual group or an optionally substituted aromatic residual group; $R_5$ represents a hydrogen atom, an optionally substituted aromatic residual group, an optionally substituted aliphatic hydrocarbon residual group or an acyl group; when $m_1$ is not smaller than 2 and $Y_1$ is present in plural, each of $Y_1$ optionally is the same or different from each other; a benzene ring $a_1$ optionally has one or plural substituents, including a halogen atom, an amide group, a hydroxyl group, a cyano group, a nitro group, an alkoxyl group, an acyl group, a substituted or unsubstituted amino group, an optionally substituted aliphatic hydrocarbon residual group or an optionally substituted aromatic residual group; a benzene ring $a_1$ optionally also forms an optionally substituted ring by bonding of plural substituents themselves; and a ring $b_1$ optionally has one or plural substituents including a halogen atom, an alkoxyl group, an acyl group, an optionally substituted aliphatic hydrocarbon residual group or an optionally substituted aromatic residual group; and a ring $b_1$ optionally forms an optionally substituted ring by bonding of plural substituents themselves); provided that when m1 is 0, R1 represents the following formula (3') and R2 represents the following formula (3"):

(3')

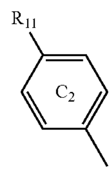

(3")

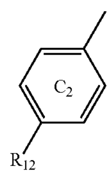

wherein a benzene ring $c_2$ optionally has one or plural substituents including a halogen atom, an amide group, a hydroxyl group, an alkoxyl group, a substituted or unsubstituted amino group, an optionally substituted aliphatic hydrocarbon residual group or an optionally substituted aromatic residual group; and a benzene ring $c_2$ optionally forms an optionally substituted ring by bonding of said plural substituents themselves; and $R_{11}$ and $R_{12}$ are each independently a substituted or unsubstituted aromatic residual group).

2. The photoelectric conversion device according to claim 1, wherein a methine dye represented by Formula (1) is a compound with $R_1$ and $R_2$ being an optionally substituted aromatic residual group in Formula (1).

3. The photoelectric conversion device according to claim 1, comprising an oxide semiconductor sensitized with one kind or more of a methine dye represented by Formula (1) and with a metal complex and/or an organic dye having a structure other than Formula (1).

4. The photoelectric conversion device according to claim 1, wherein fine oxide semiconductor particles contain titanium dioxide as an essential component.

5. The photoelectric conversion device according to claim 1, wherein fine oxide semiconductor particles contain zinc or tin as an essential component as a metal component.

6. The photoelectric conversion device according to claim 1, wherein onto fine oxide semiconductor particles a dye is carried in the presence of an inclusion compound.

7. A solar cell comprising a photoelectric conversion device according to claim 1.

* * * * *